United States Patent
Skripkin

(10) Patent No.: US 11,636,240 B2
(45) Date of Patent: Apr. 25, 2023

(54) RESERVOIR PERFORMANCE SYSTEM

(71) Applicant: Schlumberger Technology Corporation, Sugar Land, TX (US)

(72) Inventor: Sergey Skripkin, Abingdon (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 359 days.

(21) Appl. No.: 16/949,115

(22) Filed: Oct. 14, 2020

(65) Prior Publication Data

US 2022/0114302 A1 Apr. 14, 2022

(51) Int. Cl.
*G06F 30/20* (2020.01)
*G06N 20/20* (2019.01)

(52) U.S. Cl.
CPC ............ *G06F 30/20* (2020.01); *G06N 20/20* (2019.01)

(58) Field of Classification Search
CPC ................................. G06F 30/20; G06N 20/20
See application file for complete search history.

(56) References Cited

U.S. PATENT DOCUMENTS

| | | | |
|---|---|---|---|
| 2017/0017883 A1* | 1/2017 | Zhou | E21B 43/00 |
| 2018/0321421 A1* | 11/2018 | Halabe | G01V 99/005 |
| 2018/0335538 A1* | 11/2018 | Dupont | G06Q 10/04 |

OTHER PUBLICATIONS

Chou JS, Ho CC, Hoang HS. Determining quality of water in reservoir using machine learning. Ecological informatics. Mar. 1, 2018; 44:57-75. (Year: 2018).*
Xue H, Malpani R, Agrawal S, Bukovac T, Mahesh AL, Judd T. Fast-track completion decision through ensemble-based machine learning. InSPE Reservoir Characterisation and Simulation Conference and Exhibition Sep. 17, 2019. OnePetro. (Year: 2019).*
Extended European Search Report issued in European Patent Appl. No. 21202728.8 dated Mar. 25, 2022; 11 pages.
Anifowose et al., "Ensemble machine learning: An untapped modeling paradigm for petroleum reservoir characterization", Journal of Petroleum Science and Engineering, vo. 151, pp. 480-487, 2017.
Tsoumakas et al., "A Taxonomy and Short Review of Ensemble Selection", Jul. 21, 2008, 6 pages. Retrieved from <http://lpis.csd.auth.gr/publications/partalas08-suema.pdf on Apr. 20, 2020.

(Continued)

*Primary Examiner* — Chuen-Meei Gan

(57) ABSTRACT

A method can include generating an initial number of simulation models of an environment, where each of the initial number of simulation models includes a corresponding input set of values for parameters; generating an additional number of simulation models of the environment, where each of the additional number of simulation models includes a corresponding input set of values for the parameters; performing simulations of physical phenomena using each of the initial number of simulation models and each of the additional number of simulation models, where each of the simulations generates a corresponding indexed output set of values; determining a series of indexed metrics using the indexed output sets; and, based on the series of indexed metrics, deciding to output the initial number of simulation models and the additional number of simulation models as an ensemble statistically representative of the environment or to generate one or more additional simulation models.

17 Claims, 24 Drawing Sheets

(56) References Cited

OTHER PUBLICATIONS

Anifowose et al., "Improving the prediction of petroleum reservoir characterization with a stacked generalization ensemble model of support vector machines", Applied Soft Computing, vol. 26, pp. 483-496, 2015.

* cited by examiner

Method 610

GRID, EDIT Sections

PROPS, REGIONS, SOLUTION Sections

SCHEDULE Section

620
Calculate Pore Volumes, Transmissibilities, Depths and NNCs.

↓

640
Initialize, calculate initial saturations, pressures and fluids in place

↓

660
Define wells and surface facilities. Advance through time by material balance for ind. cells with wells as sinks or sources

RESERVOIR PERFORMANCE SYSTEM

BACKGROUND

A reservoir can be a subsurface formation that can be characterized at least in part by its porosity and fluid permeability. As an example, a reservoir may be part of a basin such as a sedimentary basin. A basin can be a depression (e.g., caused by plate tectonic activity, subsidence, etc.) in which sediments accumulate. As an example, where hydrocarbon source rocks occur in combination with appropriate depth and duration of burial, a petroleum system may develop within a basin, which may form a reservoir that includes hydrocarbon fluids (e.g., oil, gas, etc.).

SUMMARY

A method can include generating an initial number of simulation models of a subterranean environment, where each of the initial number of simulation models includes a corresponding input set of values for parameters; generating an additional number of simulation models of the subterranean environment, where each of the additional number of simulation models includes a corresponding input set of values for the parameters; performing simulations of physical phenomena using each of the initial number of simulation models and each of the additional number of simulation models, where each of the simulations generates a corresponding indexed output set of values for the physical phenomena; determining a series of indexed metrics using the indexed output sets; and, based on the series of indexed metrics, deciding to output the initial number of simulation models and the additional number of simulation models as an ensemble statistically representative of the subterranean environment or to generate one or more additional simulation models. A system can include a processor; memory accessible to the processor; processor-executable instructions stored in the memory executable to instruct the system to: generate an initial number of simulation models of a subterranean environment, where each of the initial number of simulation models includes a corresponding input set of values for parameters; generate an additional number of simulation models of the subterranean environment, where each of the additional number of simulation models includes a corresponding input set of values for the parameters; perform simulations of physical phenomena using each of the initial number of simulation models and each of the additional number of simulation models, where each of the simulations generates a corresponding indexed output set of values for the physical phenomena; determine a series of indexed metrics using the indexed output sets; and, based on the series of indexed metrics, decide to output the initial number of simulation models and the additional number of simulation models as an ensemble statistically representative of the subterranean environment or to generate one or more additional simulation models. One or more computer-readable storage media can include processor-executable instructions to instruct a computing system to: generate an initial number of simulation models of a subterranean environment, where each of the initial number of simulation models includes a corresponding input set of values for parameters; generate an additional number of simulation models of the subterranean environment, where each of the additional number of simulation models includes a corresponding input set of values for the parameters; perform simulations of physical phenomena using each of the initial number of simulation models and each of the additional number of simulation models, where each of the simulations generates a corresponding indexed output set of values for the physical phenomena; determine a series of indexed metrics using the indexed output sets; and, based on the series of indexed metrics, decide to output the initial number of simulation models and the additional number of simulation models as an ensemble statistically representative of the subterranean environment or to generate one or more additional simulation models. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

This description is not to be taken in a limiting sense, but rather is made merely for the purpose of describing the general principles of the implementations. The scope of the described implementations should be ascertained with reference to the issued claims.

Figure 1:
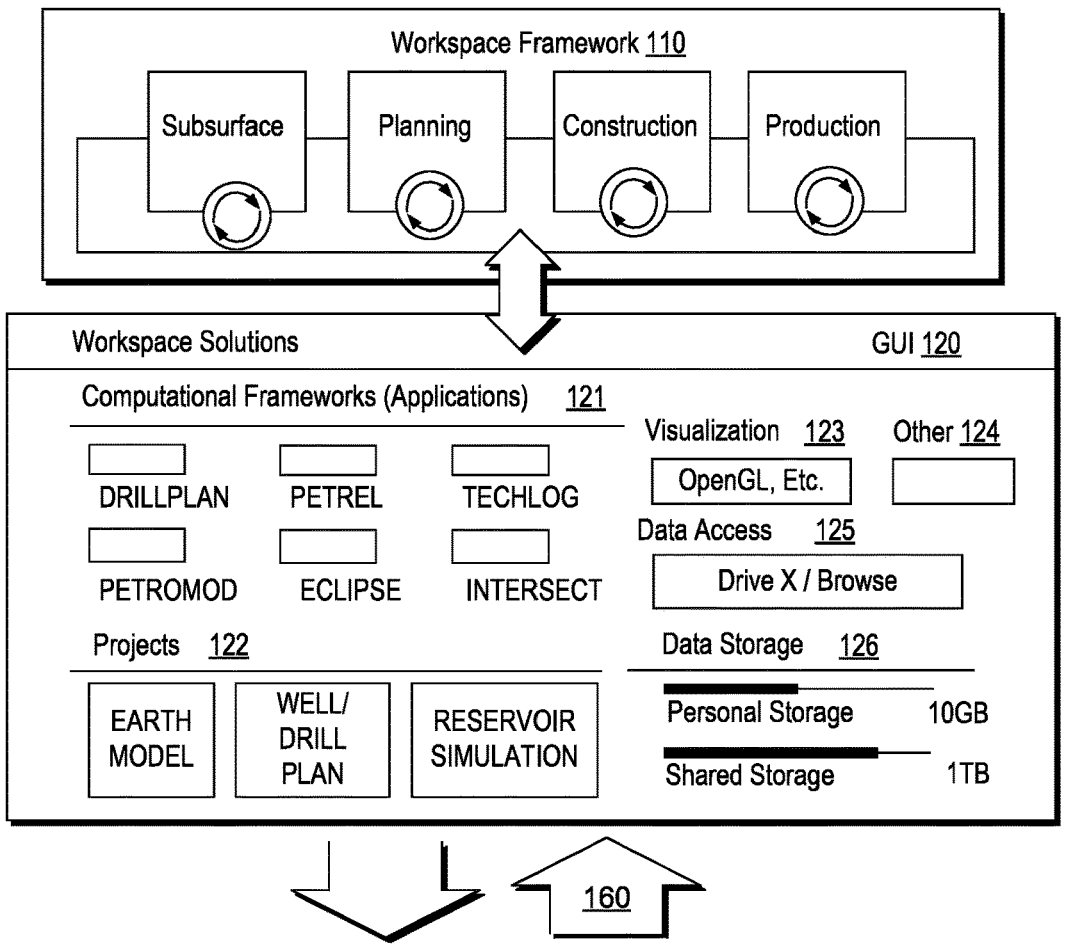
FIG. 1 illustrates an example system that includes various framework components associated with simulating a geological environment.
Figure 1:
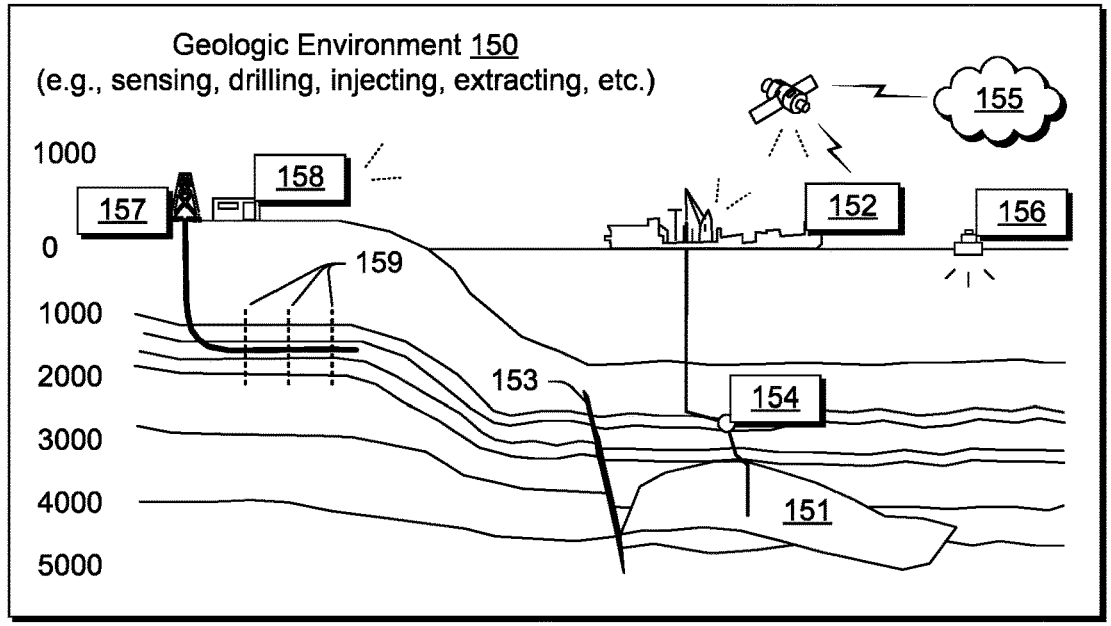

FIG. 1 shows an example of a system 100 that includes a workspace framework 110 that can provide for instantiation of, rendering of, interactions with, etc., a graphical user interface (GUI) 120. In the example of FIG. 1, the GUI 120 can include graphical controls for computational frameworks (e.g., applications) 121, projects 122, visualization 123, one or more other features 124, data access 125, and data storage 126.

In the example of FIG. 1, the workspace framework 110 may be tailored to a particular geologic environment such as an example geologic environment 150. For example, the geologic environment 150 may include layers (e.g., stratification) that include a reservoir 151 and that may be intersected by a fault 153. As an example, the geologic environment 150 may be outfitted with a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a wellsite and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

In the example of FIG. 1, the GUI 120 shows some examples of computational frameworks, including the DRILLPLAN, PETREL, TECHLOG, PETROMOD, ECLIPSE, and INTERSECT frameworks (Schlumberger).

The DRILLPLAN framework provides for digital well construction planning and includes features for automation of repetitive tasks and validation workflows, enabling improved quality drilling programs (e.g., digital drilling plans, etc.) to be produced quickly with assured coherency.

The PETREL framework can be part of the DELFI cognitive E&P environment for utilization in geosciences and geoengineering, for example, to analyze subsurface data from exploration to production of fluid from a reservoir.

The TECHLOG framework can handle and process field and laboratory data for a variety of geologic environments (e.g., deepwater exploration, shale, etc.). The TECHLOG framework can structure wellbore data for analyses, planning, etc.

The PETROMOD framework provides petroleum systems modeling capabilities that can combine one or more of seismic, well, and geological information to model the evolution of a sedimentary basin. The PETROMOD framework can predict if, and how, a reservoir has been charged with hydrocarbons, including the source and timing of hydrocarbon generation, migration routes, quantities, and hydrocarbon type in the subsurface or at surface conditions.

The ECLIPSE framework provides a reservoir simulator (e.g., as a computational framework) with numerical solutions for fast and accurate prediction of dynamic behavior for various types of reservoirs and development schemes.

The INTERSECT framework provides a high-resolution reservoir simulator for simulation of detailed geological features and quantification of uncertainties, for example, by creating accurate production scenarios and, with the integration of precise models of the surface facilities and field operations, the INTERSECT framework can produce reliable results, which may be continuously updated by real-time data exchanges (e.g., from one or more types of data acquisition equipment in the field that can acquire data during one or more types of field operations, etc.). The INTERSECT framework can provide completion configurations for complex wells where such configurations can be built in the field, can provide detailed chemical-enhanced-oil-recovery (EOR) formulations where such formulations can be implemented in the field, can analyze application of steam injection and other thermal EOR techniques for implementation in the field, advanced production controls in terms of reservoir coupling and flexible field management, and flexibility to script customized solutions for improved modeling and field management control. The INTERSECT framework, as with the other example frameworks, may be utilized as part of the DELFI cognitive E&P environment, for example, for rapid simulation of multiple concurrent cases. For example, a workflow may utilize one or more of the DELFI on demand reservoir simulation features.

The aforementioned DELFI environment provides various features for workflows as to subsurface analysis, planning, construction and production, for example, as illustrated in the workspace framework 110. As shown in FIG. 1, outputs from the workspace framework 110 can be utilized for directing, controlling, etc., one or more processes in the geologic environment 150 and, feedback 160, can be received via one or more interfaces in one or more forms (e.g., acquired data as to operational conditions, equipment conditions, environment conditions, etc.).

As an example, a workflow may progress to a geology and geophysics ("G&G") service provider, which may generate a well trajectory, which may involve execution of one or more G&G software packages. Examples of such software packages include the PETREL framework. As an example, a system or systems may utilize a framework such as the DELFI framework. Such a framework may operatively couple various other frameworks to provide for a multi-framework workspace. As an example, the GUI 120 of FIG. 1 may be a GUI of the DELFI framework.

In the example of FIG. 1, the visualization features 123 may be implemented via the workspace framework 110, for example, to perform tasks as associated with one or more of subsurface regions, planning operations, constructing wells and/or surface fluid networks, and producing from a reservoir.

As an example, a visualization process can implement one or more of various features that can be suitable for one or more web applications. For example, a template may involve use of the JAVASCRIPT object notation format (JSON) and/or one or more other languages/formats. As an example, a framework may include one or more converters. For example, consider a JSON to PYTHON converter and/or a PYTHON to JSON converter.

As an example, visualization features can provide for visualization of various earth models, properties, etc., in one or more dimensions. As an example, visualization features can provide for rendering of information in multiple dimensions, which may optionally include multiple resolution rendering. In such an example, information being rendered may be associated with one or more frameworks and/or one or more data stores. As an example, visualization features may include one or more control features for control of equipment, which can include, for example, field equipment that can perform one or more field operations. As an example, a workflow may utilize one or more frameworks to generate information that can be utilized to control one or more types of field equipment (e.g., drilling equipment, wireline equipment, fracturing equipment, etc.).

As to a reservoir model that may be suitable for utilization by a simulator, consider acquisition of seismic data as acquired via reflection seismology, which finds use in geophysics, for example, to estimate properties of subsurface formations. As an example, reflection seismology may provide seismic data representing waves of elastic energy (e.g., as transmitted by P-waves and S-waves, in a frequency range of approximately 1 Hz to approximately 100 Hz). Seismic data may be processed and interpreted, for example, to understand better composition, fluid content, extent and geometry of subsurface rocks. Such interpretation results can be utilized to plan, simulate, perform, etc., one or more operations for production of fluid from a reservoir (e.g., reservoir rock, etc.).

Field acquisition equipment may be utilized to acquire seismic data, which may be in the form of traces where a trace can include values organized with respect to time and/or depth (e.g., consider 1D, 2D, 3D or 4D seismic data). For example, consider acquisition equipment that acquires digital samples at a rate of one sample per approximately 4 ms. Given a speed of sound in a medium or media, a sample rate may be converted to an approximate distance. For example, the speed of sound in rock may be on the order of around 5 km per second. Thus, a sample time spacing of approximately 4 ms would correspond to a sample "depth" spacing of about 10 meters (e.g., assuming a path length from source to boundary and boundary to sensor). As an example, a trace may be about 4 seconds in duration; thus, for a sampling rate of one sample at about 4 ms intervals, such a trace would include about 1000 samples where later acquired samples correspond to deeper reflection boundaries. If the 4 second trace duration of the foregoing example is divided by two (e.g., to account for reflection), for a vertically aligned source and sensor, a deepest boundary depth may be estimated to be about 10 km (e.g., assuming a speed of sound of about 5 km per second).

As an example, a model may be a simulated version of a geologic environment. As an example, a simulator may include features for simulating physical phenomena in a geologic environment based at least in part on a model or models. A simulator, such as a reservoir simulator, can simulate fluid flow in a geologic environment based at least in part on a model that can be generated via a framework that receives seismic data. A simulator can be a computerized system (e.g., a computing system) that can execute instructions using one or more processors to solve a system of equations that describe physical phenomena subject to various constraints. In such an example, the system of equations may be spatially defined (e.g., numerically discretized) according to a spatial model that that includes layers of rock, geobodies, etc., that have corresponding positions that can be based on interpretation of seismic and/or other data. A spatial model may be a cell-based model where cells are defined by a grid (e.g., a mesh). A cell in a cell-based model can represent a physical area or volume in a geologic environment where the cell can be assigned physical properties (e.g., permeability, fluid properties, etc.) that may be germane to one or more physical phenomena (e.g., fluid volume, fluid flow, pressure, etc.). A reservoir simulation model can be a spatial model that may be cell-based.

A simulator can be utilized to simulate the exploitation of a real reservoir, for example, to examine different productions scenarios to find an optimal one before production or further production occurs. A reservoir simulator does not provide an exact replica of flow in and production from a reservoir at least in part because the description of the reservoir and the boundary conditions for the equations for flow in a porous rock are generally known with an amount of uncertainty. Certain types of physical phenomena occur at a spatial scale that can be relatively small compared to size of a field. A balance can be struck between model scale and computational resources that results in model cell sizes being of the order of meters; rather than a lesser size (e.g., a level of detail of pores). A modeling and simulation workflow for multiphase flow in porous media (e.g., reservoir rock, etc.) can include generalizing real micro-scale data from macro scale observations (e.g., seismic data and well data) and upscaling to a manageable scale and problem size. Uncertainties can exist in input data and solution procedure such that simulation results too are to some extent uncertain. A process known as history matching can involve comparing simulation results to actual field data acquired during production of fluid from a field. Information gleaned from history matching, can provide for adjustments to a model, data, etc., which can help to increase accuracy of simulation.

As an example, a simulator may utilize various types of constructs, which may be referred to as entities. Entities may include earth entities or geological objects such as wells, surfaces, reservoirs, etc. Entities can include virtual representations of actual physical entities that may be reconstructed for purposes of simulation. Entities may include entities based on data acquired via sensing, observation, etc. (e.g., consider entities based at least in part on seismic data and/or other information). As an example, an entity may be characterized by one or more properties (e.g., a geometrical pillar grid entity of an earth model may be characterized by a porosity property, etc.). Such properties may represent one or more measurements (e.g., acquired data), calculations, etc.

As an example, a simulator may utilize an object-based software framework, which may include entities based on pre-defined classes to facilitate modeling and simulation. As an example, an object class can encapsulate reusable code and associated data structures. Object classes can be used to instantiate object instances for use by a program, script, etc. For example, borehole classes may define objects for representing boreholes based on well data. A model of a basin, a reservoir, etc. may include one or more boreholes where a borehole may be, for example, for measurements, injection, production, etc. As an example, a borehole may be a wellbore of a well, which may be a completed well (e.g., for production of a resource from a reservoir, for injection of material, etc.).

While several simulators are illustrated in the example of FIG. 1, one or more other simulators may be utilized, additionally or alternatively. For example, consider the VISAGE geomechanics simulator or the PIPESIM network simulator. The VISAGE simulator includes finite element numerical solvers that may provide simulation results such as, for example, results as to compaction and subsidence of a geologic environment, well and completion integrity in a geologic environment, cap-rock and fault-seal integrity in a geologic environment, fracture behavior in a geologic environment, thermal recovery in a geologic environment, $CO_2$ disposal, etc. The PIPESIM simulator includes solvers that may provide simulation results such as, for example, multiphase flow results (e.g., from a reservoir to a wellhead and beyond, etc.), flowline and surface facility performance, etc. The PIPESIM simulator may be integrated, for example, with the AVOCET production operations framework. As an example, a reservoir or reservoirs may be simulated with respect to one or more enhanced recovery techniques (e.g., consider a thermal process such as steam-assisted gravity drainage (SAGD), etc.). As an example, the PIPESIM simulator may be an optimizer that can optimize one or more operational scenarios at least in part via simulation of physical phenomena. The MANGROVE simulator provides for optimization of stimulation design (e.g., stimulation treatment operations such as hydraulic fracturing) in a reservoir-centric environment. The MANGROVE framework can combine scientific and experimental work to predict geomechanical propagation of hydraulic fractures, reactivation of natural fractures, etc., along with production forecasts within 3D reservoir models (e.g., production from a drainage area of a reservoir where fluid moves via one or more types of fractures to a well and/or from a well). The MANGROVE framework can provide results pertaining to heterogeneous interactions between hydraulic and natural fracture networks, which may assist with optimization of the number and location of fracture treatment stages (e.g., stimulation treatment(s)), for example, to increased perforation efficiency and recovery.

The PETREL framework provides components that allow for optimization of exploration and development operations. The PETREL framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes (e.g., with respect to one or more geologic environments, etc.). Such a framework may be considered an application (e.g., executable using one or more devices) and may be considered a data-driven application (e.g., where data is input for purposes of modeling, simulating, etc.).

As mentioned, a framework may be implemented within or in a manner operatively coupled to the DELFI cognitive exploration and production (E&P) environment, which is a secure, cognitive, cloud-based collaborative environment that integrates data and workflows with digital technologies, such as artificial intelligence and machine learning. As an example, such an environment can provide for operations that involve one or more frameworks. The DELFI environment may be referred to as the DELFI framework, which may be a framework of frameworks. As an example, the DELFI framework can include various other frameworks, which can include, for example, one or more types of models (e.g., simulation models, etc.).

Figure 2:
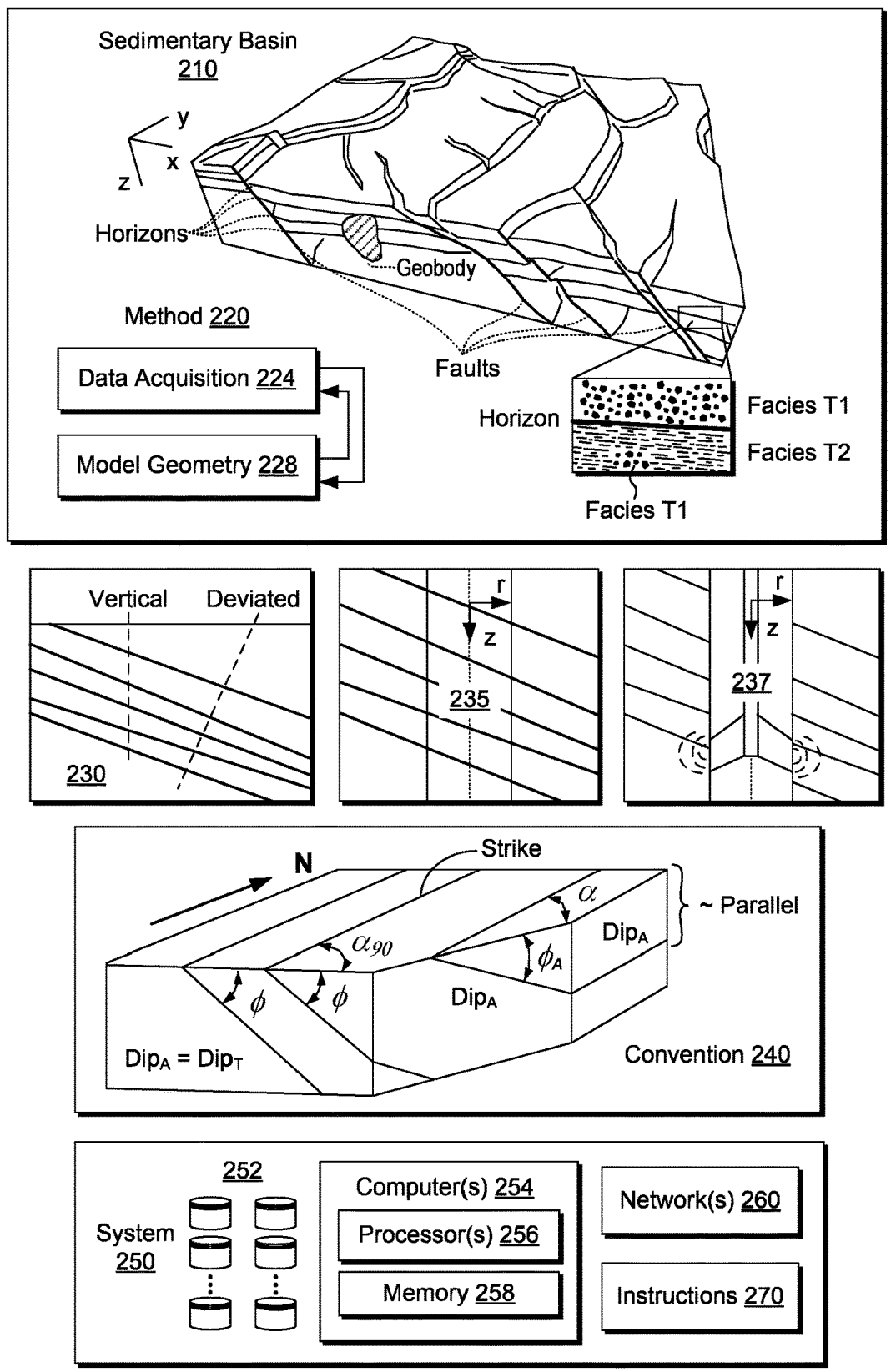
FIG. 2 illustrates examples of a basin, a convention and a system.

FIG. 2 shows an example of a sedimentary basin 210 (e.g., a geologic environment), an example of a method 220 for model building (e.g., for a simulator, etc.), an example of a formation 230, an example of a borehole 235 in a formation, an example of a convention 240 and an example of a system 250.

As an example, data acquisition, reservoir simulation, petroleum systems modeling, etc. may be applied to characterize various types of subsurface environments, including environments such as those of FIG. 1.

In FIG. 2, the sedimentary basin 210, which is a geologic environment, includes horizons, faults, one or more geobodies and facies formed over some period of geologic time. These features are distributed in two or three dimensions in space, for example, with respect to a Cartesian coordinate system (e.g., x, y and z) or other coordinate system (e.g., cylindrical, spherical, etc.). As shown, the model building method 220 includes a data acquisition block 224 and a model geometry block 228. Some data may be involved in building an initial model and, thereafter, the model may optionally be updated in response to model output, changes in time, physical phenomena, additional data, etc. As an example, data for modeling may include one or more of the following: depth or thickness maps and fault geometries and timing from seismic, remote-sensing, electromagnetic, gravity, outcrop and well log data. Furthermore, data may include depth and thickness maps stemming from facies variations (e.g., due to seismic unconformities) assumed to follow geological events ("iso" times) and data may include lateral facies variations (e.g., due to lateral variation in sedimentation characteristics).

To proceed to modeling of geological processes, data may be provided, for example, data such as geochemical data (e.g., temperature, kerogen type, organic richness, etc.), timing data (e.g., from paleontology, radiometric dating, magnetic reversals, rock and fluid properties, etc.) and boundary condition data (e.g., heat-flow history, surface temperature, paleowater depth, etc.).

In basin and petroleum systems modeling, quantities such as temperature, pressure and porosity distributions within the sediments may be modeled, for example, by solving partial differential equations (PDEs) using one or more numerical techniques. Modeling may also model geometry with respect to time, for example, to account for changes stemming from geological events (e.g., deposition of material, erosion of material, shifting of material, etc.).

As shown in FIG. 2, the formation 230 includes a horizontal surface and various subsurface layers. As an example, a borehole may be vertical. As another example, a borehole may be deviated. In the example of FIG. 2, the borehole 235 may be considered a vertical borehole, for example, where the z-axis extends downwardly normal to the horizontal surface of the formation 230. As an example, a tool 237 may be positioned in a borehole, for example, to acquire information. As mentioned, a borehole tool can include one or more sensors that can acquire borehole images via one or more imaging techniques. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

As an example, data can include geochemical data. For example, consider data acquired using X-ray fluorescence (XRF) technology, Fourier transform infrared spectroscopy (FTIR) technology and/or wireline geochemical technology.

As an example, one or more probes may be deployed in a bore via a wireline or wirelines. As an example, a probe may emit energy and receive energy where such energy may be analyzed to help determine mineral composition of rock surrounding a bore. As an example, nuclear magnetic resonance may be implemented (e.g., via a wireline, downhole NMR probe, etc.), for example, to acquire data as to nuclear magnetic properties of elements in a formation (e.g., hydrogen, carbon, phosphorous, etc.).

As an example, lithology scanning technology may be employed to acquire and analyze data. For example, consider the LITHO SCANNER technology marketed by Schlumberger. As an example, a LITHO SCANNER tool may be a gamma ray spectroscopy tool.

As an example, a tool may be positioned to acquire information in a portion of a borehole. Analysis of such information may reveal vugs, dissolution planes (e.g., dissolution along bedding planes), stress-related features, dip events, etc. As an example, a tool may acquire information that may help to characterize a fractured reservoir, optionally where fractures may be natural and/or artificial (e.g., hydraulic fractures). Such information may assist with completions, stimulation treatment, etc. As an example, information acquired by a tool may be analyzed using a framework such as the aforementioned TECHLOG framework.

As an example, a workflow may utilize one or more types of data for one or more processes (e.g., stratigraphic modeling, basin modeling, completion designs, drilling, production, injection, etc.). As an example, one or more tools may provide data that can be used in a workflow or workflows that may implement one or more frameworks (e.g., PETREL, TECHLOG, PETROMOD, ECLIPSE, etc.).

As to the convention 240 for dip, as shown in FIG. 2, the three-dimensional orientation of a plane can be defined by its dip and strike. Dip is the angle of slope of a plane from a horizontal plane (e.g., an imaginary plane) measured in a vertical plane in a specific direction. Dip may be defined by magnitude (e.g., also known as angle or amount) and azimuth (e.g., also known as direction). As shown in the convention 240 of FIG. 2, various angles θ indicate angle of slope downwards, for example, from an imaginary horizontal plane (e.g., flat upper surface); whereas, dip refers to the direction towards which a dipping plane slopes (e.g., which may be given with respect to degrees, compass directions, etc.). Another feature shown in the convention of FIG. 2 is strike, which is the orientation of the line created by the intersection of a dipping plane and a horizontal plane (e.g., consider the flat upper surface as being an imaginary horizontal plane).

Some additional terms related to dip and strike may apply to an analysis, for example, depending on circumstances, orientation of collected data, etc. One term is "true dip" (see, e.g., $Dip_T$ in the convention 240 of FIG. 2). True dip is the dip of a plane measured directly perpendicular to strike (see, e.g., line directed northwardly and labeled "strike" and angle $\alpha_{90}$) and also the maximum possible value of dip magnitude. Another term is "apparent dip" (see, e.g., $Dip_A$ in the convention 240 of FIG. 2). Apparent dip may be the dip of a plane as measured in any other direction except in the direction of true dip (see, e.g., $\phi_A$ as $Dip_A$ for angle α); however, it is possible that the apparent dip is equal to the true dip (see, e.g., φ as $Dip_A = Dip_T$ for angle $\alpha_{90}$ with respect to the strike). In other words, where the term apparent dip is used (e.g., in a method, analysis, algorithm, etc.), for a particular dipping plane, a value for "apparent dip" may be equivalent to the true dip of that particular dipping plane.

As shown in the convention 240 of FIG. 2, the dip of a plane as seen in a cross-section perpendicular to the strike is true dip (see, e.g., the surface with φ as $Dip_A = Dip_T$ for angle $\alpha_{90}$ with respect to the strike). As indicated, dip observed in a cross-section in any other direction is apparent dip (see, e.g., surfaces labeled $Dip_A$). Further, as shown in the convention 240 of FIG. 2, apparent dip may be approximately 0 degrees (e.g., parallel to a horizontal surface where an edge of a cutting plane runs along a strike direction).

In terms of observing dip in wellbores, true dip is observed in wells drilled vertically. In wells drilled in any other orientation (or deviation), the dips observed are apparent dips (e.g., which are referred to by some as relative dips). In order to determine true dip values for planes observed in such boreholes, as an example, a vector computation (e.g., based on the borehole deviation) may be applied to one or more apparent dip values.

As mentioned, another term that finds use in sedimentological interpretations from borehole images is "relative dip" (e.g., $Dip_R$). A value of true dip measured from borehole images in rocks deposited in very calm environments may be subtracted (e.g., using vector-subtraction) from dips in a sand body. In such an example, the resulting dips are called relative dips and may find use in interpreting sand body orientation.

A convention such as the convention 240 may be used with respect to an analysis, an interpretation, an attribute, etc. As an example, various types of features may be described, in part, by dip (e.g., sedimentary bedding, faults and fractures, cuestas, igneous dikes and sills, metamorphic foliation, etc.). As an example, dip may change spatially as a layer approaches a geobody. For example, consider a salt body that may rise due to various forces (e.g., buoyancy, etc.). In such an example, dip may trend upward as a salt body moves upward.

Seismic interpretation may aim to identify and/or classify one or more subsurface boundaries based at least in part on one or more dip parameters (e.g., angle or magnitude, azimuth, etc.). As an example, various types of features (e.g., sedimentary bedding, faults and fractures, cuestas, igneous dikes and sills, metamorphic foliation, etc.) may be described at least in part by angle, at least in part by azimuth, etc.

As an example, equations may be provided for petroleum expulsion and migration, which may be modeled and simulated, for example, with respect to a period of time. Petroleum migration from a source material (e.g., primary migration or expulsion) may include use of a saturation model where migration-saturation values control expulsion. Determinations as to secondary migration of petroleum (e.g., oil or gas), may include using hydrodynamic potential of fluid and accounting for driving forces that promote fluid flow. Such forces can include buoyancy gradient, pore pressure gradient, and capillary pressure gradient.

As shown in FIG. 2, the system 250 includes one or more information storage devices 252, one or more computers 254, one or more networks 260 and instructions 270. As to the one or more computers 254, each computer may include one or more processors (e.g., or processing cores) 256 and memory 258 for storing instructions, for example, consider the instructions 270 as including instructions executable by at least one of the one or more processors. As an example, a computer may include one or more network interfaces (e.g., wired or wireless), one or more graphics cards (e.g., one or more GPUs, etc.), a display interface (e.g., wired or wireless), etc. As an example, imagery such as surface imagery (e.g., satellite, geological, geophysical, etc.) may be stored, processed, communicated, etc. As an example, data may include SAR data, GPS data, etc. and may be stored, for example, in one or more of the storage devices 252. As an example, the system 250 may be local, remote or in part local and in part remote. As to remote resources, consider one or more cloud-based resources (e.g., as part of a cloud platform, etc.).

As an example, the instructions 270 may include instructions (e.g., stored in memory) executable by one or more processors to instruct the system 250 to perform various actions. As an example, the system 250 may be configured such that the instructions 270 provide for establishing one or more aspects of the workflow framework 110 of FIG. 1. As an example, one or more methods, techniques, etc. may be performed at least in part via instructions, which may be, for example, instructions of the instructions 270 of FIG. 2.

As an example, a framework can include various components. For example, a framework can include one or more components for prediction of reservoir performance, one or more components for optimization of an operation or operations, one or more components for control of production engineering operations, etc. As an example, a framework can include components for prediction of reservoir performance, optimization and control of production engineering operations performed at one or more reservoir wells. Such a framework may, for example, allow for implementation of various methods. For example, consider an approach that allows for a combination of physics-based and data-driven methods for modeling and forecasting a reservoir production.

Figure 3:
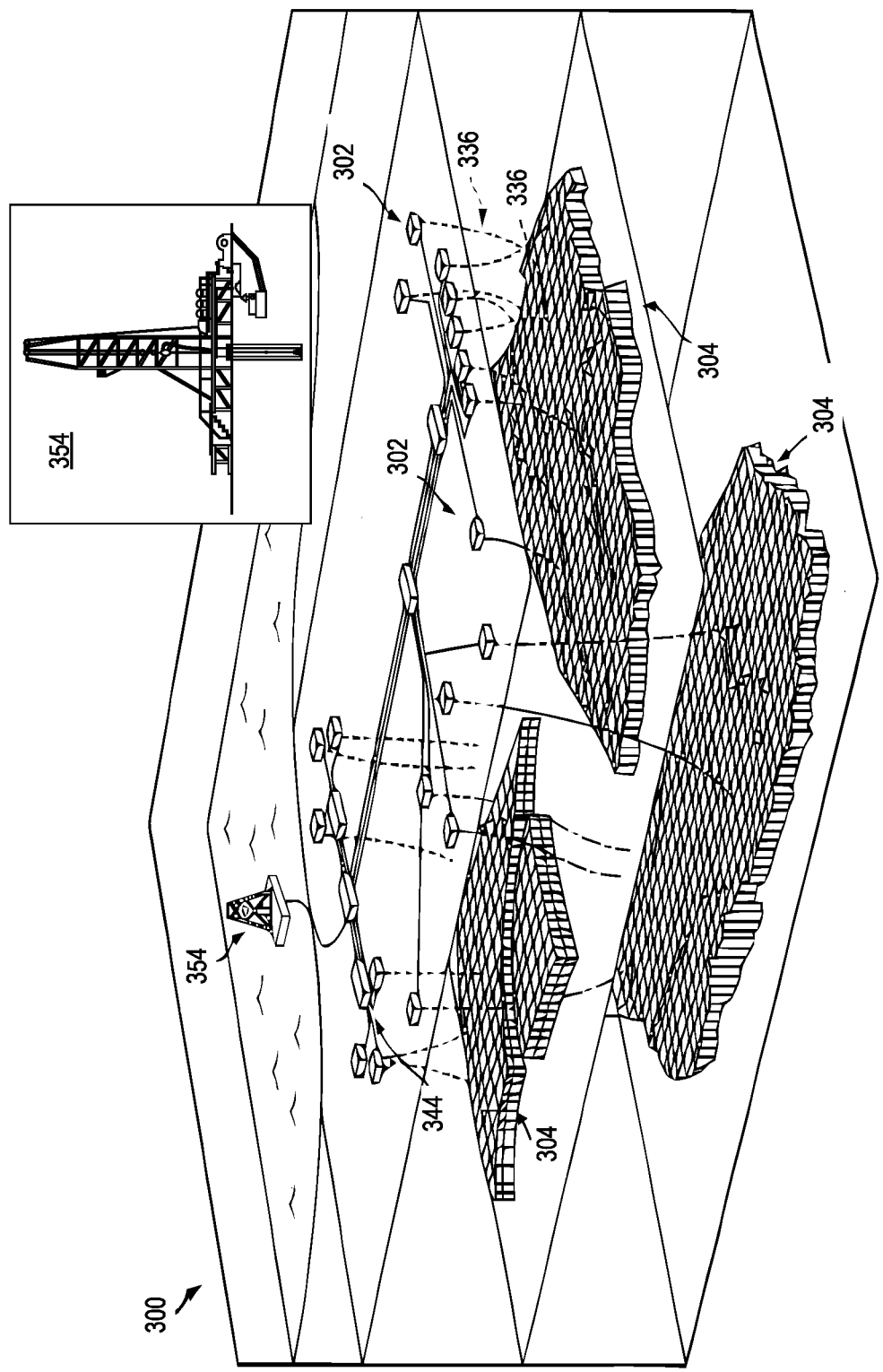
FIG. 3 illustrates an example of a system.

FIG. 3 shows an example of a geologic environment 300 as including various types of equipment and features. As shown, the geologic environment 300 includes a plurality of wellsites 302, which may be operatively connected to a processing facility. In the example of FIG. 3, individual wellsites 302 can include equipment that can form individual wellbores 336. Such wellbores can extend through subterranean formations including one or more reservoirs 304. Such reservoirs 304 can include fluids, such as hydrocarbons. As an example, wellsites can draw fluid from one or more reservoirs and pass them to one or more processing facilities via one or more surface networks 344. As an example, a surface network can include tubing and control mechanisms for controlling flow of fluids from a wellsite to a processing facility. In the example of FIG. 3, a rig 354 is shown, which may be an offshore rig or an onshore rig. As an example, a rig can be utilized to drill a borehole that can be completed to be a wellbore where the wellbore can be in fluid communication with a reservoir such that fluid may be produced from the reservoir.

Figure 4:
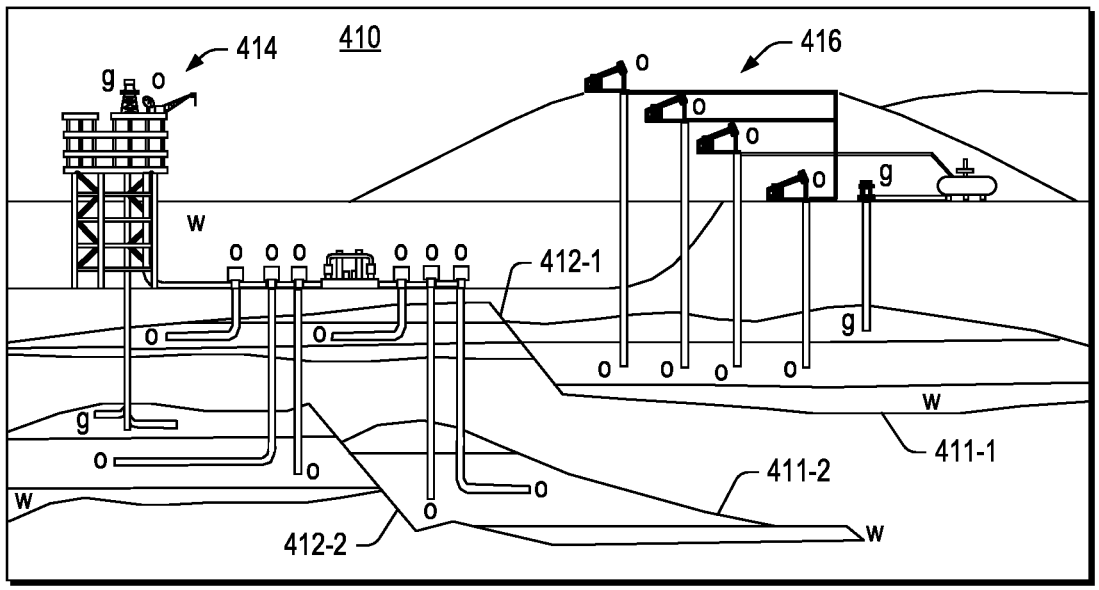
FIG. 4 illustrates examples of systems.
Figure 4:
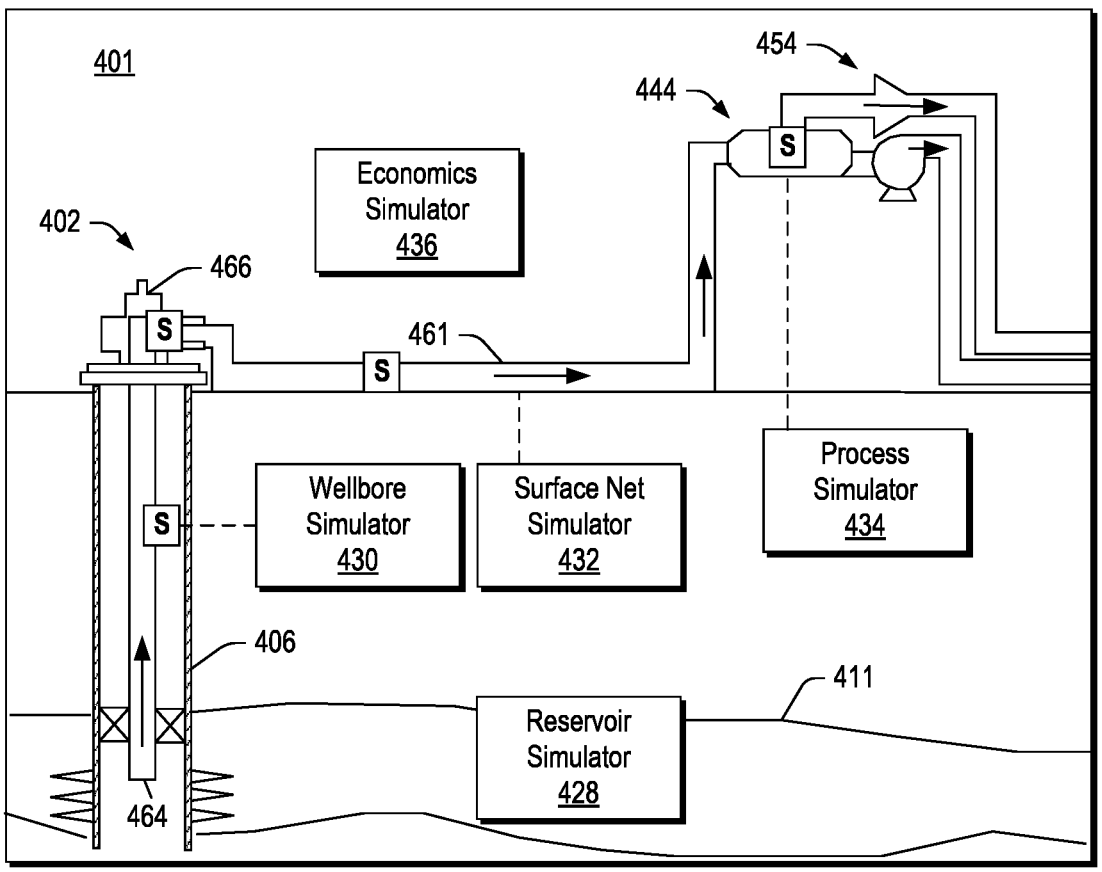

FIG. 4 shows an example of portion of a geologic environment 401 and an example of a larger portion of a geologic environment 410. As shown, a geologic environment can include one or more reservoirs 411-1 and 411-2, which may be faulted by faults 412-1 and 412-2 and which may include oil (o), gas (g) and/or water (w). FIG. 4 also shows some examples of offshore equipment 414 for oil and gas operations related to the reservoirs 411-1 and 411-2 and onshore equipment 416 for oil and gas operations related to the reservoir 411-1. As an example, a system may be implemented for operations associated with one or more of such reservoirs.

As to the geologic environment 401, FIG. 4 shows a schematic view where the geologic environment 401 can include various types of equipment. As shown in FIG. 4, the environment 401 can include a wellsite 402 and a fluid network 444. In the example of FIG. 4, the well site 402 includes a wellbore 406 extending into earth as completed and prepared for production of fluid from a reservoir 411 (e.g., one of the reservoirs 411-1 or 411-2).

In the example of FIG. 4, wellbore production equipment 464 extends from a wellhead 466 of the wellsite 402 and to the reservoir 411 to draw fluid to the surface. As shown, the wellsite 402 is operatively connected to the fluid network 444 via a transport line 461. As indicated by various arrows, fluid can flow from the reservoir 411, through the wellbore 406 and onto the fluid network 444. Fluid can then flow from the fluid network 444, for example, to one or more fluid processing facilities.

In the example of FIG. 4, sensors (S) are located, for example, to monitor various parameters during operations. The sensors (S) may measure, for example, pressure, temperature, flowrate, composition, and other parameters of the reservoir, wellbore, gathering network, process facilities and/or other portions of an operation. As an example, the sensors (S) may be operatively connected to a surface unit (e.g., to instruct the sensors to acquire data, to collect data from the sensors, etc.).

In the example of FIG. 4, a surface unit can include computer facilities, such as a memory device, a controller, one or more processors, and display unit (e.g., for managing data, visualizing results of an analysis, etc.). As an example, data may be collected in the memory device and processed by the processor(s) (e.g., for analysis, etc.). As an example, data may be collected from the sensors (S) and/or by one or more other sources. For example, data may be supplemented by historical data collected from other operations, user inputs, etc. As an example, analyzed data may be used in a decision-making process.

As an example, a transceiver may be provided to allow communications between a surface unit and one or more pieces of equipment in the environment 401. For example, a controller may be used to actuate mechanisms in the environment 401 via the transceiver, optionally based on one or more decisions of a decision-making process. In such a manner, equipment in the environment 401 may be selectively adjusted based at least in part on collected data. Such adjustments may be made, for example, automatically based on computer protocol, manually by an operator or both. As an example, one or more well plans may be adjusted (e.g., to select optimum operating conditions, to avoid problems, etc.).

To facilitate data analyses, one or more simulators may be implemented (e.g., optionally via the surface unit or other unit, system, etc.). As an example, data fed into one or more simulators may be historical data, real time data or combinations thereof. As an example, simulation through one or more simulators may be repeated or adjusted based on the data received.

In the example of FIG. 4, simulators can include a reservoir simulator 428, a wellbore simulator 430, a surface network simulator 432, a process simulator 434 and an economics simulator 436. As an example, the reservoir simulator 428 may be configured to solve for hydrocarbon flow rate through a reservoir and into one or more wellbores. As an example, the wellbore simulator 430 and surface network simulator 432 may be configured to solve for hydrocarbon flow rate through a wellbore and a surface gathering network of pipelines. As to the process simulator 434, it may be configured to model a processing plant where fluid containing hydrocarbons is separated into its constituent components (e.g., methane, ethane, propane, etc.), for example, and prepared for further distribution (e.g., transport via road, rail, pipe, etc.) and optionally sale. As an example, the economics simulator 436 may be configured to model costs associated with at least part of an operation. For example, consider MERAK framework, which may provide for economic analyses.

As an example, a system can include and/or be operatively coupled to one or more of the simulators 428, 430, 432, 434 and 436 of FIG. 4. As an example, such simulators may be associated with frameworks and/or may be considered tools (see, e.g., the system 100 of FIG. 1, etc.).

Figure 5:
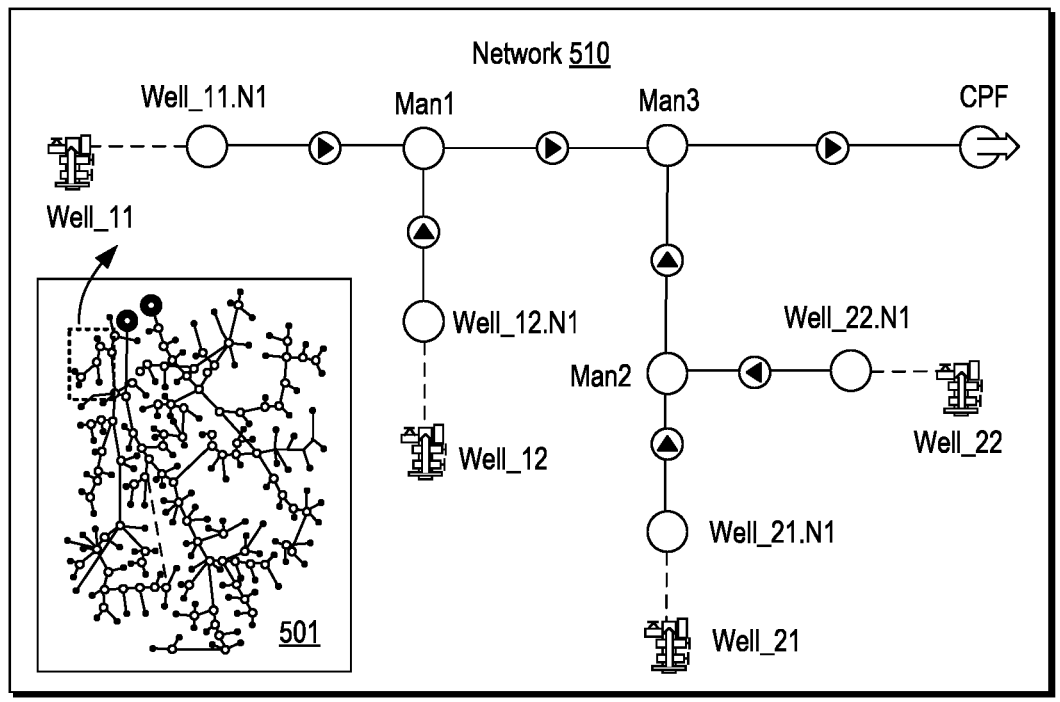
FIG. 5 illustrates an example of a network.

FIG. 5 shows an example of a network 501 and a detailed portion 510, which can also be considered to be a network (e.g., network 510). As shown, a network can include a plurality of wells, for example, the network 510 includes a well 11, a well 12, a well 21 and a well 22. As shown, a network can include manifolds such as the manifolds labeled Man1, Man2, and Man3 in the network 510. Various conduits can be utilized for transport of fluid in a network, for example, from one or more wells to one or more processing facilities, optionally via one or more chokes, manifolds, pumps, etc. FIG. 5 shows that a network can be quite complex and include tens of wells or more.

A choke can be a device incorporating an orifice that is used to control fluid flow rate or downstream system pressure. Chokes may be available in various configurations, for example, for one or more of fixed and adjustable modes of operation. As an example, an adjustable choke may enable fluid flow and pressure parameters to be changed to suit process or production requirements, optionally via a controller that is operatively coupled to an actuator that can adjust one or more pieces of the choke. As to a fixed choke, it may be more resistant to erosion under prolonged operation or production of abrasive fluids than various adjustable chokes. As an example, a well may be fitted with a choke that can be selected and/or controlled to suit desired operational parameters (e.g., flow rate, production, etc.).

As an example, one or more artificial lift processes may be utilized in one or more field operations. Artificial lift can include, for example, a surface pump (e.g., a sucker rod pump), a downhole pump (e.g., an electric submersible pump), gas lift, etc. As an example, a network such as the network 501 of FIG. 5 can include one or more pieces of artificial lift equipment.

As to gas lift, it is a process where, for example, gas may be injected from an annulus into tubing. An annulus, as applied to an oil well or other well for recovering a subsurface resource may refer to a space, lumen, or void between piping, tubing or casing and the piping, tubing, or casing immediately surrounding it, for example, at a greater radius.

As an example, injected gas may aerate well fluid in production tubing in a manner that "lightens" the well fluid such that the fluid can flow more readily to a surface location. As an example, one or more gas lift valves may be configured to control flow of gas during an intermittent flow or a continuous flow gas lift operation. As an example, a gas lift valve may operate based at least in part on a differential pressure control that can actuate a valve mechanism of the gas lift valve.

As an example, a system may operate to model and simulate reserves of oil and/or one or more other fluids (e.g., water, gas, etc.). For example, consider utilization of computational reservoir characterization tools that provide for stratigraphic and structural reservoir understanding, which can involve conversion of 2D maps to 3D models. Such tools may provide for reservoir characterizations during one or more phases of an exploration, development, and production lifecycle.

Various reservoir characterization tools may help to generate well correlation panels and map plots, geosteering horizontal and/or deviated wells using date acquired from one or more downhole tools (e.g., logging while drilling, measuring while drilling, etc.) in real time, performing stratigraphic interpretation, contouring, map editing, and evaluation of structural complexity (e.g., prior and/or during to geocellular modeling), analyzing data geostatistically for populating one or more geocellular models, for example, with facies and petrophysical properties, which can include using one or more deterministic and/or stochastic techniques.

As to reserves simulation, it can provide output as to an estimate or estimates of one or more types of fluid (e.g., reserves) in a reservoir or reservoirs. For example, a volume of hydrocarbon in a reservoir may be referred to as a volume in place. Volume of hydrocarbon that can be practically recovered can be referred to as reserves. As an example, various types of data may be utilized to estimate reserves using a model or an ensemble of models. For example, seismic data and well log data can be utilized in the PETREL framework to estimate reserves using a multi-dimensional model of a region that includes a reservoir.

As an example, a reserve estimation can be a computational simulation that considers pore space in rock, along with one or more other physical parameters (e.g., saturation such as water saturation, etc.). For a single 3D geological model as defined by an input set of parameters, reserves can be computed for each relevant cell in the 3D geological model, which can be a stratigraphic model that includes layers, which may be organized as zones where each zone can include properties such as net-to-gross (percent), porosity (percent), permeability (mD), saturation (percent), etc. A total reserves computation for an entire region (e.g., an entire reservoir) pertaining to hydrocarbon gas may be computed, for example, using an equation such as:

$$G = 43,560 A h \phi (1 - S_{wc}) * (B_{gi})^{-1}$$

where G is hydrocarbon gas in place at standard conditions (scf), A is area (acres), h is reservoir thickness (ft), $\phi$ is rock porosity (percent), $S_{wc}$ is connate water saturation (percent) and $B_{gi}$ is gas formation volume factor (rcf/scf).

In such an example, a reservoir model can be supplied with input and utilized to simulate reserves to provide a reserves estimate (or reserve estimate) as output. Such a simulation may be a static simulation in that one or more practically producible regions of a reservoir are simulated to provide output. As an example, such output may be utilized in one or more subsequent workflows, workflow actions, etc. For example, a model or an ensemble of models from an estimation workflow as to reserves and/or one or more other workflows may be utilized in a history matching workflow that aims to assess model output with respect to acquired data indicative of actual output. As an example, a fluid flow simulator may be utilized to simulate flow in a reservoir and/or one or more wells in fluid communication with a reservoir through use of a reservoir model or reservoir models. In such an example, output can be generated through simulation for given reservoir model input, which can include input pertaining to physical properties and/or model properties (e.g., model grid size, number of cells, model coverage, etc.).

As an example, a system may operate in one state that acts to model and simulate flow of water and oil in a reservoir and can operate in another state that acts to optimize processing of multiphase fluid that includes oil and water. As an example, a state can be an overarching state that includes the aforementioned two states where they can be linked to generate multiple outputs. Such outputs can include field development plan output as to production of oil, an optimal treatment scenario output as to injection and handling of water, an immediate action notice or advice output as to a water-related parameter and output as to adjustment of a reservoir model that is utilized to simulate fluid flow in the reservoir. Such a system can be operatively coupled to field equipment (e.g., sensors, controllers, etc.) and can be implemented at least in part via a cloud architecture such as the architecture.

Figure 6:
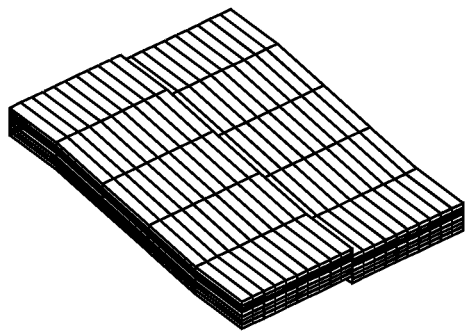
FIG. 6 illustrates an example of a method.
Figure 6:
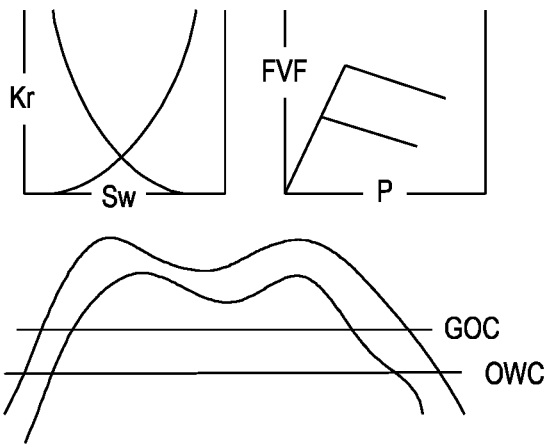
Figure 6:
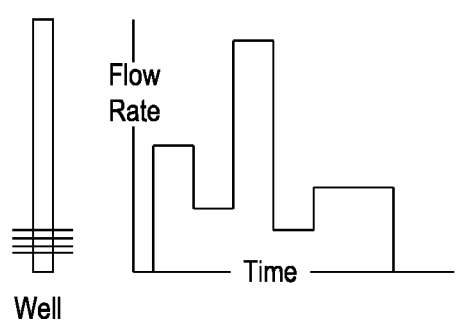

FIG. 6 shows an example of a method 610 that includes a calculation block 620 for calculating pore volumes, transmissibilities, depths and non-neighbor connections (NNCs), an initialization and calculation block 640 for initializing and calculating initial saturations, pressure and fluids in place (e.g., reserves, etc.), and a definition and time progression block 660 for defining one or more wells and surface facilities and advancing through time, for example, via material balances for individual cells (e.g., with the one or more wells as individual sinks and/or sources).

As to the initialization and calculation block 640, for an initial time (e.g., to), saturation distribution within a grid model of a geologic environment and pressure distribution within the grid model of the geologic environment may be set to represent an equilibrium state (e.g., a static state or "no-flow" state), for example, with respect to gravity. As an example, to approximate the equilibrium state, calculations can be performed. As an example, such calculations may be performed by one or more sets of instructions. For example, one or more of a seismic-to-simulation framework, a reservoir simulator, a specialized set of instructions, etc. may be implemented to perform one or more calculations that may aim to approximate or to facilitate approximation of an equilibrium state. As an example, a reservoir simulator may include a set of instructions for initialization using data to compute capillary and fluid gradients, and hence fluid saturation densities in individual cells of a grid model that represents a geologic environment.

Initialization aims to define fluid saturations in individual cells such that a "system" being modeled is in an equilibrium state (e.g., where no external forces other than gravity are applied, no fluid flow is to take place in a reservoir, a condition that may not be obeyed in practice). As an example, consider oil-water contact and assume no transition zone, for example, where water saturation is unity below an oil-water contact and at connate water saturation above the contact. In such an example, grid cells that include oil-water contact may pose some challenges. A cell (e.g., or grid cell) may represent a point or points in space for purposes of simulating a geologic environment. Where an individual cell represents a volume and where that individual cell includes, for example, a center point for definition of properties, within the volume of that individual cell, the properties may be constant (e.g., without variation within the volume). In such an example, that individual cell includes one value per property, for example, one value for water saturation. As an example, an initialization process can include selecting a value for individual properties of individual cells.

As an example, saturation distribution may be generated based on one or more types of information. For example, saturation distribution may be generated from seismic information and saturation versus depth measurements in one or more boreholes (e.g., test wells, wells, etc.). As an example, reproduction of such an initial saturation field via a simulation model may be inaccurate and such an initial saturation field may not represent an equilibrium state, for example, as a simulator model approximates real physical phenomena.

As an example, an initialization of water saturation may be performed using information as to oil-water contact. For example, for a cell that is below oil-water contact, a water saturation value for that cell may be set to unity (i.e., as water is the more dense phase, it is below the oil-water contact); and for a cell that is above oil-water contact, a water saturation value for that cell may be set to null (i.e., as oil is the lighter phase, it exists above water and hence is assumed to be free of water). Thus, in such an example, where at least some information as to spatially distributed depths of oil-water contact may be known, an initialized grid cell model may include cells with values of unity and cells with values of zero for water saturation.

As mentioned, an initialized grid cell model may not be in an equilibrium state. Thus, sets of instructions may be executed using a computing device, a computing system, etc. that acts to adjust an initialized grid cell model to approximate an equilibrium state. Given a certain saturation field for a grid cell model, a technique may adjust relative permeability end points (e.g., critical saturations) such that relevant fluids are just barely immobile at their calculated or otherwise defined initial saturations. As a result, the grid cell model, as initialized, may represent a quiescent state in the sense that no flow will occur if a simulation is started without application of some type of "force" (e.g., injection, production, etc.).

As mentioned, a reservoir simulator may advance in time. As an example, a numeric solver may be implemented that can generate a solution for individual time increments (e.g., points in time). As an example, a solver may implement an implicit solution scheme and/or an explicit solution scheme, noting that an implicit solution scheme may allow for larger time increments than an explicit scheme. Times at which a solution is desired may be set forth in a "schedule". For example, a schedule may include smaller time increments for an earlier period of time followed by larger time increments.

A solver may implement one or more techniques to help assure stability, convergence, accuracy, etc. For example, when advancing a solution in time, a solver may implement sub-increments of time, however, an increase in the number of time increments can increase computation time. As an example, an adjustable increment size may be used, for example, based on information of one or more previous increments.

As an example, a simulator may implement an adjustable grid (or mesh) approach to help with stability, convergence, accuracy, etc. For example, when advancing a solution in time, a solver may implement grid refinement in a region where behavior may be changing, where a change in conditions exists/occurs, etc. For example, where a spatial gradient of a variable exceeds a threshold spatial gradient value, a re-gridding may be implemented that refines the grid in the region by making grid cells smaller.

Adaptive gridding can help to decrease computational times of a simulator. Such a simulator may account for one or more types of physical phenomena, which can include concentrations, reactions, micelle formations, phase changes, thermal effects (e.g., introduction of heat energy, heat generated via reactions, heat consumed via reactions, etc.), momentum effects, pressure effects, etc. As an example, physical phenomena can be coupled via a system of equations of a simulator. One or more types of physical phenomena may be a trigger for adaptive gridding.

As an example, a numeric solver may implement one or more of a finite difference approach, a finite element approach, a finite volume approach, a point-based approach, etc. As an example, the ECLIPSE reservoir simulator can implement central differences for spatial approximation and forward differences in time. As an example, a matrix that represents grid cells and associated equations may be sparse, diagonally banded and blocked as well as include off-diagonal entries.

As an example, a solver may implement an implicit pressure, explicit saturation (IMPES) scheme. Such a scheme may be an intermediate form of explicit and implicit techniques. In an IMPES scheme, saturations are updated explicitly while pressure is solved implicitly.

As to conservation of mass, saturation values (e.g., for water, gas and oil) in individual cells of a grid cell model may be specified to sum to unity, which may be considered a control criterion for mass conservation. In such an example, where the sum of saturations is not sufficiently close to unity, a process may be iterated until convergence is deemed satisfactory (e.g., according to one or more convergence criteria). As governing equations tend to be non-linear (e.g., compositional, black oil, etc.), a Newton-Raphson type of technique may be implemented, which includes determining derivatives, iterations, etc. For example, a solution may be found by iterating according to the Newton-Raphson scheme where such iterations may be referred to as non-linear iterations, Newton iterations or outer iterations. Where one or more error criteria are fulfilled, the solution procedure has converged, and a converged solution has been found. Thus, within a Newton iteration, a linear problem is solved by performing several linear iterations, which may be referred to as inner iterations.

As an example, a solution scheme may be represented by the following pseudo-algorithm:

```
// Pseudo-algorithm for Newton-Raphson for systems
initialize(v);
do {
    //Non-linear iterations
    formulate_non_linear_system(v);
    make_total_differentially);
    do {
        // Linear iterations:
        update_linear_system_variables(v);
    }
    while((linear_system_has_not_converged(v));
    update non_linear_system_after_linear_convergence(v);
}
while((non_linear_system_has_not_converged(v))
```

As an example, a solver may perform a number of inner iterations (e.g., linear) and a number of outer iterations (e.g., non-linear). As an example, a number of inner iterations may be of the order of about 10 to about 20 within an outer iteration while a number of outer iterations may be about ten or less for an individual time increment.

As an example, a method can include adjusting values before performing an iteration, which may be associated with a time increment. As an example, a method can include a reception block for receiving values, an adjustment block for optimizing a quadratic function subject to linear constraints for adjusting at least a portion of the values to provide adjusted values and a simulation block to perform a simulation using at least the portion of the adjusted values.

As mentioned, fluid saturation values can indicate how fluids may be distributed spatially in a grid model of a reservoir. For example, a simulation may be run that computes values for fluid saturation parameters (e.g., at least some of which are "unknown" parameters) as well as values for one or more other parameters (e.g., pressure, etc.).

As mentioned, a simulator may implement one or more types of adjustment techniques such as, for example, one or more of time step adjustment and grid adjustment, which may be performed dynamically. As an example, a simulator such as a reservoir simulator may implement one or more of such adjustment techniques.

As mentioned, a simulation may account for one or more thermal processes where, for example, there can be displacement of a thermal front (e.g., a combustion front, a steam chamber interface, etc.), around which most fluid flows takes place. As an example, a dynamic gridding approach may aim to keep a finer scale representation of a grid around the thermal front and a coarser scale representation of the grid at some distance from the front. Through use of the coarser scale representation of the grid, the number of equations/number of variables may be reduced, which can reduce matrix sizes, etc., of a simulator and thereby allow the simulator to operate more effectively.

As an example, a simulator can commence a simulation with an original or initial grid. As the simulator operates to generate simulation results, the simulator may re-amalgamate its grid cells, while keeping some regions (for example around wells) finely gridded. The simulator may identify a moving front through one or more large spatial gradients of one or more specific properties (e.g., temperatures, fluid saturations and compositions, etc.). In the front vicinity, the simulator may de-amalgamate the originally amalgamated cells, and later re-amalgamate them once the front has passed through a spatial region (e.g., a region of a subterranean formation such as a reservoir formation). As an example, amalgamated cells may be assigned up-scaled properties, for example, upscaling being based upon one or more types of averaging techniques.

As explained, reservoir flow simulation benefits from representing an underground environment accurately, particularly where one or more fronts may exist, which may vary spatially and change differently in space with respect to time. For example, a front may be a relatively planar front at a particular spatial scale in a region or, for example, a front may include fingers, curves, etc. As an example, a front's shape may change with respect to time, in terms of overall extent and geometrical shape (e.g., planar, curved, fingering, etc.). Such variations can pose challenges in dynamic gridding.

As mentioned, thermal processes can involve convective, diffusive and dispersive flows of fluids and energy, which may lead to the formation of fluid banks and fronts moving in the reservoir. Some of these fronts may represent interfaces between mobilized oil, which is hot and has had its viscosity reduced, and the more viscous oils which are as yet unaffected by heat energy. As an example, other fronts can occur between phases, such as where a leading edge of hot combustion gas moves into an uncontacted oil. Such interfaces may be thin when compared to a cell size of a grid (e.g., an original grid) used to model EOR processes in a simulator. As such, challenges exist in how to properly represent various types of fluid physics near interfaces. As mentioned, use of fine scale computational grid cells throughout a reservoir can be prohibitively expensive as to computational demands. To address various issues, an integrated approach may be taken where, for example, various frameworks can be operated in a coordinated manner.

Figure 7:
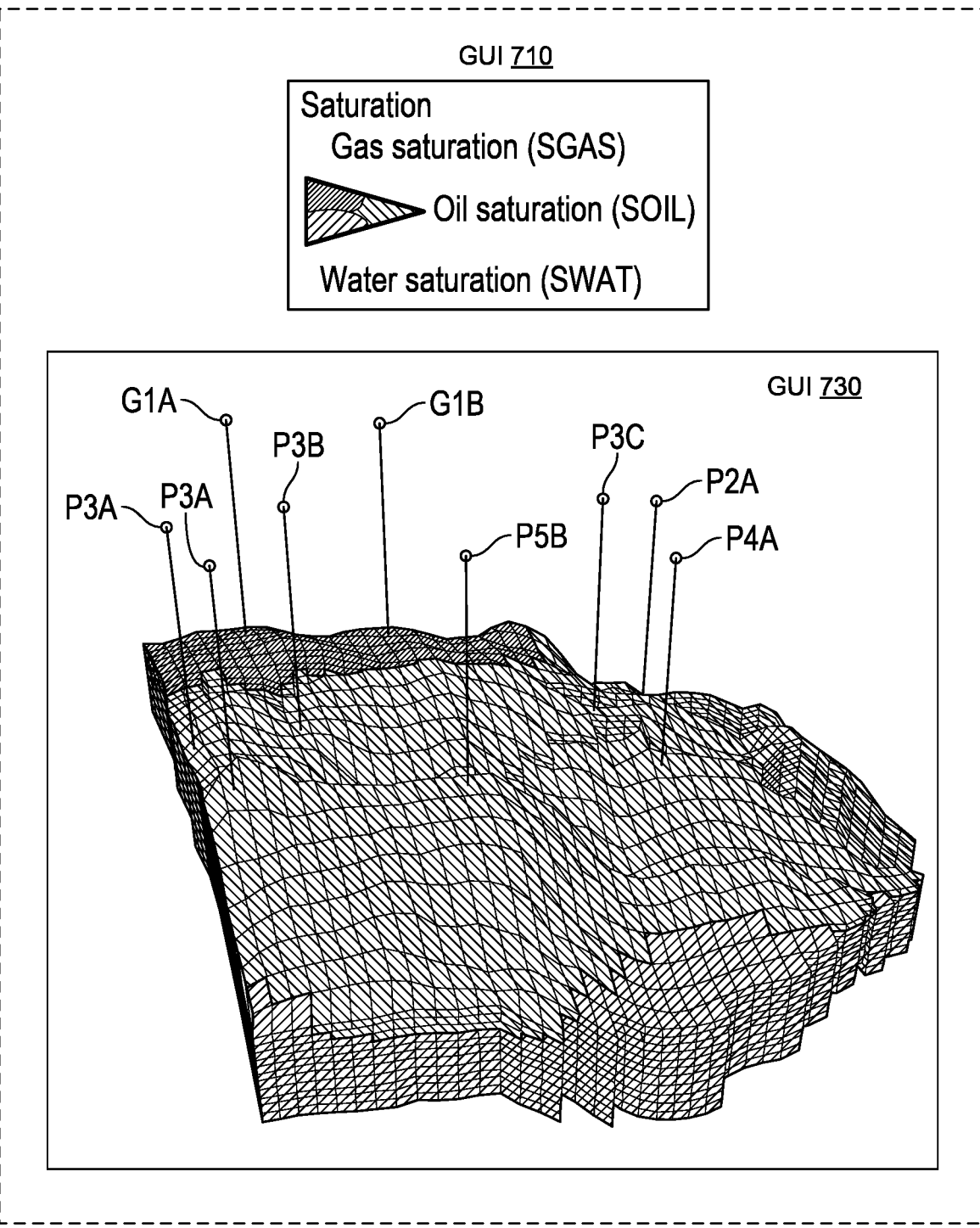
FIG. 7 illustrates an example of a graphical user interface.

FIG. 7 shows examples of graphical user interfaces 710 and 730, which show values as to saturation for gas, oil and water in a model of a reservoir that includes a plurality of wells. As an example, output from a simulator such as described with respect to FIG. 7, may be utilized to generate one or more GUIs. As mentioned, one or more simulations may be utilized to estimate reserves and/or fluid flow as to reserves (e.g., optionally responsive to one or more field operations such as, for example, one or more EOR operations, hydraulic fracturing, etc.).

As an example, a system can be a living integrated asset model (LAM) system that can may be operatively coupled to one or more computational frameworks (e.g., TECHLOG framework, AVOCET framework, modeling frameworks, etc.). A LAM system can be for infrastructure utilized in one or more field operations that can aim to produce hydrocarbon fluids from one or more fluid reservoirs in the Earth. As an example, a LAM system may be a living asset ensemble system that includes an ensemble of models or ensembles of models.

A LAM framework and associated workflow can provide solutions to maximize the hydrocarbon production of a digitally enabled field, for example, by maintaining an underlying system that keeps models live/up to date with the current conditions of reservoir and production for the optimizing the asset (e.g., reserves of hydrocarbons, etc.). An underlying system can acquire simulation data from current production to validate an integrated asset model, which couples single or multiple reservoirs, wells, networks, facilities and economic models (e.g., optionally an ensemble of ensembles). As an example, a LAM system can utilize and/or interact with various frameworks.

Figure 8:
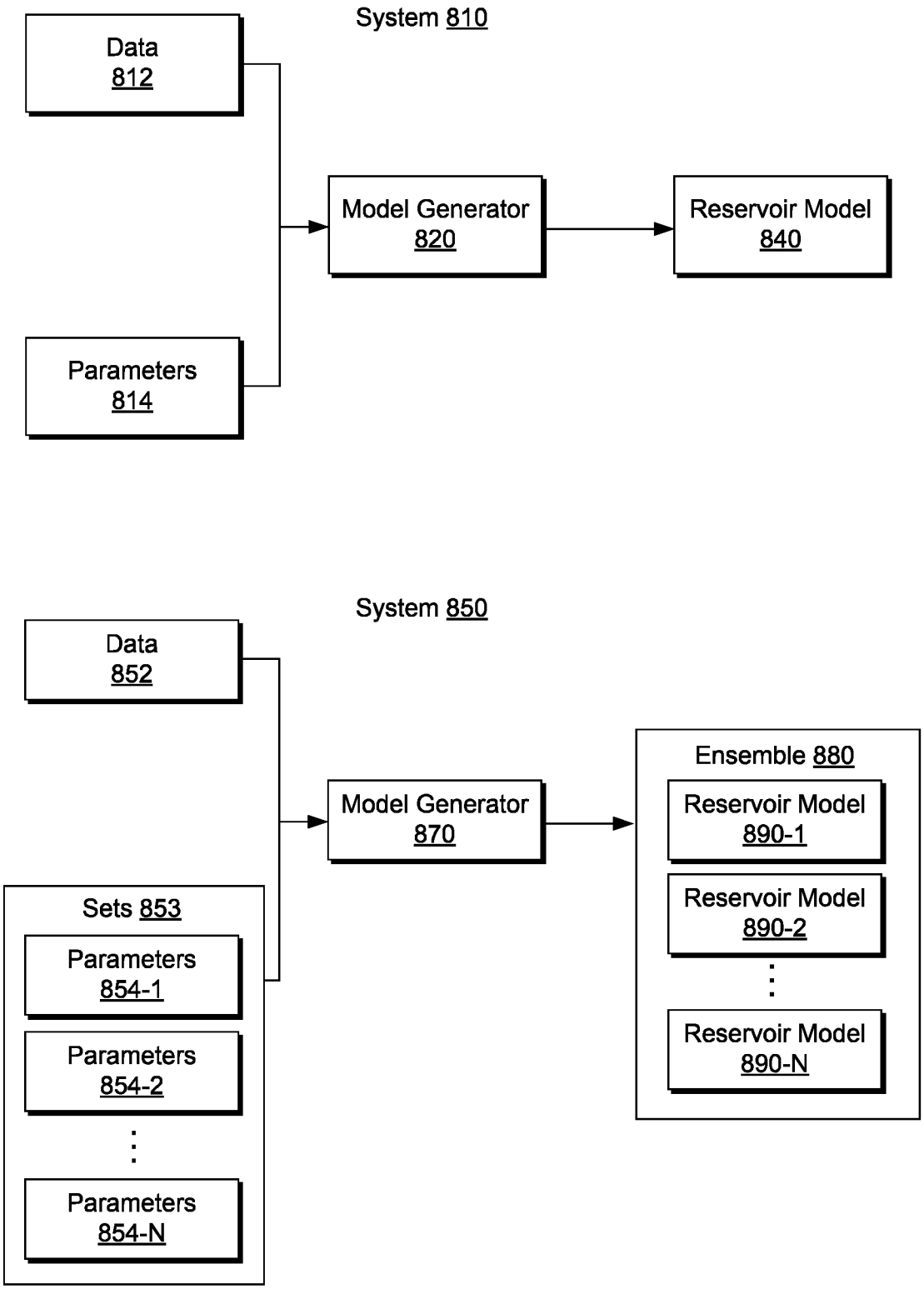
FIG. 8 illustrates examples of systems.

FIG. 8 shows an example system 810 and an example system 850. The system 810 includes a data block 812, a parameters block 814, a model generator block 820 and a reservoir model 840; whereas, the system 850 includes a data block 852, a sets of parameters block 853 with individual sets of parameters 854-1 to 854-N, a model generator block 870 and an ensemble block 880 with an ensemble of reservoir models 890-1 to 890-N. Various aspects of model generation, for example, described with respect to FIGS. 1 to 7, may be utilized by the model generator block 820 and/or the model generator block 870. A model generator can be a computational tool that can be local and/or remote. For example, consider a web interface that can be local and operatively coupled to one or more cloud-based resources (e.g., remote resources).

In the examples of FIG. 8, a reservoir model can be a numerical model of a reservoir that is suitable for utilization by one or more simulators. A reservoir model can include various types of information such as, for example, one or more of geological information, sedimentological information, petrophysical information, structural information, flow information, etc. A model can be a numerical model that is generated as part of a workflow and/or modelling approach to understanding one or more types of physical phenomena, etc., which may be static and/or dynamic (e.g., consider static reserves, dynamic hydraulic fracturing, dynamic production, etc.).

As explained, a model generator can accept inputs of various nature, which can be specified as parameters for at least some parts of a modelling workflow or, for example, as indexes of datasets to be used. As an example, each simulation model of a subterranean environment can have a corresponding input set of values for parameters. In such an example, the input set may be sampled from an input space or input spaces for one or more of the parameters. For example, an input set can be generated via a sampling process. In such an example, an input space can be a distribution of values for a parameter or parameters where a statistical technique can be applied for sampling of values. As an example, one or more smart or intelligent sampling techniques may be applied, which may differ from a random, stochastic approach to sampling an input space. As mentioned, a framework such as the PETREL framework can provide for analyzing data geostatistically prior to and/or during populating a model with values such as, for example, values for facies and/or petrophysical properties, which may involve implementing one or more deterministic and/or stochastic techniques. As an example, a workflow can include one or more of deterministic, stochastic and smart sampling. For example, smart sampling may be utilized to improve an ensemble after another technique has been utilized.

As explained, a model generator may be dynamic. For example, a living asset model (LAM) can be a dynamic model or be a dynamic ensemble of models. As an example, a workflow may involve generation and assessment of various scenarios where a model generator may operate to generate a model for each of the various scenarios where an ensemble can be a collection of models for various scenarios.

As an example, a method may operate responsive to generation of one or more models. For example, when new models are ready from a model generator, such a method can initiate and execute an update in a confidence analysis. In such an example, results of the confidence analysis may be rendered to a display, for example, as part of a graphical user interface (GUI). As an example, results of a confidence analysis may be evaluated with respect to one or more predefined criteria. In such an example, if an acceptable level of confidence has not yet been achieved, a workflow may continue to generate one or more additional models. As an example, a confidence analysis can include determining a series of indexed metrics using indexes that correspond to models, such as an indexed input set that can be associated with a corresponding indexed output set. As an example, an index may be a numeric value such as a whole number where models generated may be indexed successively (e.g., 1, 2, 3, . . . , N).

As an example, where a particular level of confidence has been reached, a method can include calling for an information gain analysis. For example, an information gain analysis may determine a degree of information that has been gained, for example, with respect to a prior amount, a relative amount, etc. In such an example, information gain may be characterized according to one or more aspects of a model. For example, consider a spatial characterization of information gain, which may demonstrate a homogeneous gain or a heterogeneous gain. Where a gain is heterogeneous, a method can include identifying a spatial region for possible improvement, which can include model generation, model augmentation, etc. As an example, a spatial region or spatial regions with high expected information gain may be sampled where sampling information can be transmitted to (e.g., received by) a model generator. As shown in FIG. 8, the system 850 includes the ensemble 880 of reservoir models 890-1 to 890-N, which can be an ensemble that is built iteratively through a method that aims to generate the ensemble as including models of high confidence and proper local sampling.

As an example, an information gain analysis may operate by removing a model and/or its input and/or output to assess a change in information. Where such a change in information decreases, the model and/or its input and/or output may be deemed to be informative in that inclusion thereof provide for a gain in information. A decision may be made using such an analysis to keep a model and/or its input and/or output in an ensemble where an information gain analysis demonstrates that information is increased (e.g., gained) when included, whether such an assessment does so in a positive manner (e.g., inclusion testing) and/or in a negative manner (e.g., removal testing). As explained, a gain in information as to reality can help reduce uncertainty. As an example, a method can include optimizing an ensemble as to information gain in view of one or more resource constraints (e.g., time, computational resources, etc.). As an example, an optimization may depend on assessing an amount of information gained with respect to resource utilization to achieve the amount of information gained. Where time may be a factor, if a trend in information gained is diminishing incrementally with each additional model, a method may terminate model generation (e.g., using a predefined gain threshold per model, etc.). Such an approach may help to expedite building of an ensemble (e.g., to save time such that one or more subsequent workflow actions may be taken, etc.).

As shown in FIG. 8, the model generator blocks 820 and 870 operate according to various inputs. For one or more reasons, there can be some degree of uncertainty associated with one or more of the various inputs. As an example, a value of a parameter may lack precision, not be known or a suitable value may not exist.

Referring to the method 610 of FIG. 6, some examples of parameters are shown, which can include pore volumes, transmissibilities, depths, NNCs, etc. For the ECLIPSE reservoir simulator, grid dimensions and cell depths (e.g., DX, DXV, DY, DYV, DZ, TOPS, COORD, ZCORN, etc.), porosity (e.g., PORO), permeability (e.g., PERMX, PERMY, PERMZ, PERMR, PERMTHT, etc.), and net-to-gross or net thickness (e.g., NTG, DZNET, etc.) can be parameters. As indicated, a parameter may be spatial and aim to characterize material in a geologic environment. For a grid model defined using grid cells, each of the grid cells can represent a portion of a geologic environment using one or more parameters. As an example, various parameters may be referred to as cell property parameters where a cell-based model is utilized. As mentioned, a grid cell model may utilize coordinates such as Cartesian coordinates (e.g., x, y, z), cylindrical coordinates (e.g., r, z, $\theta$), index coordinates (e.g., I, J, K), etc. As an example, in a shale model, lithology can be assigned to various layers such as, for example, one or more sand layers and one or more shale layers (e.g., K1=sand, K2=shale, K3=sand, K4=shale, etc.). As explained, a reservoir can include one or more fluids, which may be assigned fluid properties (e.g., as parameters).

As an example, a model may be for a black oil simulation, a compositional simulation, etc. A black oil simulation can include, for each time increment, providing a flow equation solution for each cell of a cell-based model subject to a material balance and performing a PVT data lookup from a data structure and a compositional simulation can include, for each time increment, providing a flow equation solution for each cell of a cell-based model subject to a material balance, an iterative solution of a cubic equation of state for each component in each cell, and an iterative flash computation of a component mixture to equilibrium conditions for each cell. Such types of simulation can provide data as output that characterizes a reservoir as to how fluid moves responsive to pressure (e.g., due to one or more types of operations such as injection, production, fracturing, etc.). As to types of pressure, a simulator may account for fluid (e.g., hydrostatic) pressure, overburden pressure (e.g., hydrostatic plus rock), capillary scaling pressure, etc. As an example, rock compressibility may be characterized by one or more parameters.

As an example, a workflow can include a history period and a prediction period. For example, a simulator may be utilized in a history matching process to improve and/or to qualify a reservoir model using field data (e.g., field production data, etc.). In such an example, once an acceptable match is achieved, a prediction period may aim to predict future behavior of a reservoir. In some instances, a prediction may be rejected using one or more criteria (e.g., as deviating from historical data in an unlikely manner, etc.).

As mentioned, uncertainty can exist for one or more parameters. As an example, a workflow can include generation of multiple realizations of a model where each realization is defined by its own set of parameter values (e.g., an input set of values of parameters). In such an example, sets of parameter values can be generated using one or more statistical and/or probabilistic techniques, which can involve sampling (e.g., sampling from a base set, a distribution, etc.). For example, a stochastic technique such as a Monte-Carlo technique, a Latin hypercube technique, etc., may be utilized to generate sets of parameter values. In turn, an ensemble of models can be generated where each of the models in the ensemble is defined in part by a corresponding one of the sets of parameter values.

As explained, models in an ensemble can have different sets of values of various input parameters (e.g., each model can have an associated input set of values of parameters). In FIG. 8, the system 850 can provide one or more types of techniques (e.g., computational techniques, etc.) for generating the ensemble 880.

Once a workflow which generates an ensemble has been established, the workflow can utilize one or more methods that aim to determine a number of models and/or a range for such a number to be included in the ensemble. Such a number may depend on one or more factors, which can include factors such as reservoir specific factors, computational resource factors, user determined factors, etc. For example, a user may have knowledge from prior experience that for a sand and shale reservoir a number of models is to be within a known range. However, that range may be sub-optimal for a specific sand and shale reservoir. Where the minimum number in the range is too high, the user may generate too many models (e.g., overutilization of computational resources and/or delay in time) and where the maximum number in the range is too low, the user may generate too few models (e.g., lack of accuracy).

As to some example limitations, one may be available resources. For example, a user can afford to create an ensemble of a maximum of one hundred models due to available software licenses and time. Some other approaches can include resorting to a rule of thumb such as "if I have 10 parameters then my ensemble should have 100 models and if there are 5 parameters then 30 models is enough". In various instances, the number of models may be fixed because the fixed number is believed to be an "acceptable" number.

As an example, a system can automatically generate an optimum ensemble with respect to one or more constraints (e.g., resource and/or time constraints) where the optimum ensemble includes an optimal number of models (e.g., reservoir models). As an example, a system can automatically generate an acceptable ensemble where the acceptable ensemble includes an acceptable number of models (e.g., reservoir models).

As mentioned, issues can arise where an ensemble of models is too small. For example, a too small ensemble may fail to adequately capture uncertainty such that a decision based on that ensemble has an insufficient level of trust (e.g., too risky). For example, if a person wants to understand how outside temperature changes on specific day it might not be enough to measure temperature twice each day, once in the morning and once in the evening. As explained, an ensemble may be utilized by a workflow that may be resource intensive. For example, consider an ensemble for reserves estimation that is to be utilized for production history matching. In such an example, if the ensemble for reserves estimation is insufficient in its quality, that ensemble may impact the production history matching such that the results of the production history matching exhibit an unacceptable level of uncertainty. In such an example, where an optimization is applied to optimize an ensemble for reserves estimation, that ensemble may benefit a subsequent workflow, for example, as to production history matching, which may be a fluid simulation workflow that is based on at least some of the models of the ensemble.

As mentioned, issues can arise where an ensemble of models is too large. For example, while such an ensemble may adequately capture underlying uncertainty, there can be redundancy in at least some of the models in the ensemble where resources utilized may be wasted (e.g., redundancy in that inclusion of two similar models does not provide a substantial information gain beyond inclusion of one of the models alone). For example, if a person decides to measure outside temperature every minute, there is likely to be a representative set of measurements (e.g., depending on time of day, weather conditions, etc.); however, measuring at intervals of approximately 5 minutes to approximately 10 minutes would likely provide similar accuracy and would conserve resources.

As an example, a method can include dynamically assessing ensemble quality during a model generation process to control the model generation process in an effort to achieve an acceptable (or optimal) level of ensemble quality. In such an example, the method can dynamically control the process according to one or more criteria, for example, to stop the process when quality achieves desired level or when growth in quality slows. As an example, a method can include utilizing one or more measures for ensemble quality. For example, consider performing simulations of physical phenomena using each of a number of simulation models where each of the simulations generates a corresponding indexed output set of values for the physical phenomena. In such an example, a method can include determining a series of indexed metrics using the indexed output sets and, based on the series of indexed metrics, deciding to output the simulation models as at least part of an ensemble that is statistically representative of the subterranean environment or, for example, to generate one or more additional simulation models (e.g., to improve the ensemble, etc.).

As an example, a measure of quality may depend on accuracy of one or more models as to an ability to predict physical phenomena associated with a reservoir. For example, consider a reservoir model that is utilized by a simulator to predict production of hydrocarbon fluid from a reservoir where the production can be a volumetric production in one or more units (e.g., barrels, etc.) or a volumetric production rate in one or more units (e.g., barrels per day, etc.). As another example, consider composition of fluid produced. As explained with respect to the GUIs 710 and 730 of FIG. 7, a reservoir simulator may aim to predict saturation (e.g., gas saturation, oil saturation, water saturation, etc.). As to one or more other types of simulators, one or more other simulator outputs may be utilized for purposes of measuring quality. For example, a hydraulic fracturing simulator (e.g., consider one or more features of the VISAGE framework, the MANGROVE framework, etc.), where fracturing activity (e.g., natural and/or artificial) may be compared to microseismic data (e.g., actual field data) to assess quality.

As an example, quality may be measured using real historical data, real live data and/or one or more types of simulated data. As to the latter type of data, one type of simulator may output information that can be utilized to assess quality of another type of simulator. For example, consider hydraulic fracturing where a simulated level of production may be output by a hydraulic fracturing simulator that can be utilized to assess quality of a simulated level of production output by a reservoir simulator that can include digital representations of one or more fractures (e.g., natural and/or artificial fractures, which may be part of a discrete fracture network (DFN)). As another example, consider assessing quality between two reservoir simulators such as the ECLIPSE simulator and the INTERSECT simulator. As yet another example, consider assessing quality between a black oil simulation and a compositional simulation, where, depending on fluid characteristics, field operations, etc., a compositional simulation may be considered to be more accurate, yet more computationally resource intensive. In such an example, in one or more regions where a black oil simulation suffices (e.g., is deemed acceptable), resources may be conserved as to model generation and execution using a reservoir simulator (e.g., or reservoir simulators). As an example, a method may operate in a coordinated manner to improve a multi-simulator workflow.

Figure 15:
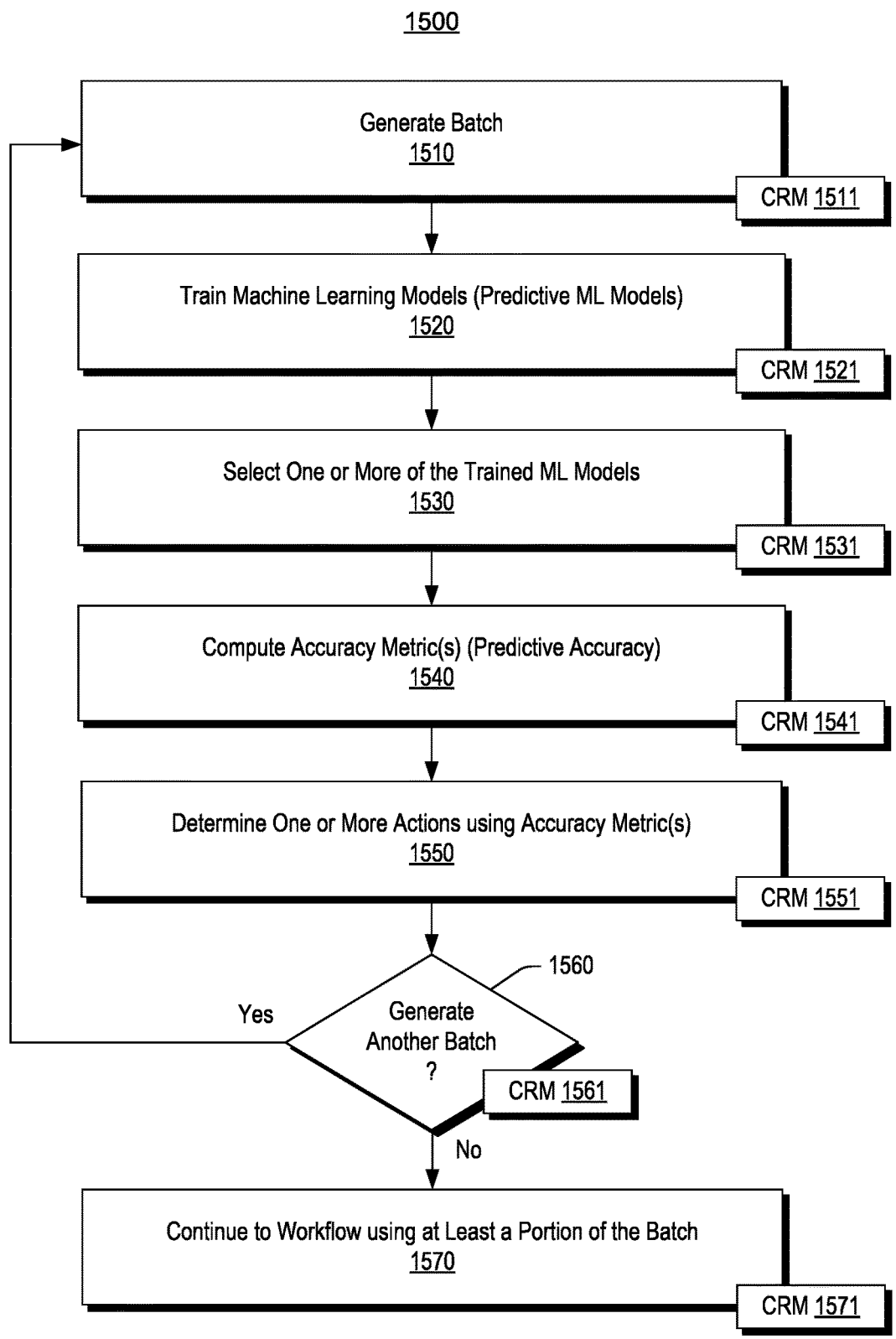
FIG. 15 illustrates an example of a method.

For various computational workflows, which may include one or more types of optimizations, a method may measure ensemble quality using accuracy of prediction of a model's outcome (e.g., consider oil production) as based on the values of the model's input parameters (see, e.g., the method 1500 of FIG. 15).

As an example, a method can include dynamically determining when ensemble size is appropriate and training a machine learning model that learns relationships between model inputs and outputs. In such an example, the ensemble size may account for one or more aspects of machine learning. For example, different types of machine learning and/or machine learning models can demand different amounts and/or different types of training data.

Machine learning (ML) can be considered an artificial intelligence technology where a computational framework can train a machine learning model (ML model) using training data to generate a trained ML model. A trained ML model may be utilized for one or more purposes. For example, consider a predictive trained ML model, a decision-making trained ML model, etc.

As explained, a method can utilize a positive approach and/or a negative approach in making decisions as to models for an ensemble. For example, a positive approach can assess prediction accuracy upon inclusion of a model (e.g., via its input and/or output). Where prediction accuracy increases substantially, inclusion in an ensemble can be warranted. As to a negative approach, consider removing a model (e.g., via its input and/or output) and assessing prediction accuracy to determine whether it decreases substantially. If such a decrease occurs, the model can be deemed informative and warrant inclusion. As an example, an assessment can include training a machine learning model with a group of models (e.g., input and output) as a training dataset to generate a trained machine learning model. In such an example, the training dataset can be adjusted by removing a model to generate an adjusted training dataset that can be utilized for training the machine learning model. In such an example, where the predictive accuracy decreases substantially, the model that was removed can be deemed to be informative such that it warrants inclusion in an ensemble. As an example, a method can include model testing that tests one or more models (e.g., input and/or output) to determine whether each of the one or more models is to be included in an ensemble.

As to types of machine learning models, consider one or more of a support vector machine (SVM) model, a k-nearest neighbors (KNN) model, an ensemble classifier model, a neural network (NN) model, etc. As an example, a machine learning model can be a deep learning model (e.g., deep Boltzmann machine, deep belief network, convolutional neural network, stacked auto-encoder, etc.), an ensemble model (e.g., random forest, gradient boosting machine, bootstrapped aggregation, AdaBoost, stacked generalization, gradient boosted regression tree, etc.), a neural network model (e.g., radial basis function network, perceptron, back-propagation, Hopfield network, etc.), a regularization model (e.g., ridge regression, least absolute shrinkage and selection operator, elastic net, least angle regression), a rule system model (e.g., cubist, one rule, zero rule, repeated incremental pruning to produce error reduction), a regression model (e.g., linear regression, ordinary least squares regression, stepwise regression, multivariate adaptive regression splines, locally estimated scatterplot smoothing, logistic regression, etc.), a Bayesian model (e.g., naïve Bayes, average on-dependence estimators, Bayesian belief network, Gaussian naïve Bayes, multinomial naïve Bayes, Bayesian network), a decision tree model (e.g., classification and regression tree, iterative dichotomiser 3, C4.5, C5.0, chi-squared automatic interaction detection, decision stump, conditional decision tree, M5), a dimensionality reduction model (e.g., principal component analysis, partial least squares regression, Sammon mapping, multidimensional scaling, projection pursuit, principal component regression, partial least squares discriminant analysis, mixture discriminant analysis, quadratic discriminant analysis, regularized discriminant analysis, flexible discriminant analysis, linear discriminant analysis, etc.), an instance model (e.g., k-nearest neighbor, learning vector quantization, self-organizing map, locally weighted learning, etc.), a clustering model (e.g., k-means, k-medians, expectation maximization, hierarchical clustering, etc.), etc.

As an example, a machine model, which may be a machine learning model, may be built using a computational framework with a library, a toolbox, etc., such as, for example, those of the MATLAB framework (MathWorks, Inc., Natick, Mass.). The MATLAB framework includes a toolbox that provides supervised and unsupervised machine learning algorithms, including support vector machines (SVMs), boosted and bagged decision trees, k-nearest neighbor (KNN), k-means, k-medoids, hierarchical clustering, Gaussian mixture models, and hidden Markov models. Another MATLAB framework toolbox is the Deep Learning Toolbox (DLT), which provides a framework for designing and implementing deep neural networks with algorithms, pretrained models, and apps. The DLT provides convolutional neural networks (ConvNets, CNNs) and long short-term memory (LSTM) networks to perform classification and regression on image, time-series, and text data. The DLT includes features to build network architectures such as generative adversarial networks (GANs) and Siamese networks using custom training loops, shared weights, and automatic differentiation. The DLT provides for model exchange on various other frameworks.

As mentioned, an example of a machine learning model is a neural network (NN) (e.g., a neural network model), which can include neurons and connections where each connection provides the output of one neuron as an input to another neuron. Each connection can be assigned a weight that represents its relative importance. A given neuron can have multiple input and output connections. A NN can include a propagation function that computes the input to a neuron from outputs of its predecessor neurons and their connections as a weighted sum. As an example, a bias term can be added to the result of the propagation.

As an example, neurons can be organized into multiple layers, particularly in deep learning NNs. As an example, the layer that receives external data can be an input layer and the layer that produces a result or results can be an output layer. As an example, a NN may be fully connected where each neuron in one layer connects to each neuron in the next layer. As an example, a NN can utilize pooling, where a group of neurons in one layer connect to a single neuron in the next layer, thereby reducing the number of neurons in that layer. As an example, a NN can include connections that form a directed acyclic graph (DAG), which may define a feedforward network. Alternatively, a NN can allow for connections between neurons in the same or previous layers (e.g., a recurrent network).

As an example, a trained ML model (e.g., a trained ML tool that includes hardware, etc.) can be utilized for one or more tasks. As an example, various types of data may be acquired and optionally stored, which may provide for training one or more ML models, for retraining one or more ML models, for further training of one or more ML models, and/or for offline analysis, etc.

As an example, the TENSORFLOW framework (Google LLC, Mountain View, Calif.) may be implemented, which is an open source software library for dataflow programming that includes a symbolic math library, which can be implemented for machine learning applications that can include neural networks. As an example, the CAFFE framework may be implemented, which is a DL framework developed by Berkeley AI Research (BAIR) (University of California, Berkeley, Calif.). As another example, consider the SCIKIT platform (e.g., scikit-learn), which utilizes the PYTHON programming language. As an example, a framework such as the APOLLO AI framework may be utilized (APOLLO.AI GmbH, Germany). As an example, a framework such as the PYTORCH framework may be utilized (Facebook AI Research Lab (FAIR), Facebook, Inc., Menlo Park, Calif.).

Figure 9:
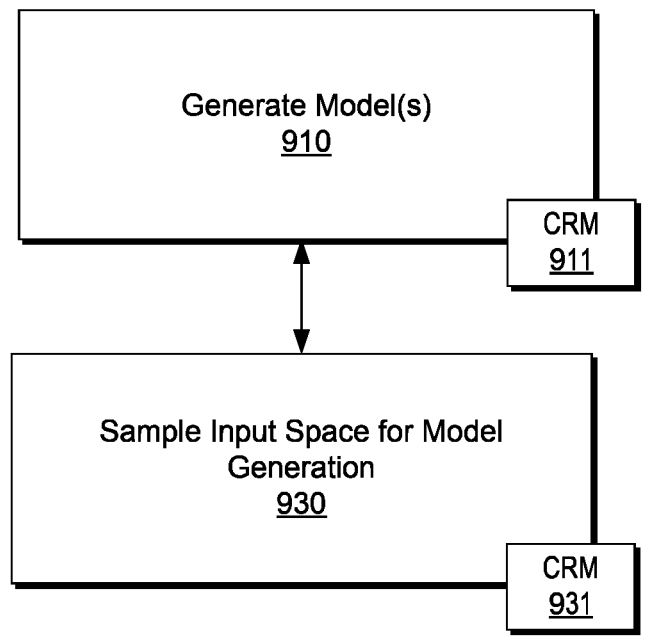
FIG. 9 illustrates an example of a method.

FIG. 9 shows an example of a method 900 that includes a generation block 910 for generating models and a sampling block 930 for sampling an input space for use in model generation. As shown in FIG. 9, the blocks 910 and 930 can be interactive in that they can be responsive to one another. For example, the generation block 910 can call for input space sampling, which may, for example, aim to perform smart sampling to gain information while taking resource utilization into account and the sampling block 930 can transmit information to the generation block 910 for purposes of generating one or more models. As an example, the sampling block 930 may provide one or more sampling techniques (e.g., stochastic, smart, etc.). As an example, the method 900 may include utilizing one or more sampling techniques as may be provided by the sampling block 930.

The method 900 is shown in FIG. 9 in association with various computer-readable media (CRM) blocks 911 and 931. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 900. As an example, a computer-readable medium (CRM) may be a computer-readable storage medium that is non-transitory and that is not a carrier wave. As an example, one or more of the blocks 911 and 913 may be in the form of processor-executable instructions, for example, consider the one or more sets of instructions 270 of the system 250 of FIG. 2 (see also, e.g., the system 2100 of FIG. 21).

As an example, a system may include resources that can perform parallel and/or multiple realization simulations. For example, consider a system that can run simulations on multiple cores or run one simulation split across cores, which may reduce run time. Running simulations in parallel on multiple cores may reduce time to build an ensemble. As an example, a method that optimizes an ensemble subject to one or more resource constraints may account for availability of multiple cores (e.g., in a single machine, in multiple machines, in a local system, in a cloud-based system, etc.).

As mentioned, in various instances, if an ensemble is less than a certain size (e.g., a certain number of reservoir models, etc.), learning may be compromised when training a ML model (e.g., due to an insufficiency of data, trained ML model prediction accuracy, etc). In various instances, success of such learning can depend on underlying reservoir complexity (e.g., how compartmentalized a reservoir may be, number of wells, number of phases and/or composition of fluid, production regime, etc.). In such instances there may be an inability to deduce a trained ML model using input parameters alone.

As an example, a measure of ensemble quality may be a confidence metric, which can represent a degree of confidence of an ensemble that an operator may aim to achieve.

Figure 10:
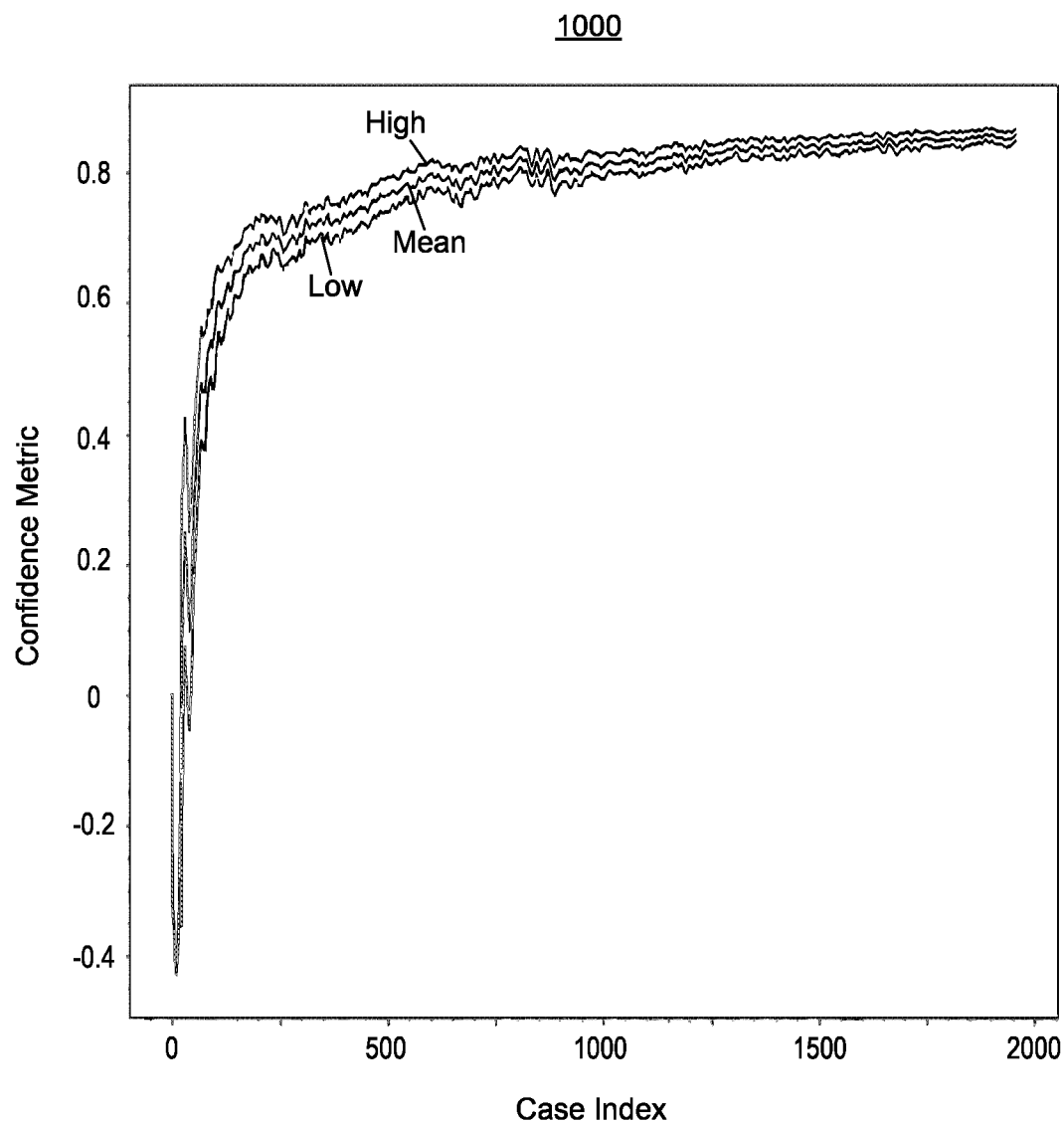
FIG. 10 illustrates an example of a plot.

FIG. 10 shows an example plot 1000 of a confidence metric versus a case index, which represents a number of models and may be generated with respect to time (e.g., indexed from a first model to approximately 2000 models).

As an example, a method can include dynamically generating an optimal ensemble that accounts for one or more resource constraints. Such a method may commence with an empty ensemble, with no models (e.g., no reservoir models). Such a method can then generate a batch of models to fill the ensemble (e.g., to a case index or size of N, which may be predefined). In such an example, the batch can represent an initial batch or a base batch or number of cases (e.g., an initial group of indexed models, etc.). For example, a predetermined number of models may be greater than approximately 10 and less than approximately 500. In such an example, one or more confidence metric values may be determined, which can be utilized as a basis for assessing the impact on confidence for one or more additional models.

As an example, a method can include adding one or more new models to an ensemble (e.g., a not empty ensemble) and calculating a value of a present confidence metric for the ensemble. In such an example, the value of the present confidence metric may be automatically compared to one or more predefined criteria and/or one or more dynamic criteria.

As an example, a graphical user interface can provide for rendering information to a display such that an operator can visualize confidence information. Where one or more criteria are not met (e.g., and/or where a user intervenes as not being satisfied with confidence), the method can proceed to another iteration by generating one or more additional models to be added to the ensemble to thereby enlarge the ensemble. As an example, where confidence may exhibit undesirable behavior, one or more models may be deleted from the ensemble (e.g., one or more of the most recently added models may be deleted, etc.). In such an example, one or more adjustments may be made to a model generation process (e.g., as to one or more parameters, etc.). As an example, indicia of some amount of model redundancy may be an undesirable behavior.

As explained, a system may provide for one or more types of user interactions through use of one or more graphical user interfaces. For example, consider a GUI that allows a user to monitor progress via a real time plot of ensemble confidence versus size of the ensemble (e.g., a model index, etc.). The plot 1000 may be rendered to a GUI where a user can visualize confidence metric trends, optionally for low, mean and high values of a confidence metric. In such an example, as confidence increases, a span between low and high values may decrease. For example, consider a metric that depends on a difference between low and high values where the metric may be compared to a threshold, which may operate in part as a stopping criterion.

In the example plot 1000 of FIG. 10, the three curves represent the minimum, the mean and the maximum confidence in the ensemble with respect to the case index. The ensemble can be considered of high quality if the curves reach a set value (e.g., consider unity being a maximum value that represents 100 percent confidence) and, as mentioned, confidence can be deemed to be a metric indicative of acceptably high quality ensemble when a difference between the minimum and the maximum curves becomes sufficiently small (e.g., less than approximately 0.1 on a scale of −1.0 to +1.0). For example, where the three curves effectively collapse into a single curve (e.g., within limits of noise, etc.) and where the value of the single curve is sufficiently high, a confidence may be acceptable and a model generation process can terminate. In such an example, additional models may not substantially reduce uncertainty where underlying uncertainty as to a subterranean environment appears to be adequately captured. For example, where the confidence metric approaches a relatively constant value with respect to case index, such a trend can be an indicator that the number of models corresponding to a case index value can form an ensemble that is statistically representative of the subterranean environment. In such an example, an ensemble that is statistically representative of a subterranean environment can be viewed probabilistically in that the probability of a realistic scenario (e.g., a realization) not being accounted for by the ensemble is relatively low. As an example, where such a scenario, if not accounted for, may have a substantial impact on confidence in a decision regarding exploration, development, production, etc., of the subterranean environment, the ensemble may be too small or otherwise not sufficiently statistically representative of the subterranean environment (e.g., statically and/or dynamically). In such an example, addition of more models (e.g., realizations) to an ensemble can increase confidence; however, as explained, at some point, further additions to an ensemble may exhibit relatively little impact on increasing confidence while utilizing limited or otherwise constrained resources.

As explained, a system may provide output that can be rendered to a display for visualization by a user where the output may be in the form of an indexed metric. In such an example, the user may decide that the number of models is sufficient for an acceptable ensemble, for example, an ensemble that is statistically representative of a subterranean environment. Where a system can render a GUI with various tools, a user may interact with the GUI to assess an indexed metric, for example, as to how much additional confidence may be gained for a number of additional models. In such an example, consider curve fitting applied to the metric of the plot 1000 where a fit curve or fit curves (e.g., for low, mean and high) can be utilized to predict values for the case index beyond a current case index. In such an example, a case index cutoff may be determined where model generation continues until the case index cutoff value is reached. As explained, results may be rendered in real time where a user can assess progress as the case index increases from the current case index to the case index cutoff. Where an acceptable match exists between a curve or curves and the fit curve or curves, model generation may be terminated and an ensemble output. However, where an acceptable match does not exist (e.g., according to one or more predefined limits, additional curve fitting, etc.), model generation may continue and, for example, a new case index cutoff set.

As mentioned, quality can be measured using output from a simulator that utilizes models of an ensemble. In such an approach, there can be a delay between model generation and determination of confidence metric values. As mentioned, a method can include parallel processing where multiple simulations may be executed to generate results for a number of models, which may be assigned case index values. In such an example, a plot may be dynamically rendered according to case index values or, as simulations are completed, confidence metric values may be added (e.g., consider the plot 1000 of FIG. 10 where points fill in as a batch of models is run through multiple simulators, etc.).

In the example of FIG. 10, a value of unity for the confidence metric may be unattainable and there can be diminishing returns when such a method is viewed as a whole. As an example, an asymptotic analysis may be utilized as part of a stopping determination, which may include fitting to an exponential or other type of function (e.g., $y=a+b/x$, etc.) to estimate a gain from further model generation. In such an example, where the gain is deemed to be too small as to an increase in confidence, a method can stop (e.g., terminate model generation) to provide an acceptable ensemble, which may be considered to be an optimized ensemble where optimization accounts for quality and resource utilization. In the plot 1000, growth in confidence lessens after around 500 models, where a difference between the minimum value (e.g., low value) and the maximum value (e.g., high value) is less than approximately 0.1 (e.g., less than 10 percent on a scale of 0 to 1 of the confidence metric). As explained, such conditions may trigger a stop instruction that calls for stopping a model generator.

As explained, a system can improve workflows that include model-based simulation as run by one or more simulators. Such a system can provide for generation of an ensemble in a manner that can account for resource utilization (e.g., time and/or computational resources). Such a system can provide for optimization of an ensemble in a manner that accounts for uncertainty, which may be represented in terms of quality (e.g., one or more confidence metrics, etc.). As an example, an acceptable ensemble can be an ensemble of models that is statistically representative of a physical environment where uncertainty exists in an ability to characterize the physical environment using a single model. As explained, a subterranean environment may span an area of a square kilometer or more (e.g., consider hundreds of square kilometers) over a depth that may be in excess of one hundred meters (e.g., consider a depth in excess of a kilometer, etc.). As such, data from a few boreholes (e.g., log data) may be relatively sparse. While such data can supplement seismic data, for example, to estimate positions of layers, etc., much remains unknown about the subterranean environment. Thus, a statistical approach may be taken to represent the subterranean environment through an ensemble of realizations (e.g., models) where such realizations can be based at least in part on sampling parameter values from parameter spaces, which may be distributions of parameter values derived from one or more sources of data such as, for example, one or more of seismic data, log data, analogue data (e.g., from other environments), lab data, etc.

A quality-based approach can increase robustness of simulators in a manner that captures the representative power of a dataset. For example, an approach can provide for capturing relevant physical phenomena of an environment as complex as a hydrocarbon reservoir, which can demand a substantial amount of data. In various instances, data can be constrained or otherwise limited. For example, certain types of data may or may not be available, be available for a limited number of regions of an environment, etc. As explained, data may be less than certain and, as such, have an associated level of uncertainty. Data acquisition can be resource intensive, including demanding of sophisticated equipment, sophisticated field operations, etc. As an example, uncertainty may be linked to complexity of a workflow where one or more actions may introduce uncertainty. As explained, acquiring too much data with respect to time (e.g., or space) can be wasteful while acquiring too little data with respect to time (e.g., or space) can increase uncertainty.

In various instances, a workflow may be constrained by an existing dataset and/or by a rate by which data can be acquired. In various instances, data may be available for some parameters in an on-demand manner. In the aforementioned instances, various resource demands and/or data protections (e.g., ability to access data, modify data, extend data, etc.) may be taken into account when seeking to optimize an ensemble.

In reservoir simulation-based workflows, as explained, resources can involve software/hardware and the amount of time to produce a sufficient number of reservoir models. As explained, an ensemble optimization approach can include implementing various techniques for evaluating data to determine an amount of data that can help to guarantee a successful workflow.

As an example, a system can provide functionality to control quality and representative power of one or more datasets. As an example, a system can provide for addressing complexity of reservoir models and perceived dimensionality of workflow's parametrization. As an example, a system can provide for assessing an apparent dimension of a workflow problem, which can determine the amount of data that is acceptably sufficient for capturing reservoir dynamics.

As explained with respect to the plot 1000 of FIG. 10, utilization of a confidence metric can provide for characterizing models where such models differ, for example, based on aspects of their inputs. As mentioned in the weather example, uncertainty in a conclusion (e.g., a result) can depend on how and/or how much data are acquired and/or otherwise available. In the weather example, reasonable bounds (e.g., ranges) may be known, along with statistics, probabilities, etc. (e.g., consider a weather or meteorological almanac). In contrast, an environment, such as a subterranean environment, may be less understood. In some instances, sparse data are available for limited periods of time, which can give rise to uncertainties. As such, given the large number of parameters that characterize a subterranean environment, particularly with respect to fluid, uncertainty exists as it will be too resource intensive to acquire substantial amounts of data. Acquisition of well log data demands drilling wells and logging the wells (e.g., logging while drilling, logging after drilling, etc.). Acquisition of seismic data demands field operations to place seismic survey equipment in the field and operate it to acquire data. Acquisition of flow data (e.g., production, injection, etc.) demands field operations that can drive fluid in a subterranean environment. As explained, such data acquisition operations tend to be more complex and resource intensive than placing a thermometer outside in a surface environment and periodically reading the thermometer.

As explained, model-based simulation workflows can involve data as inputs and data as outputs. Various operations may be performed to adjust data as input and/or models, where, for example, an input can be a model parameter that may pertain to one or more physical characteristics (e.g., spatial characteristic, structural characteristic, fluid characteristic, etc.) and/or one or more physical phenomena (e.g., phase behavior, reaction rates, etc.). As mentioned, each variation of a model can correspond to a realization of a subterranean environment being modeled and, in various instances, a parameter may pertain to an aspect of a model itself, for example, consider number of cells, cell size, types of equations (e.g., black oil, compositional, etc.), etc. An ensemble can be an ensemble of realizations, where the number of realizations is sufficiently large to provide for a desired level of certainty (e.g., a limited level of uncertainty) in results, which may, for example, be utilized for making one or more decisions, which can include one or more types of control decisions (e.g., for issuing control instructions to instruct one or more pieces of equipment in the field to perform one or more field operations, etc.).

As mentioned, redundancy can exist in an ensemble. For example, where a parameter has a low level of sensitivity with respect to model-based simulation results, a value of the parameter of 1.0 and a value of the parameter of 1.5 may have little impact on the model-based simulation results. As such, by including both parameter values (1.0 and 1.5) as two separate realizations (e.g., two different models), the amount of information gained does not increase substantially. As such, resources may be considered to be wasted where an ensemble includes two different models, one for each of the two parameter values. In contrast, another parameter may have a high level of sensitivity with respect to model-based simulation results where, for example, the sensitivity may be constrained to a portion of a range of values of the parameter. For example, consider a parameter with a range of values from 1.0 to 5.0 where the parameter is particularly sensitive in a range from 3.25 to 3.75. In such an example, an additional number of realizations (e.g., models) in that more limited range (e.g., where data may be available therein) may provide for a substantial gain in information.

As an example, a method can include evaluating quality of one or more datasets with regards to the amount of information the one or more datasets provide about a subterranean environment (e.g., a reservoir, etc.). As an example, a dataset may include a distribution or distributions of parameter values, which may be amenable to sampling to form input sets. As explained, a method can include deciding whether a sufficient amount of data has been generated or more data must be produced (e.g., via number of models). Such a decision may be automatic, semi-automatic and/or interactive using one or more graphical user interfaces (GUIs). As an example, a method can involve screening, utilizing one or more approaches, which may function independently and can stop once a sufficient number of models (e.g., realizations or simulation cases) have been generated.

As mentioned, a method can include evaluating the amount of information each model/case includes about a specific asset (e.g., a reservoir, etc.). In various instances, as more cases are produced, incrementally there can be an increasingly smaller amount of information gain. However, different models can demand a substantially different number of cases for achieving a desired level of information coverage, which can depend on specifics of a model and its parametrization. As such, quality may be amenable to evaluation upon data production (e.g., simulation results, etc.) and not before production of the data.

Some workflows may aim at quantifying statistical distribution(s) of model outcomes (e.g., distribution of reserves, etc.). In such instances, statistical stability of selected reservoir characteristics may be evaluated to control a process, for example, to halt the process when a certain level of stability is achieved. As an example, where a certain level of stability is achieved, an ensemble may be deemed to be statistically representative of a physical environment.

Some workflows may deal with relatively complex scenarios involving assessment of relationships between model input parameters and their outcomes (e.g., optimization and history matching). In such examples of workflows, the ability of predictive models to capture one or more relationships can be evaluated (e.g., batch-by-batch, model-by-model, etc.) where a process may be terminated (e.g., as to one or more aspects of the process, etc.) once an acceptable level of accuracy has been achieved. Such an approach can help to assure that one or more subsequent processes based on approximation of parameters-outcomes relationship(s), such as sensitivity analysis, model selection, optimization, etc., can provide suitably high confidence results.

As mentioned, a method or methods may be executed in an automatic, semi-automatic and/or user interactive modes (e.g., user interactive, responsive to receipt of data interactive, etc.). As explained, a graphical user interface or interfaces may provide information for monitoring and/or decision making, optionally during performance of a method or methods.

As an example, consider a reservoir model scenario where reservoir model simulation outputs are denoted as $r_1 \ldots r_n$. In such an example, a reservoir model can produce a large number of outputs with some cross-correlations between at least some of the outputs. In such an example, a method can include selecting particular responses to be used in sampling quality control (QC) and/or can include selecting a level at which responses are to be evaluated (e.g., field level, well level, completion level, etc.). As an example, a level may be preselected so that a system can operate automatically.

For the foregoing reservoir model scenario, for each $r_i$, a method can include denoting a set of statistical characteristics such as $r_i^1 \ldots r_i^k$. These statistical characteristics can refer to certain statistical moments or a selected set of percentiles, the distribution thereof, being of interest for the scenario. For example, when obtaining reliable distribution of reserves is a purpose of a scenario (e.g., consider a reserves estimation workflow, etc.), a method can include selecting a set of percentiles, for example, P10, P50, and P90. When a scenario aims at evaluating more complex parameters (e.g., such as risk measures in a model ensemble), one or more higher statistical moments and/or one or more other functions of original reservoir outputs can be included in a selected set.

As mentioned with respect to a reserves estimate workflow, an estimate as to reserves in place (e.g., hydrocarbon gas in place at standard conditions, etc.), can depend on one or more parameters such as one or more of area, reservoir thickness, rock porosity, connate water saturation, gas formation volume factor, etc. In various examples, a simulation may output one or more of such parameters, one or more related parameters, etc. As mentioned with respect to a reservoir flow workflow, a reservoir flow simulator may output various types of parameters.

Figure 11:
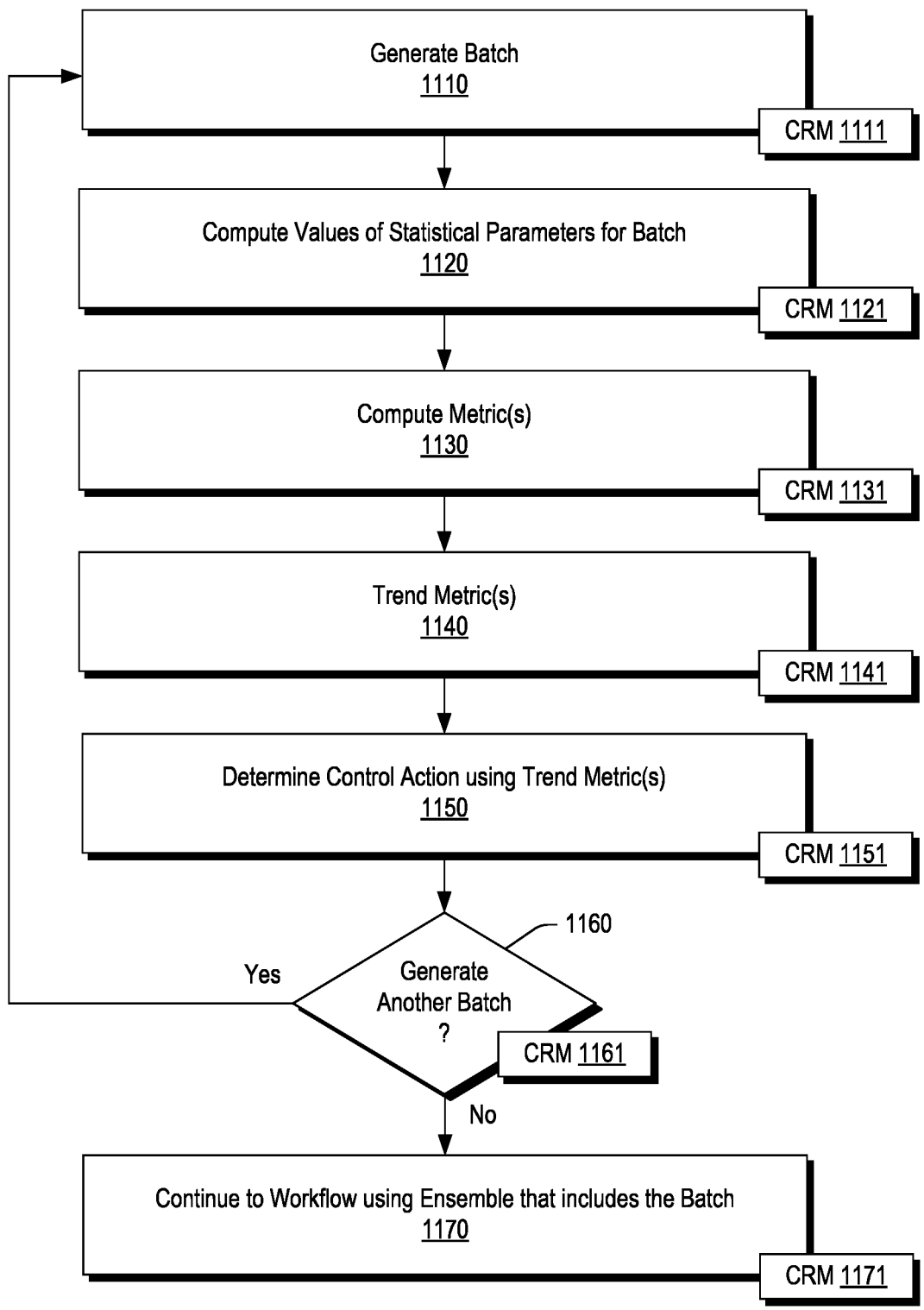
FIG. 11 illustrates an example of a method.

FIG. 11 shows an example of a method 1100 that includes a generation block 1110 for generating a batch of models, a computation block 1120 for computing values of statistical parameters for the batch, a computation block 1130 for computing one or more metrics that depend on at least a portion of the values, a trend block 1140 for assessing one or more trend metrics in at least one of the one or more metrics, a determination block 1150 for determining a control action using at least one of the one or more trend metrics, a decision block 1160 for deciding whether to generate another batch of models, and a continuation block 1170 for continuing to a workflow using the batch of models as part of an ensemble of models (see, e.g., the "No" branch of the decision block 1160). As shown, where the decision block 1160 decides to generate another batch of models (see, e.g., the "Yes" branch), the method 1100 can continue at the generation block 1110. The method 1100 may iteratively loop until the determined control action of the determination block 1150 provides an indication that generation of another batch of models may not meaningfully further the workflow that is to utilize the batch of models, which can include utilizing simulation results from simulations performed using at least some of the models of the ensemble.

The method 1100 is shown in FIG. 11 in association with various computer-readable media (CRM) blocks 1111, 1121, 1131, 1141, 1151, 1161 and 1171. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 1100. As an example, a computer-readable medium (CRM) may be a computer-readable storage medium that is non-transitory and that is not a carrier wave. As an example, one or more of the blocks 1111, 1121, 1131, 1141, 1151, 1161 and 1171 may be in the form of processor-executable instructions, for example, consider the one or more sets of instructions 270 of the system 250 of FIG. 2.

As explained, the method 1100 can be utilized for evaluating changes in statistical stability of one or more selected distribution parameters. Such a method can include evaluating the amount of information each subsequent model/case provides about one or more statistical distributions of reservoir model outputs. In such an approach, when changes in the one or more distributions, upon adding new cases, become negligible the process of producing cases can be stopped. For example, consider a reservoir model output that has a value for each case where a number of indexed cases can provide an indexed number of values where the values collectively can define a distribution (e.g., a distribution of values). Such a distribution may be characterized using one or more statistical techniques.

As an example, consider using a technique that can characterize a distribution using one or more parameters of a Gaussian distribution. In such an example, the one or more parameters may change as one or more additional cases are added. For example, a distribution may become more or less Gaussian, may become skewed, may become multi-modal, etc. As an example, a distribution may become stable in that it can be characterized statistically as being stable as one or more new cases are added. In such an example, the one or more new cases may provide little additional information as to the nature of the distribution.

As an example, a method can include generating reservoir models/simulation cases in batches, which may be of a constant size and/or of a variable size. For example, where information gain decreases, batch size may decrease (e.g., by one-half, by one-fourth, etc.), which may help to further optimize size of a batch with respect to at least information gain. As batches are generated, each individual case (e.g., model, realization, etc.) can be assigned an identifier (e.g., a case index, a case ID, etc.), which may be assigned consecutively. Once a batch is generated, its cases can be added to a pool of previously simulated cases, if such cases exist (e.g., as part of an ensemble).

As an example, once a new batch is generated, the following actions may be performed:

A. For each m=1, 2, ..., M, where M is number of cases already produced, compute values of the statistical parameters $r(m)_i^1 \ldots r(m)_i^k$ using cases with ID≤m.

B. For each m=τ+1 ... M, where τ is a predefined lag value, compute:

$$D(m) = \sum_{i=1}^{n} \sum_{p=1}^{k} \frac{|r(m)_i^p - r(m-\tau)_i^p|}{|r(m)_i^p| + |r(m-\tau)_i^p|}$$

$$T(m) = \sum_{i=1}^{n} \sum_{p=1}^{k} \frac{\sigma[r(m-\tau)_i^p \ldots r(m)_i^p]}{E[r(m-\tau)_i^p \ldots r(m)_i^p]}$$

where E is the mean and σ is the standard deviation.

C. Render one or more graphs of D(m) versus m and T(m) versus m to a display or displays for visualization and, for example, optionally, highlight one or more areas where values of D(m) and T(m) are higher than predefined threshold value.

D. Based on the information in the one or more graphs, decide whether to initiate another batch of models to be produced or to stop the batch generation.

As an example, an optional action can be utilized when a system operates in an automatic mode where case generation terminates when both D(m) and T(m) are lower than their respective predefined threshold values.

As an example, an optional action can be utilized according to user settings on a rendered graph or graphs of m with values for $r(m)_i^1 \ldots r(m)_i^k$ for m=1, 2, ... M, which may assist in a decision making process. Such an approach can provide for a relatively rapid identification of vectors and/or statistical parameters that may be causing high levels of deviations D and/or T.

Figure 12:
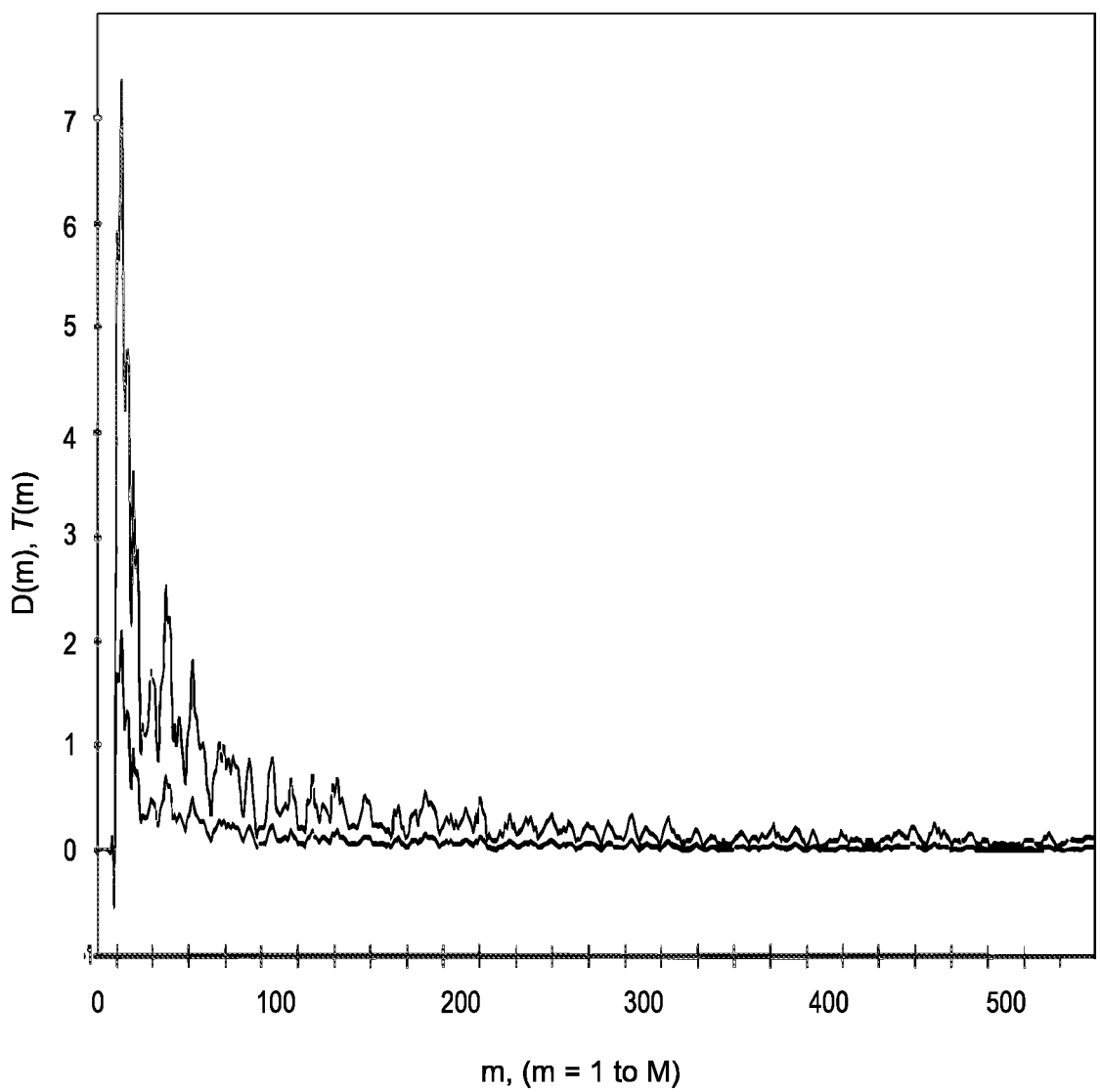
FIG. 12 illustrates an example of a plot.

FIG. 12 shows an example plot of D(m) and T(m) versus m where the values for D(m) and T(m) decrease generally (e.g., as a trend) with respect to increasing m (e.g., case index value). As shown, there can be some variation in values which may be addressed using one or more noise handling techniques. For example, a smoothing operation may be performed to average values over a number of cases (e.g., 10 cases, etc.) such that a visualization allows for trend identification more readily. As an example, a graphical user interface can include one or more tool menus that can include user selectable techniques for handling the values to more readily detect one or more trends, which can facilitate decision making (e.g., consider curve fitting, etc.). As an example, in an automated approach, one or more criteria may be based on use of one or more data handling techniques (e.g., to smooth, find a derivative, etc.).

In the plot 1200, an approach may consider "flattening" of one or more values with respect to increasing values of m. In such an example, when a curve trends toward a constant value (e.g., an asymptote, etc.), a model generation process can be stopped as the trend can indicate that there is little additional information entering the system.

Figure 13:
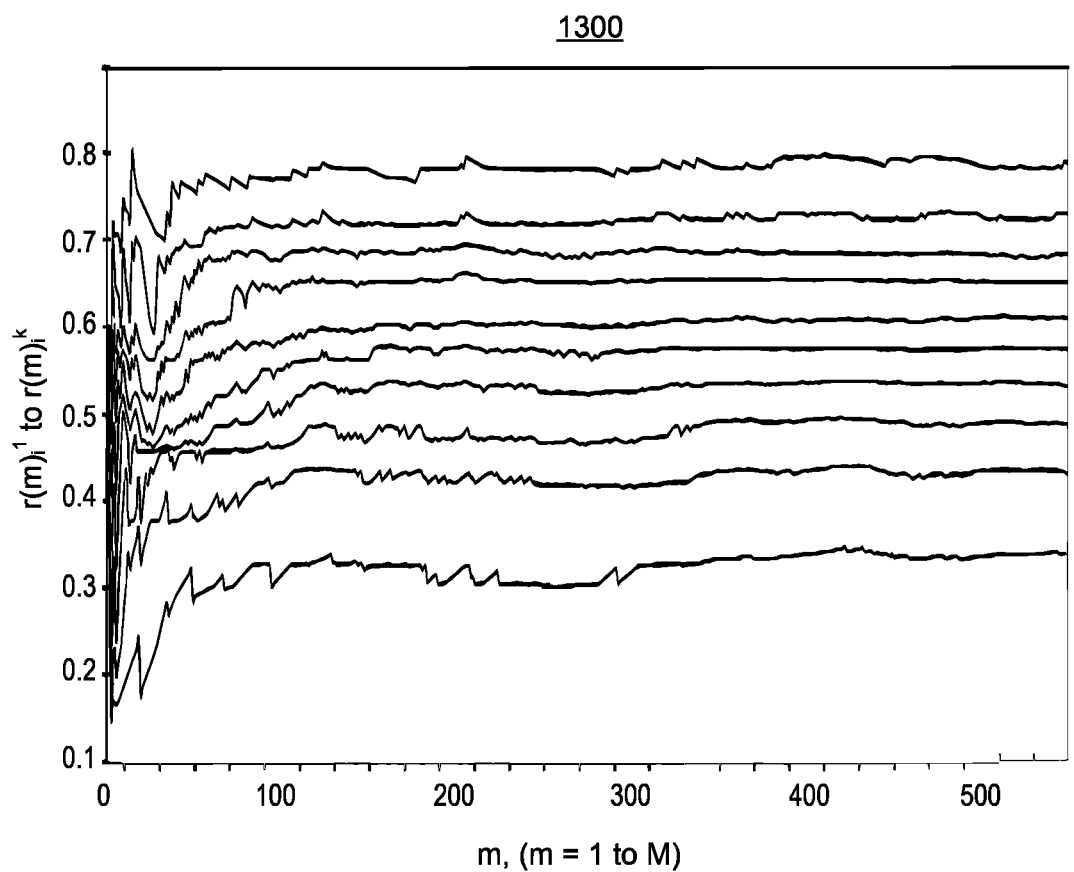
FIG. 13 illustrates an example of a plot.

FIG. 13 shows an example plot 1300 of various values with respect to m, which can be a case index, a model index, etc. In the example of FIG. 13, the values trend toward relatively constant values with relatively constant differences between the values. Specifically, the plot 1300 shows ten series of statistical values with respect to an index m. As shown, the statistical values tend to become more stable after approximately 100 cases (e.g., m=100) and become relatively stable for additional cases such that m is greater than approximately 350. In increasing m to 500, stability does not increase substantially, which may be discerned using one or more techniques (e.g., using one or more criteria, etc.).

Figure 14:
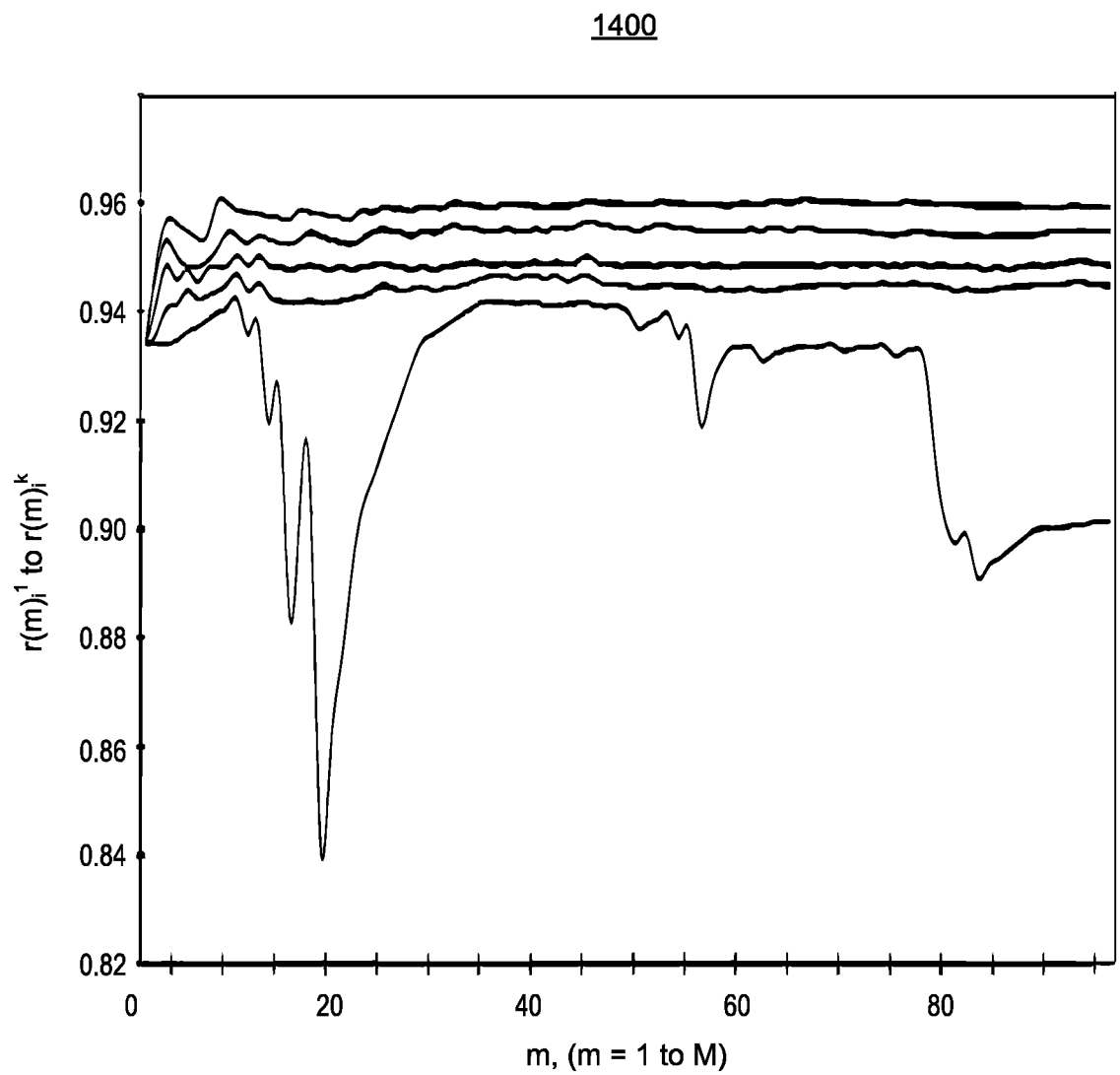
FIG. 14 illustrates an example of a plot.

FIG. 14 shows an example plot 1400 of various values with respect to m, which can be a case index, a model index, etc. In the examples of FIG. 14, one of the five series of statistics exhibits a relatively high level of deviations when compared to the others, which exhibit relative stability as m increases to and beyond approximately 15. In such an example, the statistic with the deviations indicative of instability can result in a determination that the underlying parameter or parameters demand additional data, which may be more data than others to achieve statistical stability. In such an example, a model generator may be instructed to generate additional models where the additional models may include cases with variations in values as to one or more parameters giving rise to the instability. For example, sampling of one or more input spaces may be performed as part of a model generation process.

FIG. 15 shows an example of a method 1500 that includes a generation block 1510 for generating a batch of models along with associated model data (e.g., consider the batch as being an initial batch or a later batch), a training block 1520 for training a suite of machine learning models using at least a portion of the model data (e.g., a training portion, a testing portion, etc.) to generate trained ML models (e.g., predictive ML models), a selection block 1530 for selecting one or more of the trained ML models (e.g., using one or more criteria, such as ability to train, test performance, etc.), a computation block 1540 for computing values of one or more defined accuracy metrics for the selected one or more of the trained ML models with respect to an index (e.g., to characterize the selected one or more models as to prediction accuracy, etc.), a determination block 1550 for determining one or more actions using at least a portion of the computed values of the one or more accuracy metrics, a decision block 1560 for making a decision as to whether or not to generate another batch of models, and a continuation block 1570 for continuing a workflow using at least a portion of the batch of models (e.g., as an ensemble). As shown, where the decision block 1560 decides that one or more additional models are appropriate for purposes of accuracy, the method 1500 can continue at the generation block 1510.

The method 1500 is shown in FIG. 15 in association with various computer-readable media (CRM) blocks 1511, 1521, 1531, 1541, 1551, 1561 and 1571. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 1500. As an example, a computer-readable medium (CRM) may be a computer-readable storage medium that is non-transitory and that is not a carrier wave. As an example, one or more of the blocks 1511, 1521, 1531, 1541, 1551, 1561 and 1571 may be in the form of processor-executable instructions, for example, consider the one or more sets of instructions 270 of the system 250 of FIG. 2.

As an example, in a method such as the method 1500, types of machine learning models may be the same from iteration to iteration as batches are analyzed or a dynamic approach may adjust types of machine learning models utilized. For example, where training and/or testing determine that one or more types of machine learning models are unlikely to provide acceptable prediction accuracy, such types may be dropped for a subsequent iteration. As an example, where particular complexity is observed in data, a type of machine learning model may be adjusted as to its complexity. For example, consider adding another hidden layer in a neural network, an additional number of nodes, an additional level of branching in a decision tree, etc. In such examples, a method may operate dynamically to help assure that an appropriate number and/or type of machine learning models are included, which may help to assure that prediction accuracy using the underlying batch models and associated data is adequately assessed.

As explained, the batch models can be simulation models that include digital representations of physical structures where a simulator can simulate physical phenomena; while, a machine learning model can be a mathematical model that may or may not include representations with physical meaning. As an example, a method such as the method 1500 of FIG. 15 can be a hybrid method that utilizes models that have physical meaning (e.g., reservoir models) and models that lack physical meaning (e.g., machine learning models). In such an example, a simulation model can be a physics-based model for generation of simulation results, which may be predictive, while a machine learning model may lack representations based on physics yet provide for predictive results (e.g., output) given appropriate input.

As explained, the method 1500 can include evaluating changes in accuracy of predictive models. For example, the method 1500 can include evaluating the ability of a plurality of predictive models to capture relationships between model input parameters and model outputs. Such a method can be particularly suited for a scenario that goes beyond obtaining a reliable distribution of model outcomes, for example, consider a scenario that can include one or more stages such as, for example, a sensitivity analysis stage, a re-parameterization stage, a problem decomposition stage, an optimization stage, etc. Thus, a method such as the method 1500 can be dynamic as to management of machine learning models (e.g., to help assure that the batch models, which may be cases, realizations, etc., are appropriately assessed).

As an example, a method can include utilizing a fixed batch size for model generation and/or a variable batch size, which, as mentioned, may be geometric or of a different character. In such a method, there can be a suite of predictive models from which it is possible to select one predictive model that produces the most accurate predictions for a particular dataset.

As to the training block 1520, as an example consider, for each case ID number $m > \tau$, where $\tau$ is a predefined threshold, and for each reservoir model output $r_i$ (e.g., in a scenario involving reservoir simulation), training ensembles of various types of predictive models $(P \to r_i)_m$, where P refers to model input parameters. In such an approach, the training, verification and testing dataset for these models includes cases with ID≤m.

As to the selection block 1530, consider, for each ID number m>τ and for each reservoir model output $r_i$, selecting the most accurate ensemble of predictive models from those trained in the previous step.

As explained with respect to the block 1540, a method can include defining an accuracy metric $\delta_i(m)$ for each ensemble selected and computing values for the accuracy metric. In such an example, a method can include rendering a graph to a display for visualization by a user where the graph can include $\delta_i(m)$ versus m for each reservoir output $r_i$. In a user interactive mode, a graphical user interface can include one or more graphical controls that can be utilized to receive input form a user, for example, to indicate that the user has decided that a desired level of accuracy (e.g., optionally a proxy for confidence, etc.) has been achieved such that the model generation process may be stopped. As an example, an autonomous mode may be utilized where a generation process can be stopped according to one or more criteria. For example, consider issuing a stop instruction to a generation process using a criterion of $$\min_i \delta_i(M) > \Delta,$$

where Δ is predefined minimum accuracy level. In various instances, a model generation process may operate at least in part as a background process, particularly where it is likely that additional models are to be included to achieve a suitable level of accuracy and/or confidence. In such an example, a generation process may be ready to provide one or more additional models as may be generated while actions such as the actions of one or more of the blocks 1520 to 1550 is or are occurring. As mentioned, where an assessment indicates that an acceptable number of models may be achieved within a few more iterations, a batch size may decrease and/or a batch size may be a controllable value, for example, via user input (e.g., where a user can interact with a slider or other type of graphical control of a GUI to select a batch size). Where a next batch size is lesser in size that a current batch size, the time to generate the next batch can be lesser and resources expended can be lesser (e.g., time and/or computational resources). Where time is less due to a smaller batch size, a method may accelerate and operate more quickly, which can be beneficial for a user interactive mode as the user may experience less delay between successive interactions. For example, consider initiating a method and then issuing a notification to a user when a trend or trends exist toward acceptable accuracy and/or confidence. In such an example, the user can respond by tending to a GUI where one or more types of interaction may be appropriate to drive the method to a conclusion, as an acceptable batch of models.

As an example, a method can include performing an ensemble confidence analysis. For example, consider one or more of the following actions:

A. For each case ID number m>τ, where τ is a predefined threshold, and for each reservoir output $r_i$, train ensembles of various types of machine learning models $(P \to r_i)_m$, where P refers to input parameters of the models. In such an example, each m training, validation and testing dataset for these models includes cases with ID≤m. Alternatively, a method may include performing hyper-parameter tuning for different classes of predictive models $(P \to r_i)_m$, to find those that exhibit high prediction accuracy (e.g., one or more predictive models that rank at or near the top of a list based on prediction accuracy), which can include computing prediction accuracy and its variation.

B. For each ID number m>τ and for each reservoir output select the most accurate ensemble of predictive models from those trained (e.g., trained as above).

C. Compute an accuracy metric $\delta_i(m)$ for each ensemble selected where, for example, for each ensemble, variation of accuracy may be computed. Such an approach can include computing aggregated accuracy for a number of individual accuracy metrics $\delta_i(m)$ and an associated aggregated variation.

D. Generate a data structure of one or more accuracy metrics, which can be or include one or more aggregated accuracy metrics where the data structure may be accessed, transmitted, received, etc., for rendering to a display (e.g., as a graph of aggregated accuracy versus m, etc.).

E. Render a graphical user interface to a display that can include one or more graphs and one or more graphical controls for user interaction, analysis, etc., which can be part of a decision making process that allows a user to decide if an acceptable level of confidence has been achieved and/or whether a data generation process can terminate. Alternatively, where a system can operate in an autonomous mode, one or more criteria such as, for example, $$\min_i \delta_i(M) > \Delta,$$

where Δ is predefined minimum accuracy level, may be utilized for autonomous decision making (e.g., as to additional action, termination, etc.). As an example, one or more predefined criteria based on aggregated accuracy and/or variation may be utilized.

As to computation of prediction accuracy, consider, as an example, one or more of the following actions:

A. For a given machine learning model type and hyper-parameters, split a dataset into a training portion and a testing portion.

B. Train a machine learning model using data from training portion.

C. Compute prediction for data values in the testing portion of the dataset and compute correlation coefficients between predicted and actual values.

D. Repeat steps A, B, and C, for example, a fixed number of times or a determined number of repetitions dynamically by analyzing convergence of average value of correlation coefficients between predicted and actual values.

E. Compute prediction accuracy as an average or minimum value of individual correlation coefficients as computed.

F. Compute one or more measures of variation across the correlation coefficients as obtained where a measure may be a statistical measure such as standard deviation, variance or one or more other statistical measures.

As explained, a workflow can include performing uncertainty and optimization processes (e.g., U&O) as part of reservoir modeling, which can help uncover and/or characterize one or more relationships between the space of model input parameters and the space of model outcomes. Optimization, for example, may be implemented using a search of a subspace of parameters space where a desired model's behavior is achieved. While a mapping of parameters space into outcomes space may be readily performed in various instances, the opposite "mapping" can be part of history matching, production optimization and/or one or more related tasks. Hence, determining the shape and properties of a multidimensional operator that can map a parameters space into an outcomes space is beneficial in reservoir characterization.

As an example, a method can commence with acquisition of exploratory data, which can include screening, where a multidimensional space of input parameters can be sampled and where, for each sample, responses are computed by execution of a simulator (e.g., a computation reservoir simulator, etc.). For example, a particular parameter may be associated with a distribution that may be, for example, Gaussian with associated characteristics. A Gaussian function may be utilized to represent a probability density function of a normally distributed random variable, for example, with an expected value $\mu$ and a variance $\sigma^2$:

$$g(x) = \frac{1}{\sigma\sqrt{2\pi}} \exp\left(-\frac{1}{2}\frac{(x-\mu)^2}{\sigma^2}\right)$$

In such an example, which is presented as being unidimensional (e.g., based on x), values may be randomly or otherwise sampled using the function where each sample may be a basis for a case (e.g., a realization). As explained, such a function (e.g., a Gaussian technique) may be utilized to characterize a distribution statistically, for example, to determine whether a desired level of statistical stability has been achieved or not. For example, changes in the expected value and the variance may be utilized as indicators of statistical stability. As an example, where a distribution is multidimensional, a multidimensional technique may be utilized.

Sampling method, reservoir modelling complexity and dimension of a U&O study can affect the amount of information retrieved about an environment during a screening phase. In various instances, stochastic sampling techniques like Latin hypercubes may be utilized due to prohibitively high costs associated with running fixed lattice schemes as in experimental design methods on high dimensional spaces. Latin hypercube sampling (LHS) is a statistical technique that can be implemented to generate a near-random sample of parameter values from a multidimensional distribution. Such a technique may be used to construct computerized experiments, for Monte Carlo integration, etc.

As to a multidimensional space, consider for sake of explanation, two dimensions where, in random sampling, new sample points are generated without taking into account the previously generated sample points; where, In Latin hypercube sampling (LHS), an input can be how many sample points to use and for each sample point remember in which row and column of the two-dimensional space the sample point was taken; and where, in orthogonal sampling, the sample space can be divided into equally probable subspaces where sample points are then chosen simultaneously making sure that the total set of sample points is a Latin hypercube sample and that each subspace is sampled with the same density.

Various field development projects may demand relatively rigorous uncertainty quantification workflows, for example, based on parameterized subsurface uncertainties. In various instances, model calibration workflows can be utilized for reservoir simulation models where such workflows can include historical production data as part of history matching. As explained, various workflows can include one or more data analysis techniques that can characterize the information content in a multiple-realization workflow (e.g., multiple case or multiple model workflow) where such characterizations can be utilized to reduce resource utilization, improve field design, improve field operations, etc. For example, an improved workflow may identify one or more potentially under-developed reservoir regions where equipment operations can be performed to increase overall reservoir production.

Referring again to sampling as part of a case or realization generation process, the amount of information retrieved by stochastic sampling about an environment may be expected to steadily decline as the more models (e.g., cases or realizations) are evaluated. For example, an increase in model number can result in more redundancy (e.g., lesser information gain per model). At some point models outcomes can be predicted with reasonable accuracy by appropriately constructed predictive models. At that point, a screening phase may be deemed to have exhausted its ability to gain meaningful information via stochastic sampling. However, that does not necessarily mean that an entirety of the information available has been retrieved and/or that the possible states of the environment (e.g., the asset or the system) are predictable via utilization of one or more machine learning models. Theoretically, stochastic sampling may be continued indefinitely to provide at least some meaningful information, though with ever increasing redundancy, such information is at the cost of increasing utilization of resources, which can be computational, time, etc.

As an example, a workflow can include a screening phase followed by a more computationally expensive optimization phase where predictive models trained on the screening datasets are intended to provide a relatively general search direction for one or more optimization techniques. Such a phase inherently assumes that an entirety of relevant information has not been captured during the screening phase. While capturing an entirety of information about a complex system (e.g., a complex subterranean environment) might exist solely in theory, a method can aim to maximize information gain during a screening phase where such maximization can improve performance of an optimization phase.

As explained with respect to the weather example, one reason as to a lack of sufficient information capture can be a lack of sufficient data. As explained, where data are acquired on an infrequent basis in time and/or space, information gained about a system via screening may be unacceptable. In various instances, lack of data may not necessarily be a prime or sole issue. For example, uniformly sampled datasets can and do provide information about low-frequency components of model responses and may be sufficient for smooth functions without substantial high-frequency variation(s) and/or one or more other types of non-linear effects, or in case of low dimensional problems. In various instances, however, high frequency components and/or highly non-linear effects can be valuable as they may be determinative of one or more locations of an optimization problem solution (e.g., identification of locations that may be rich in hydrocarbon fluid and accessible for production, etc.). With a growing understanding of the reality of reservoir complexity and a desire for exploration and development in such complex reservoir environments, the demands placed on U&O types of workflows increases.

As an example, a method can be implemented to improve information gain during a screening phase of a workflow, which, in turn, can reduce demands in an optimization phase. For example, consider a method that can be executed during a time where unguided sampling has exhausted its ability to add meaningful information to the system (e.g., or even earlier) such that sampling becomes driven, partially or in full, by an approach that optimizes information provided by newly sampled models (e.g., cases or realizations). In such an example, the method can aim to maximize information extraction about a multidimensional system.

As an example, a method can uncover information "value" of existing samples that have been evaluated and, based thereon, find new samples to be submitted for evaluation. Such a method can be implemented in a manner that can overcome one or more limitations of stochastic sampling, which, as explained, can become inefficient in various multidimensional scenarios.

As an example, a method can be implemented for additional sampling of a parameters space at one or more given moments. As an example, a method can be implemented to blend guided and unguided sampling together in a system that can continually (e.g., or periodically) learn about quality of samples to adjust new samples in order to maximize information extraction. Such methods may be executable in an automated mode, a semi-automated mode, and/or user assisted mode (e.g., user interactive mode).

Figure 16:
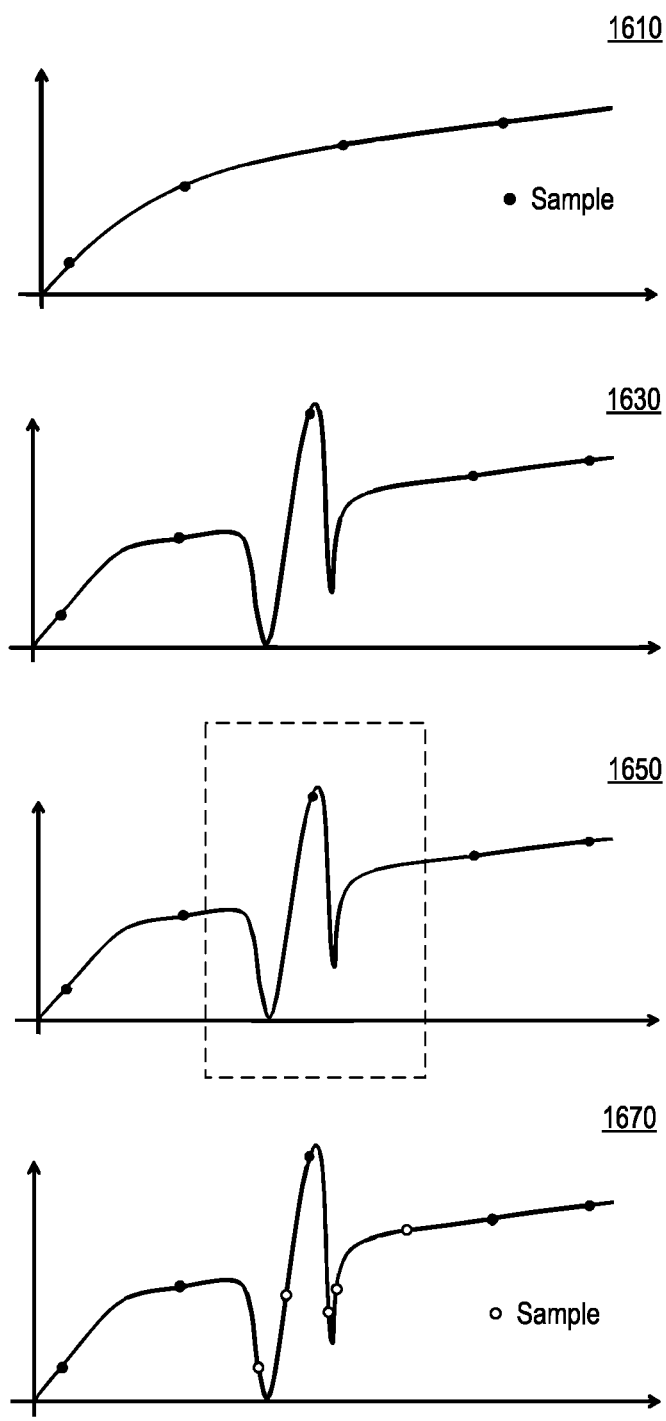
FIG. 16 illustrates example plots.

FIG. 16 shows a series of plots 1610, 1630, 1650 and 1670 where circles represent samples. In the plot 1610, a one-dimensional example of a function with enough samples for a polynomial predictive model to capture relevant information is illustrated. For example, a least-squares fitting approach may be utilized for a third order polynomial to determine values of constants of the third order polynomial. With the third order polynomial and its constants, a method can determine values between the sample points. In other words, the third order polynomial can be a predictive model that can be utilized to predict an output (e.g., a y-coordinate value) given an input (e.g., an x-coordinate value). While some additional samples can slightly increase the accuracy of the predictive model, the resulting change may be relatively minor as the first three to four samples appear to allow for an adequate fitting (e.g., training) of the third order polynomial model.

The plot 1630 shows a one-dimensional example where the actual underlying system is in actuality more complex. As such, the five samples shown in the plot 1630 do not provide for a reasonable fit (e.g., training) of a predictive model. In such an example, additional samples may assist with fitting such that a fit predictive model can adequately represent the underlying system.

The plot 1650 shows the plot 1630 with an identified region represented as a dashed box. For example, the region may be identified over a range of x-coordinate values with a corresponding range in the y-coordinate values. For example, consider identifying what may appear to be an outlier with an x-coordinate value and then defining a window about that x-coordinate value. In such an approach, the window may be a region that can be additionally sampled (e.g., more densely sampled). As explained, such additional samples can add information when they are as close as possible to an identified local area of high complexity, otherwise their contribution to the increase in accuracy may be minimal.

The plot 1670 shows the plot 1630 with additional samples (open circles) where at least some of the additional samples are within the window as identified and shown in the plot 1650. Given the additional samples, a predictive model (solid line) can now be fit to adequately represent the underlying system.

The foregoing example plots 1610, 1630, 1650 and 1670 of FIG. 16 provide a basis for a method that can include identifying one or more local under sampled areas of a parameters space and generating one or more sets of samples to be evaluated, for example, via reservoir modeling and/or simulation framework.

In various instances, given specifics of a high dimensional space, the local under sampling problem becomes more severe, particularly when space dimension increases. While under sampling in the one-dimensional example of FIG. 16 may appear relatively benign and solvable via continued random sampling for some time, such an approach in a multidimensional case can rapidly become extremely insufficient due to the low probability of hitting specific "pockets" of the space with purely random techniques. Another level of complexity involved in environment modeling pertains to the fact that information is to be obtained about different model outcomes, which have different behavior where their local under sampled area would, in general, differ.

As an example, consider a method that denotes the space of input parameters as $P=\{p_1 \ldots p_n\}$, each $p_{i=1 \ldots n} \in \mathbb{R}$ and that denotes the space of models' outcomes as $R=\{r_1 \ldots r_l\}$, each $r_{i=1 \ldots l} \in \mathbb{R}$. In such an example, depending on the type of the study R can include both original and processed model outcomes (e.g., match qualities to a specific data, data process through economic evaluation, etc.).

Such a method can also denote as $\Theta$ a multidimensional function $$\mathbb{R}_n \xrightarrow{\Theta} \mathbb{R}_l$$

which maps space P into R. In such an example, for each set of parameters values p vector $\Theta(p) \in R$ can be explicitly computed by running a computationally expensive process of reservoir modelling and simulation.

In the foregoing terminology, various U&O projects (e.g., workflows) can be characterized as studies of structure and properties $\{\Theta, P, R\}$. When a certain problem is not readily amenable to resolution to a particular set of P, R then properties of function $\Theta$ can be assessed in order to modify the definition of P and/or R.

As an example, consider an approach that assumes that modeling has been performed for a set of samples from P and denote this set of samples/models as $M=\{m_1 \ldots m_k\}$, corresponding sets of parameters as $\{p_1 \ldots P_k\}$ and sets of results $\{r_1 \ldots r_k\}$ such that $\Theta(p_i)=r_i$ for all $i=1 \ldots k$.

In such an approach, "smart" sampling can include identifying the information value of each specific sample m from the existing set M and build its approximation over whole space P. In such an example, defining such a value can assist in evaluating how appropriately the data from a particular sample can be restored using data from the other samples.

Where a specific sample follows interpolation and extrapolation trends defined by other samples and those trends are adequately captured by a predictive model, then the information value provided by the evaluated sample can be deemed to be low and its redundancy can be deemed to be high. Such classifications as to low information and high redundancy can be relative to, for example, if a particular sample does not follow inter- and extrapolation trends captured by predictive models then its information value is high and it is somewhat unique to the existing dataset and hence of a low redundancy. Such an approach can indicate an area around the particular sample to be probed for more data in order to increase overall information. For example, a method can include reducing relatively high values of an information value function such that the number of relatively high values diminishes (e.g., optionally become non-existent, etc.).

Note that the "area" in this case does not simply refer to a neighborhood of a particular point in $\mathbb{R}_n$. Sampling subspaces that do not include substantial variation of information value do not tend to bring more information into the system even if such subspace is a neighborhood of high samples with information value. Hence, an information value function can be mapped to a (low dimensional) transformation of the original space, which do not include areas of low variation of information value.

Figure 17:
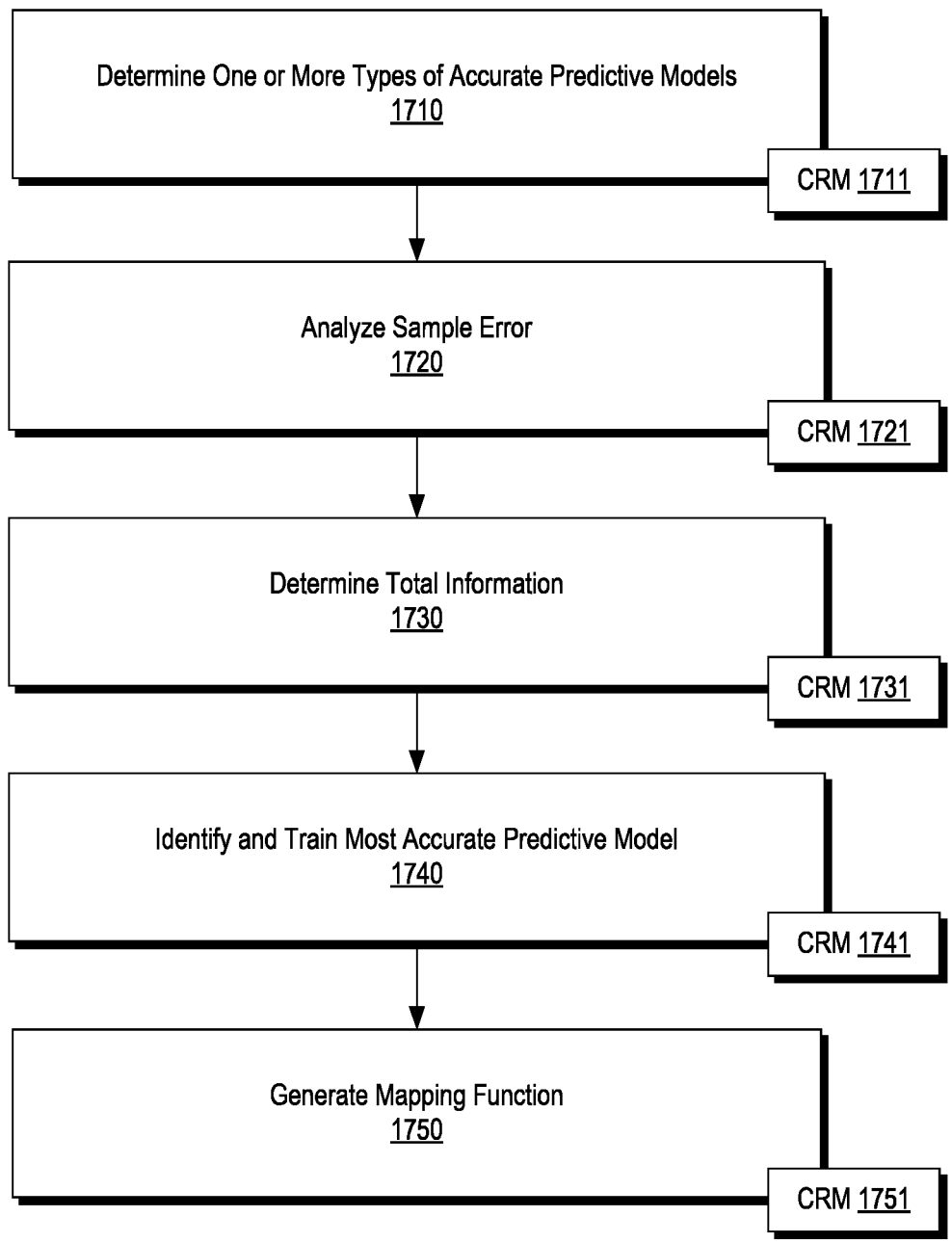
FIG. 17 illustrates an example of a method.

FIG. 17 shows an example method 1700 that includes a determination block 1710 for determining one or more types of accurate predictive model, a sample analysis block 1720 for analyzing error associated with presence and/or absence of a sample, a determination block 1730 for determining a total information value, an identification and training block 1740 for identifying and training a most accurate predictive model, and a generation block 1750 for generating a mapping function via reducing dimension.

The method 1700 is shown in FIG. 17 in association with various computer-readable media (CRM) blocks 1711, 1721, 1731, 1741 and 1751. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 1700. As an example, a computer-readable medium (CRM) may be a computer-readable storage medium that is non-transitory and that is not a carrier wave. As an example, one or more of the blocks 1711, 1721, 1731, 1741 and 1751 may be in the form of processor-executable instructions, for example, consider the one or more sets of instructions 270 of the system 250 of FIG. 2.

As an example, the determination block 1710 can include finding the most accurate type(s) of predictive models that approximate $\Theta_t$: $P \rightarrow r_t$, $t=1 \ldots l$. Type, settings and learning method of the specific methodology used to approximate $e_t$ may be selected automatically via either appropriate search or direct evaluation of the applicable methods. In such an example, models with the highest prediction accuracy can be selected.

As an example, as to the analysis block 1720, it can include analyzing error by, for each $i=1 \ldots k$, defining $\xi_i^t$, $t=1 \ldots l$ and removing sample $m_i$ from the training dataset and training the predictive model of the selected type to approximate $\Theta_t$ and finding the approximation error of $\xi_i^t$ at the specific sample $m_i$.

As an example, as to the determination block 1730, it can include, for each $i=1 \ldots k$, finding the total information value across results using an equation such as:

$$\xi_i = \Sigma_{t=1}^l \omega_t \xi_i^t,$$

where $\omega_t$ is a set of weights associated with specific results.

In such an example, the weights can be assigned by the user and/or can be defined automatically based on the values and distribution of $r_t$ (e.g., proportional to variance, mean or any other function of statistical moments and other descriptive statistics).

As an example, the identification and training block 1740 can include identifying and training the most accurate predictive model $\mu$ which approximates the total information value function $\xi$:

$$P \xrightarrow{\xi} \mathbb{R}$$

defined according to its values: $\xi(p_i) = \xi_i$, $i=1 \ldots k$. As an example, the method 1700 can include, where prediction accuracy of $\mu$ is below a predefined threshold, issuing a notification that more data are desired to initiate smart sampling.

As an example, the generation block 1750 can include using an appropriate dimension reduction technique for determining a function x, which maps P into a low dimensional space (e.g., or, alternatively, explicitly finding a low dimensional manifold in P) that explains most of $\xi$ variance (e.g., a percentage of the variance as may be determined according to a predefined value, etc.). Dimension of the subspace/manifold may be set to a minimum value that can provide an explanation of a predefined fraction of $\xi$ variance (e.g., 95 percent or another suitable percentage).

As to the generation block 1750, a goal may not necessarily be to reduce space dimension as much as possible; rather, to obtain a meaningful distance function, which may take into account variation of $\xi$ between points in P. Such a function may be utilized in various actions of a sampling process. In the instance that manifold learning is used, it can be possible to define a relatively light-weight computational distance function on the surface of the manifold. If such a function is not readily definable, or is resource intensive to compute, one or more other dimension reduction/space transformation techniques may be utilized.

As an example, a method can provide for smart sampling of models set of a fixed size. For example, once an information value function has been defined and its accurate approximation has been found, they can be used as guidance in finding areas for which additional data is likely to improve a workflow (e.g., a U&O workflow, etc.). As an example, such an approach can be used to produce a set of samples of a fixed size that aim to maximize expected information gain which, in turn, may provide a substantial reduction in the information value function (e.g., where the information value function is defined where higher values indicate more information value). As explained, a reduction in higher values for a number of models can mean that more information value has been captured by an existing number of models.

Figure 18:
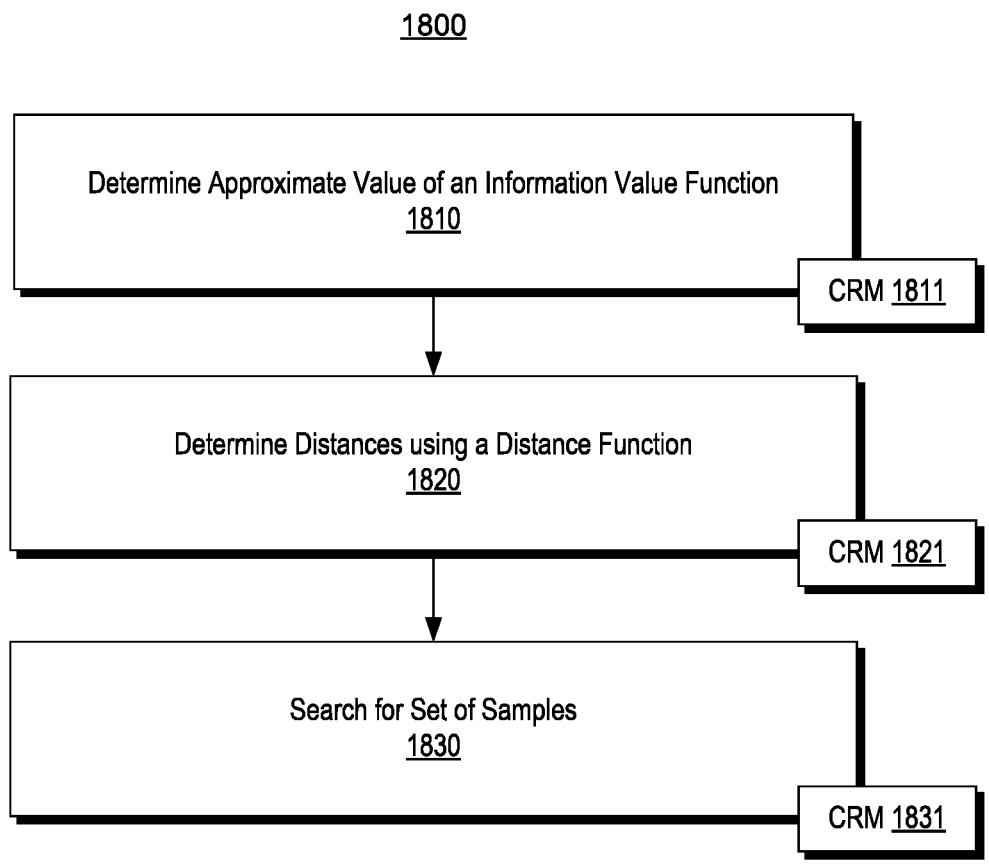
FIG. 18 illustrates an example of a method.

FIG. 18 shows an example method 1800 that includes a determination block 1810 for determining an approximate value of an information value function, a determination block 1820 for determining distances using a defined distance function, and a search block 1830 for searching for a set of samples (e.g., via an index search, etc.).

The method 1800 is shown in FIG. 18 in association with various computer-readable media (CRM) blocks 1811, 1821 and 1831. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 1800.

As an example, the method 1800 may be implemented using an assumption such that a number of new samples are to be found for evaluation via use of a numeric simulation/modelling framework. For example, the determination block 1810 can include defining a large set of samples, S, in P, either stochastically or based on a fixed lattice where, for each point $s_{i=1 \ldots q} \in S$, the block 1810 can include determining an approximate value of information value function $\xi_i^* = \mu(s_i)$.

As an example, the determination block 1820 can include defining a distance function $d(p_i, p_j)$ between points in P, as the Euclidian distance between their projections $\chi(p_i), \chi(p_j)$; noting that one or more non-Euclidian metrics in $\chi(P)$ may be used for defining a distance function. In such an example, the block 1820 can include using the defined distance function to determine distances between the existing samples and to determine its minimum value, $d_{min}$. In such an example, the block 1820 can include defining a distance function $d(s, S)$ between a sample (s) and a set of samples (S) as a distance from the sample to the nearest element of the set.

As an example, the search block 1830 can include searching for a set of indexes $j_1 \ldots j_z$, (e.g., where z is a size of a new samples set) that maximizes $\Sigma_{i=1}^{z} \xi_i^*$ under the condition that $$\min_i (\min(d(s_{j_i}, S), d(s_{j_i}, M)), < d_{min},$$

where $\alpha$ is a predefined scaling factor. In such an example, the method 1800 can search for a set of new samples that are expected to have a relatively high information value individually and in total.

As an example, a method can include placing one or more restrictions on minimum distance between new samples and distance to the previously simulated samples to minimize the redundancy in the new samples set. As an example, a method can achieve minimal redundancy by redefining an objective function to $\Sigma_{i=1}^{z} f_1(\xi_i^*) f_2(d(s_{j_i}, S) + d(s_{j_i}, M))$ where $d_i^{total}$ is a sum of distances from sample $j_i$ to other samples from the set and previously evaluated samples. In such an example, $f_1$ and $f_2$ can be transformation functions that penalize low values of information value and distance. One or more other optimization approaches, for example, with conditioning to specified distance conditions may be used.

In the example of FIG. 18, the method 1800 may continue to one or more workflow actions. For example, once an optimal set of samples has been found via the search block 1830, a workflow can include initiating appropriate numerical simulation, recalculating an information value function and repeating until a manual or automatic stop occurs (e.g., a user stops the process or total information value reaches predefined minimum values, etc.). As an example, a method can include adjusting the scaling factor $\alpha$ and repeating the process, as appropriate, until a stop instruction occurs which may be responsive to one or more conditions, such as, for example, a maximum number of samples has been reached, a maximum running time has been reached or until total information value functions has reached a predefined maximum value threshold.

Figure 19:
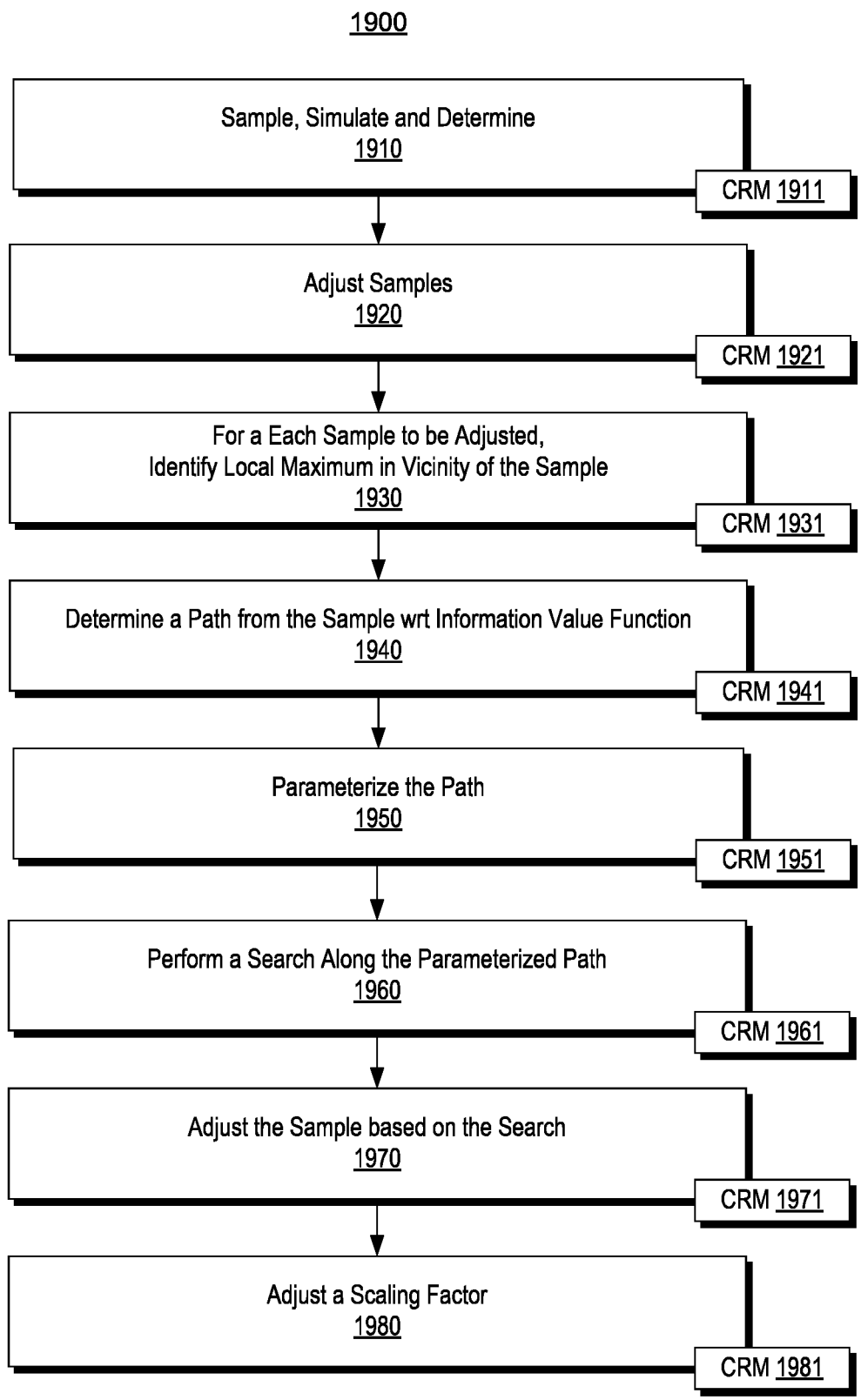
FIG. 19 illustrates an example of a method.

FIG. 19 shows an example of a method 1900 that includes a sampling, simulation and determination block 1910 for sampling samples, simulating using the samples and determining value(s) of an information value, an adjustment block 1920 for adjusting samples before evaluation of the samples where, for each of the samples to be adjusted, the method 1900 can include an identification block 1930 for identifying a local maximum in a vicinity of the sample to be adjusted, a determination block 1940 for determining a path from the sample to be adjusted where the information value function increases along the path (e.g., monotonously, etc.), a parameterization block 1950 for parameterizing the path, a search block 1960 for performing a search along the parameterized path (e.g., a line search, etc.), an adjustment block 1970 for adjusting the sample that is to be adjusted based at least in part on the search, and an adjustment block 1980 for adjusting a scaling factor (e.g., a, as explained above as to multiply with a minimum value $d_{min}$ as a condition).

The method 1900 is shown in FIG. 19 in association with various computer-readable media (CRM) blocks 1911, 1921, 1931, 1941, 1951, 1961, 1971 and 1981. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 1900.

As an example, the method 1900 can be part of a blended sampling workflow. For example, consider smart sampling combined with stochastic sampling where such an approach changes the relative contribution of techniques with respect to time (e.g., dynamic hybrid sampling, etc.).

As an example, the block 1910 can be part of a base sampling technique (e.g., Monte-Carlo, LHS, OA, etc.) that includes recalculating an information value function and its approximation after new samples have been simulated (e.g., new realizations, as samples, simulating using a simulator).

As an example, the block 1920 can include, when prediction accuracy of the information value function reaches a predefined minimum threshold, commencing an adjustment process for one or more of the samples before subjecting them to evaluation. In such an example, consider $s \in P$ to denote a sample that is to be adjusted.

As an example, the block 1930 can include using an appropriate optimization technique, identifying a local maximum of $\xi$ in the vicinity of s.

As an example, the block 1940 can include finding the path from s to a local maximum such that $\xi$ monotonously increases along that path.

As an example, the block 1950 can include parametrizing the path found $op(\alpha)$, where $\alpha=0$ corresponds to the point s and $\alpha=1$ to the local $\xi$ maximum.

As an example, the block 1960 can include performing a line search along the path $op(\alpha)$ to find $\alpha^*$ where $\xi$ penalised by the total distance to existing samples reaches maximum (see, e.g., above as to a distance definition).

As an example, the block 1970 can include adjusting the sample to be adjusted as follows: $s = s + op(\alpha^*)$.

As an example, the block 1980 can include adjusting a based on selected self-adaptation strategy such as annealing schedule, etc., where, for example, a can in general increase with the number of sampling iterations and increased information value approximation accuracy. As such, the value of $\alpha$ can include information that may be utilized to control a workflow (e.g., a model generation process, etc.).

As an example, a method can address various types of issues associated with generating a representative ensemble of models. For example, consider an issue pertaining to different combinations of input parameter values that generally provide variable amount of information where some areas of input parameters may demand more dense sampling than others. Such an approach can be referred to as a local adjustment approach such that, as appropriate, rather than a whole parameter space being sampled without local adjustment, local adjustment region (e.g., areas, etc.) can be identified for adjustment(s), which can provide for more efficient information gathering and conservation of simulation resources.

Figure 20:
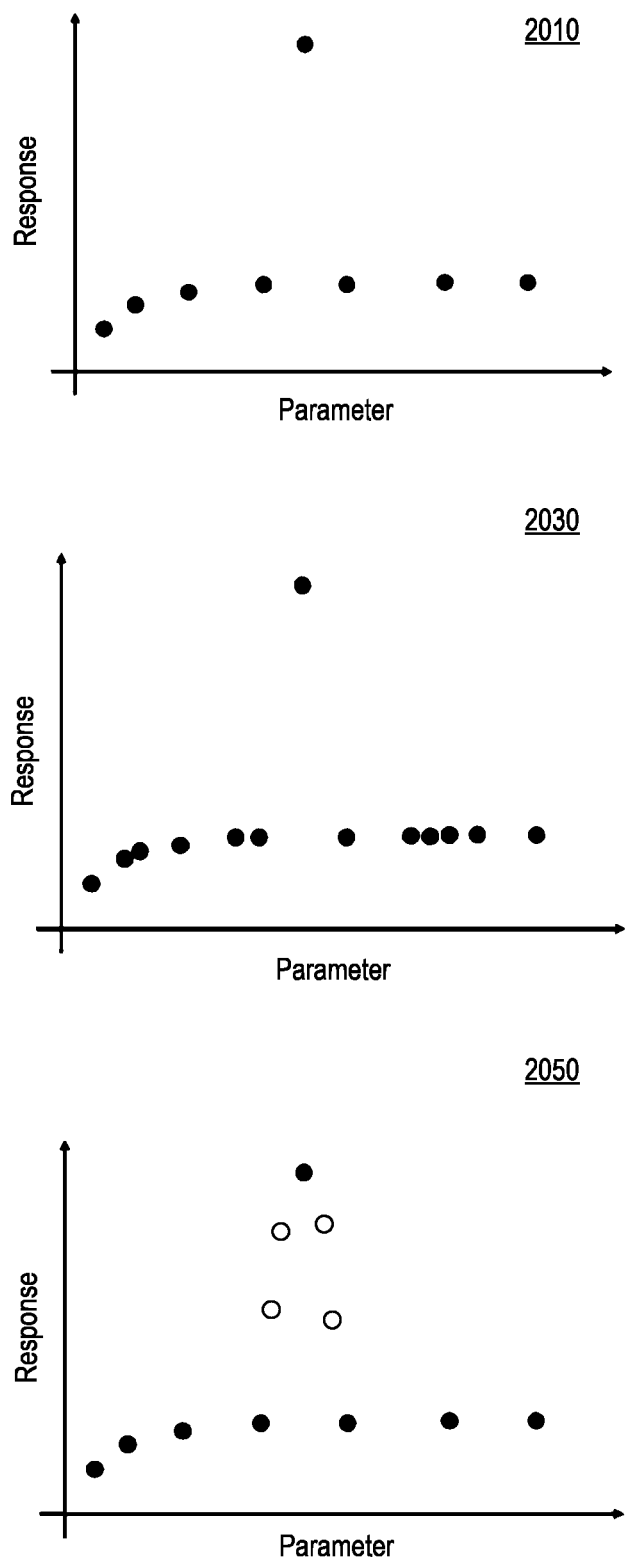
FIG. 20 illustrates example plots.

FIG. 20 shows example plots 2010, 2030 and 2050 as illustrative of an example of a method in a one-dimensional scenario where various aspects may be extended to two or more dimensions.

In the plot 2010, one parameter (x-coordinate axis) and one response (y-coordinate axis) are shown for eight different reservoir models (e.g., samples) where each of the different reservoir models has a different value of the parameter and generates a different, corresponding response.

As shown in the plot 2010, one of the reservoir models has a response that is substantially different than the other reservoir models where the particular reservoir model is, according to its associated parameter value, couched between the other parameter values, with some being less than and some being greater than while the responses are less than (y-coordinate axis). In such an example, the points, except for one, can define a smooth relationship between parameter and response. The exceptional point, which is an intermediate point (not an end point), does not objectively or subjectively fit that relationship.

As an example, a sampling process can be continued without change such that more models are generated. For example, the plot 2030 shows an approach to increased sampling that is without a locality condition. In the plot 2030, the increased sampling may provide one or more samples in the aforementioned local region however it will also provide samples in other regions, which can increase computational demands without substantial gains in information. Thus, despite creating more models, with different values of the input parameter, situations can arise where there is little improvement and where a local anomaly remains unexplained.

In the plot 2050, an approach such as that of the method 1900 may be implemented. As an example, a method can include already simulated models that are ranked according to their information value. In the one-dimensional example of the plot 2050, the anomalous point can have much higher information value than the other points. Further, once the information value has been calculated for the models, it can be used to sample one or more areas (e.g., regions in one or more dimensions) that can provide a maximum expected information gain. In the example plots 2010, 2030 and 2050, the maximum expected information gain can be in a window or windows proximate to and/or including the particular point (e.g., high response value point). In such an example, sampling can help to maximize information gain from a model generation process and help to optimize usage of resources involved in producing models (e.g., reservoir models, etc.).

As explained with respect to the method 900 of FIG. 9, a method can include model generation and sampling, which can be smart or intelligent sampling (e.g., by a sampler) where one or more regions in a model space can be identified for purposes of additional model generation (e.g., by a model generator). As explained, a model generator and a sampler may operate in a coordinated manner that aims to gain information in a manner that can account for demands on computational and/or other resources.

As an example, a workflow can include implementing a model generator that can, on-demand, generate models such that when new models are ready, the workflow can update a confidence analysis, which can be initiated as appropriate (see, e.g., FIGS. 11 and 15). In such an example, a user may be presented with the results of a confidence analysis and/or such a result may be evaluated against predefined criteria (e.g., automatically, semi-automatically, manually, etc.). Where a desired level of confidence has not been reached, the workflow may continue in an iterative manner through use of additional models; whereas, if a desired level of confidence has been reached, an information gain analysis may be initiated (see, e.g., FIGS. 17, 18 and 19). In such an example, one or more regions with high expected information gain can be identified and sampled where the samples can be utilized to generate corresponding realizations (e.g., cases or models) by a model generator. As an example, a workflow can include adding models to an ensemble that meet an acceptable level of confidence and that have a desired amount of local sampling (e.g., to help maximize information gain).

As an example, a system can be a living asset model system (LAM system) that can include features that operatively couple to a framework such as the AVOCET framework. The AVOCET framework can collect, store, and display various types of production operations information—surface, wellbore, wellhead, and facilities data—with measurements—well test data, fluid analyses, transfer tickets, and tank inventories—to enable users to view and track forecasts, production targets, budgets, and other performance indexes, for example, at one or more of a corporate, business unit, or geographical level. With cross-domain workflows and integration, users can visualize and interact with assets using a system such as a LAM system.

As an example, a LAM system may provide various graphics associated with a hydrocarbon pathway, which can include exploration, development, and production phases. As an example, a GUI may be utilized with respect to short term operations (e.g., surveillance, equipment health monitoring, visualization, allocation); flow assurance (e.g., debottleneck pipeline network field processing facilities, understanding effects of transient well and reservoir behavior on production efficiency via use of "what if" scenarios, understanding transient behavior of complex networks by combining a steady state to a transient flow simulator); and long term planning (e.g., achieve more accurate forecasts by accounting for the interactions of subsurface deliverability with surface backpressure constraints, model compositional blending, mixing, injection of multiple producing zones and reservoirs to meet product specifications, automatically optimize artificial lift, EOR and IOR injection utilization with live asset model updated on real-time or on-demand, etc.). As an example, for each workflow, an IAM system can generate an associated dashboard.

As to a data access layer (DAL) of a LAM system, it can include instructions to handle various aspects of acquired data. As an example, a web portal may allow for access to a data access layer, for example, to select data sources, data types, data frequency, data processing, etc. As an example, a web portal may allow for visualization of various parameters of a data access layer.

As an example, a front-end of a LAM system can utilize an API that operates with an IAM framework. Such an API may be a REST API. Web services that conform to the REST architectural style, termed RESTful web services, can provide interoperability between various computing systems. RESTful web services can allow one or more requesting systems to access and manipulate textual representations of web resources by using a uniform and predefined set of stateless operations. Other kinds of web services may be utilized (e.g., such as SOAP web services) that may expose their own arbitrary sets of operations.

As an example, a front-end can include a web portal app that allows for control of one or more operations (e.g., control operations) using one or more techniques (e.g., SCADA, TCP/IP, etc.). In such an example, operational decision making may be performed using a web portal app such that various individuals can access a LAM system to monitor and/or control one or more field operations. As an example, where called for control action results in physical phenomena that may be different than expected, the architecture may reflect that result via receipt of data (e.g., field measurements), which can update one or more models of an IAM to assure that the IAM can be utilized to accurately assess the situation and, for example, determine a different course of action.

As an example, a reservoir model can model wells in fluid communication with a reservoir and a production network model can model surface conduits in fluid communication with the wells.

As an example, a back-end framework can validate a processing model using field data and generate a validated integrated model using the validated processing model, where the processing model models processing equipment in fluid communication with at least a portion of the surface conduits (e.g., as modeled by the production network model).

Figure 21:
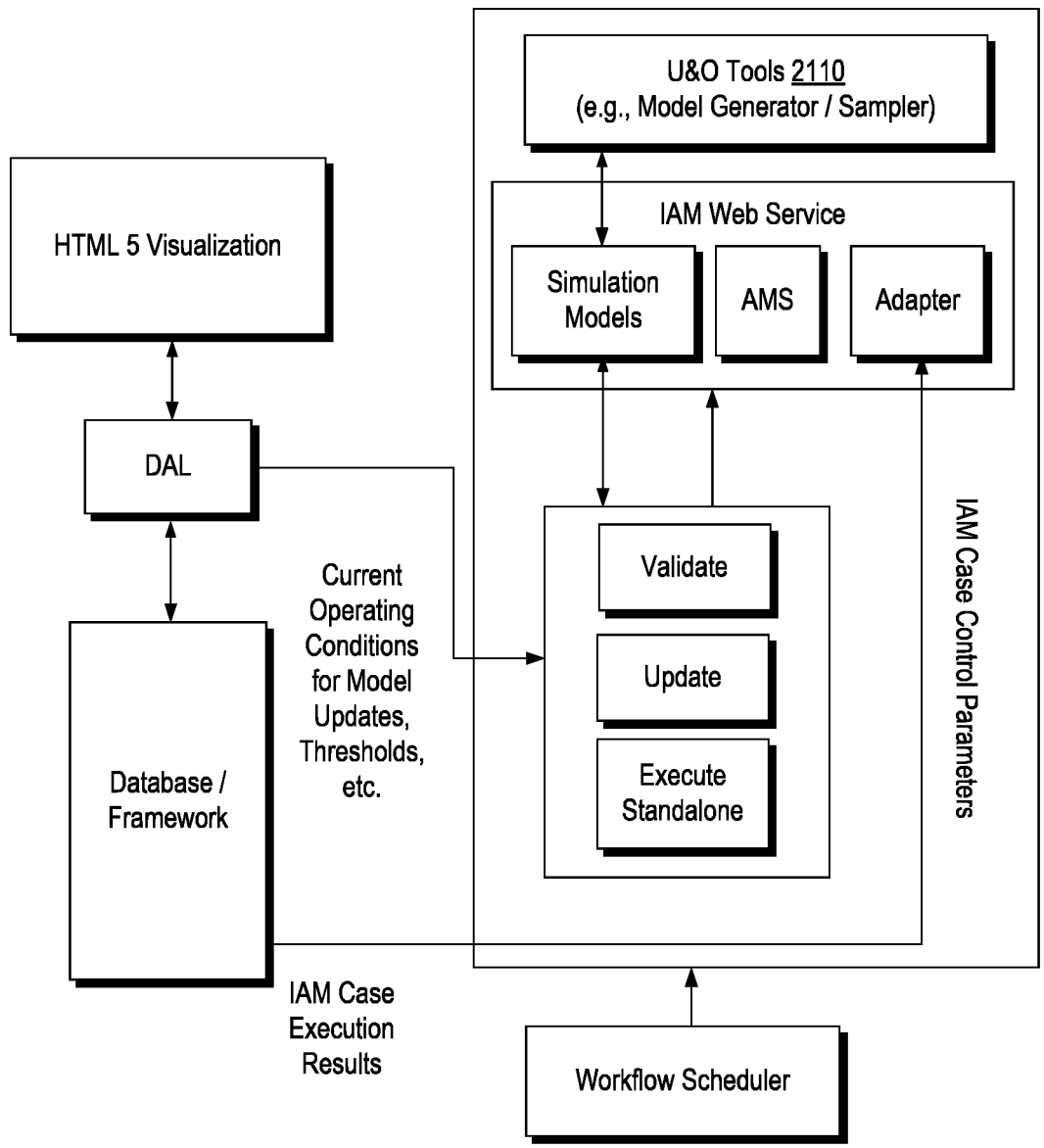
FIG. 21 illustrates an example of a system.

FIG. 21 shows an example of a system 2100 that can be an IAM system where the system 2100 includes U&O tools 2110 operatively coupled to an IAM web service. In such an example, one or more of the U&O tools 2110 (e.g., a model generator as a model generation tools, a sampler as a sampling tools, etc.) may be implemented with respect to one or more of the simulation models. As shown, the U&O tools 2110 may be directly and/or indirectly operatively coupled to one or more blocks for validation, update and/or standalone execution as may be responsive to information provided via a data access layer (DAL). As shown, visualization may be implemented using one or more technologies such as, for example, HTML 5 visualization, etc. The system 2100 can include local and remote components where, for example, remote components may utilize one or more cloud-based resources and where local components may utilize one or more browser applications.

Figure 22:
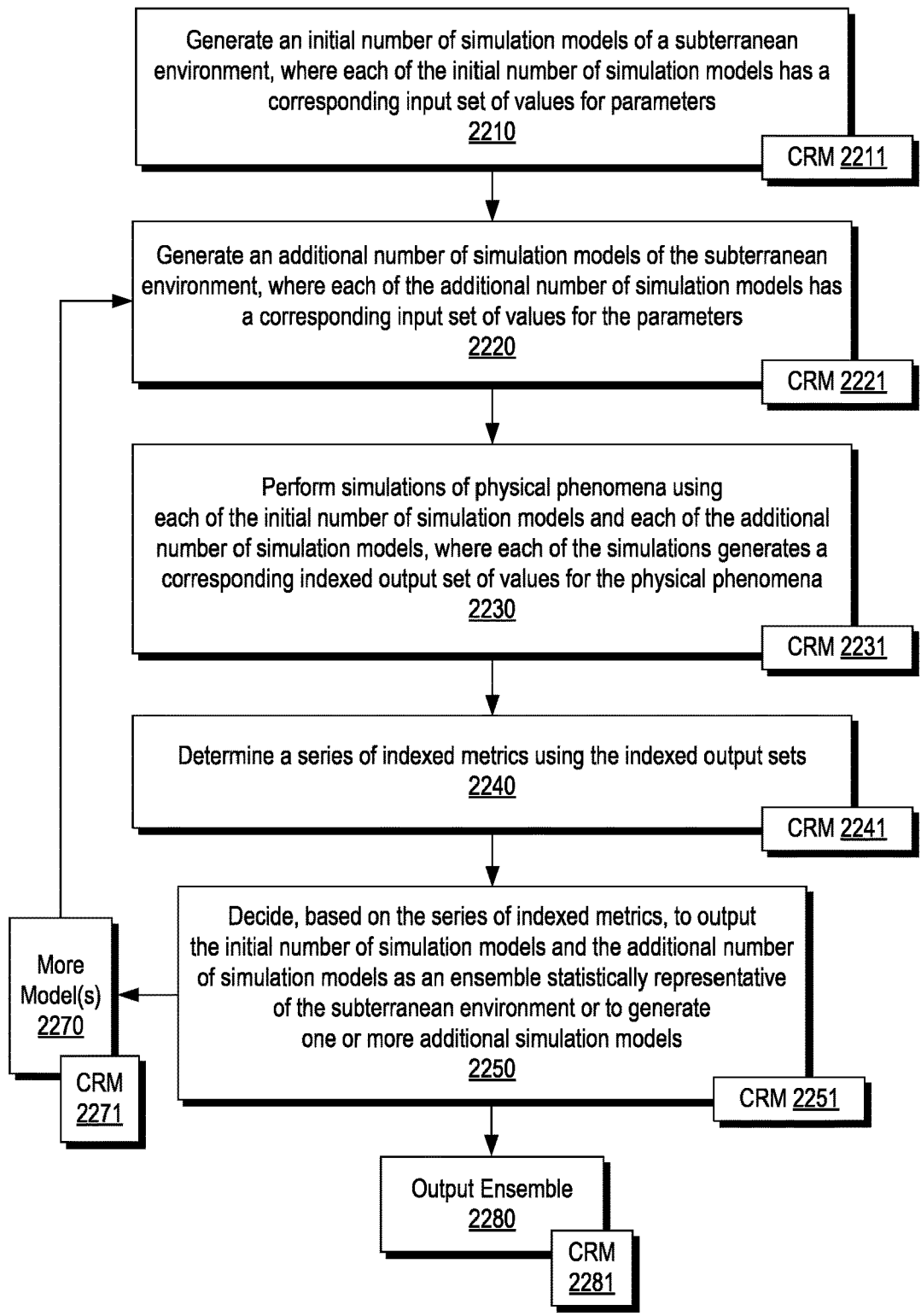
FIG. 22 illustrates an example of a method.

FIG. 22 shows an example of a method 2200 that includes: a generation block 2210 for generating an initial number of simulation models of a subterranean environment, where each of the initial number of simulation models has a corresponding input set of values for parameters; a generation block 2220 for generating an additional number of simulation models of the subterranean environment, where each of the additional number of simulation models has a corresponding input set of values for the parameters; a performance block 2230 for performing simulations of physical phenomena using each of the initial number of simulation models and each of the additional number of simulation models, where each of the simulations generates a corresponding indexed output set of values for the physical phenomena; a determination block 2240 for determining a series of indexed metrics using the indexed output sets; and a decision block 2250 for, based on the series of indexed metrics, deciding to output the initial number of simulation models and the additional number of simulation models as an ensemble statistically representative of the subterranean environment or to generate one or more additional simulation models. As shown, the method 2200 can include a more models block 2270 for calling for one or more additional simulation models and an output block 2280 for outputting the ensemble (e.g., optionally with outputs, etc.).

The method 2200 is shown in FIG. 22 in association with various computer-readable media (CRM) blocks 2211, 2221, 2231, 2241, 2251, 2271 and 2281. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 2200. As an example, one or more of the blocks 2211 to 2281 may be in the form of processor-executable instructions, for example, consider the one or more sets of instructions 270 of the system 250 of FIG. 2 (see also, e.g., the system 2100 of FIG. 21).

As an example, the method 2200 may be part of a method such as the method 900 of FIG. 9. For example, the method 2200 may be part of a method that can include sampling using a sampler that can implement a smart sampling technique as appropriate (e.g., to improve an ensemble, etc.).

As an example, a workflow may be a reserves estimation workflow using an ensemble. As an example, a workflow may include deciding where to drill one or more wells using an ensemble. As an example, a workflow may include further optimization of an ensemble, for example, using various types of learning applied to an output ensemble. For example, a workflow can include determining whether or not a particular problem may be solved utilizing a particular modeling approach where such a determination is based on an output ensemble that is deemed to be statistically representative of an environment. For example, where a modeling approach is selected that does not allow for generation of a suitably acceptable ensemble, the modeling approach may be revised, another modeling approach selected, etc.

As an example, a workflow can include history matching, for example, using real field data and an output ensemble that is statistically representative of an environment. Where history matching can be acceptably achieved, another workflow may be performed, which can include modeling a prospective field operation in the environment. For example, consider an EOR operation, a drilling operation, etc.

As an example, a method can include: generating an initial number of simulation models of a subterranean environment, where each of the initial number of simulation models includes a corresponding input set of values for parameters; generating an additional number of simulation models of the subterranean environment, where each of the additional number of simulation models includes a corresponding input set of values for the parameters; performing simulations of physical phenomena using each of the initial number of simulation models and each of the additional number of simulation models, where each of the simulations generates a corresponding indexed output set of values for the physical phenomena; determining a series of indexed metrics using the indexed output sets; and, based on the series of indexed metrics, deciding to output the initial number of simulation models and the additional number of simulation models as an ensemble statistically representative of the subterranean environment or to generate one or more additional simulation models. In such an example, the indexed metrics can include confidence metrics.

As an example, an indexed metric can represent collective informational value of an initial number of simulation models and an additional number of simulation models.

As an example, a method can include deciding whether to output an ensemble or to generate one or more additional simulation models by determining a rate of change in a series of indexed metrics. For example, if a rate of change is less than a predetermined rate of change value, such decision making can decide to output the ensemble; otherwise, it may decide to generate one or more simulation models. For example, if the rate of change is greater than a predetermined rate of change value, such decision making can decide to generate one or more additional simulation models.

As an example, a method can include determining a series of indexed metrics at least in part via training machine learning models using at least a portion of a number of input sets and at least a portion of a corresponding number of output sets to generate trained machine learning models and computing at least a portion of the series of index metrics using predictions generated by the trained machine learning models. In such an example, the series of indexed metrics can include predictive accuracy metrics of the trained machine learning models.

As an example, a method can include generating an additional number of simulation models by sampling an input space for the parameters to generate each of a corresponding additional number of input sets. In such an example, the sampling can include stochastic sampling and/or may include sampling that includes utilizing an information value function that characterizes informational value of a sampled input set. As an example, a method can include adjusting one or more samples of at least one input set utilizing an information value function. In such an example, adjusting can include identifying a local region of the information value function for adjusting one of the one or more samples. For example, consider performing a search within the local region to generate a search result and adjusting the one of the one or more samples using the search result.

As an example, a method can include generating an additional number of simulation models of a subterranean environment in a manner that occurs responsive to receipt of data. For example, consider data that include field data acquired during a field operation for the subterranean environment.

As an example, a method can include, based at least in part on an output ensemble that is statistically representative of a subterranean environment, performing one or more operations in the subterranean environment.

As an example, simulation models can be or include reservoir models. As mentioned, an ensemble may be a living asset ensemble that can include one or more types of models and may be an ensemble of ensembles. In such an example, the living asset ensemble may be updated responsive to receipt of one or more types of data that may be field data as acquired during one or more field operations associated with the asset, which may be a subterranean environment (e.g., optionally include various types of equipment, which may include surface equipment and subsurface equipment). As an example, an asset may be an onshore asset, an offshore asset or an asset that is in part onshore and in part offshore.

As an example, a system can include a processor; memory accessible to the processor; processor-executable instructions stored in the memory executable to instruct the system to: generate an initial number of simulation models of a subterranean environment, where each of the initial number of simulation models includes a corresponding input set of values for parameters; generate an additional number of simulation models of the subterranean environment, where each of the additional number of simulation models includes a corresponding input set of values for the parameters; perform simulations of physical phenomena using each of the initial number of simulation models and each of the additional number of simulation models, where each of the simulations generates a corresponding indexed output set of values for the physical phenomena; determine a series of indexed metrics using the indexed output sets; and, based on the series of indexed metrics, decide to output the initial number of simulation models and the additional number of simulation models as an ensemble statistically representative of the subterranean environment or to generate one or more additional simulation models.

As an example, one or more computer-readable storage media can include processor-executable instructions to instruct a computing system to: generate an initial number of simulation models of a subterranean environment, where each of the initial number of simulation models includes a corresponding input set of values for parameters; generate an additional number of simulation models of the subterranean environment, where each of the additional number of simulation models includes a corresponding input set of values for the parameters; perform simulations of physical phenomena using each of the initial number of simulation models and each of the additional number of simulation models, where each of the simulations generates a corresponding indexed output set of values for the physical phenomena; determine a series of indexed metrics using the indexed output sets; and, based on the series of indexed metrics, decide to output the initial number of simulation models and the additional number of simulation models as an ensemble statistically representative of the subterranean environment or to generate one or more additional simulation models.

As an example, a computer-program product can include one or more computer-readable storage media that can include processor-executable instructions to instruct a computing system to perform one or more methods and/or one or more portions of a method.

Figure 23:
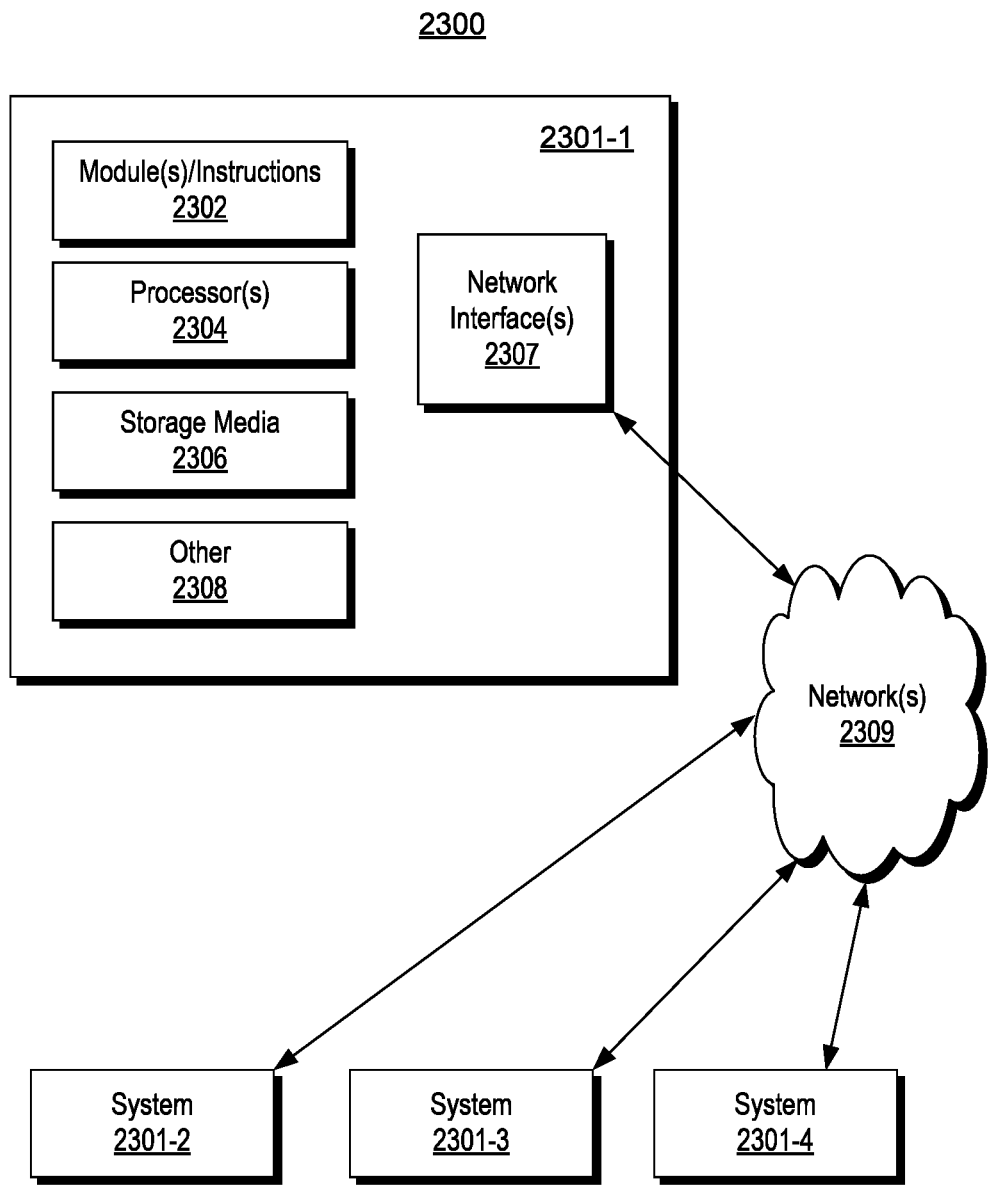
FIG. 23 illustrates examples of computer and network equipment.

In some embodiments, a method or methods may be executed by a computing system. FIG. 23 shows an example of a system 2300 that can include one or more computing systems 2301-1, 2301-2, 2301-3 and 2301-4, which may be operatively coupled via one or more networks 2309, which may include wired and/or wireless networks.

As an example, a system can include an individual computer system or an arrangement of distributed computer systems. In the example of FIG. 23, the computer system 2301-1 can include one or more modules 2302, which may be or include processor-executable instructions, for example, executable to perform various tasks (e.g., receiving information, requesting information, processing information, simulation, outputting information, etc.).

As an example, a module may be executed independently, or in coordination with, one or more processors 2304, which is (or are) operatively coupled to one or more storage media 2306 (e.g., via wire, wirelessly, etc.). As an example, one or more of the one or more processors 2304 can be operatively coupled to at least one of one or more network interface 2307. In such an example, the computer system 2301-1 can transmit and/or receive information, for example, via the one or more networks 2309 (e.g., consider one or more of the Internet, a private network, a cellular network, a satellite network, etc.).

As an example, the computer system 2301-1 may receive from and/or transmit information to one or more other devices, which may be or include, for example, one or more of the computer systems 2301-2, etc. A device may be located in a physical location that differs from that of the computer system 2301-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 2306 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY disks, or other types of optical storage, or other types of storage devices.

As an example, a storage medium or media may be located in a machine running machine-readable instructions or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general-purpose processors or application specific chips (e.g., or chipsets), such as ASICs, FPGAs, PLDs, or other appropriate devices.

Figure 24:
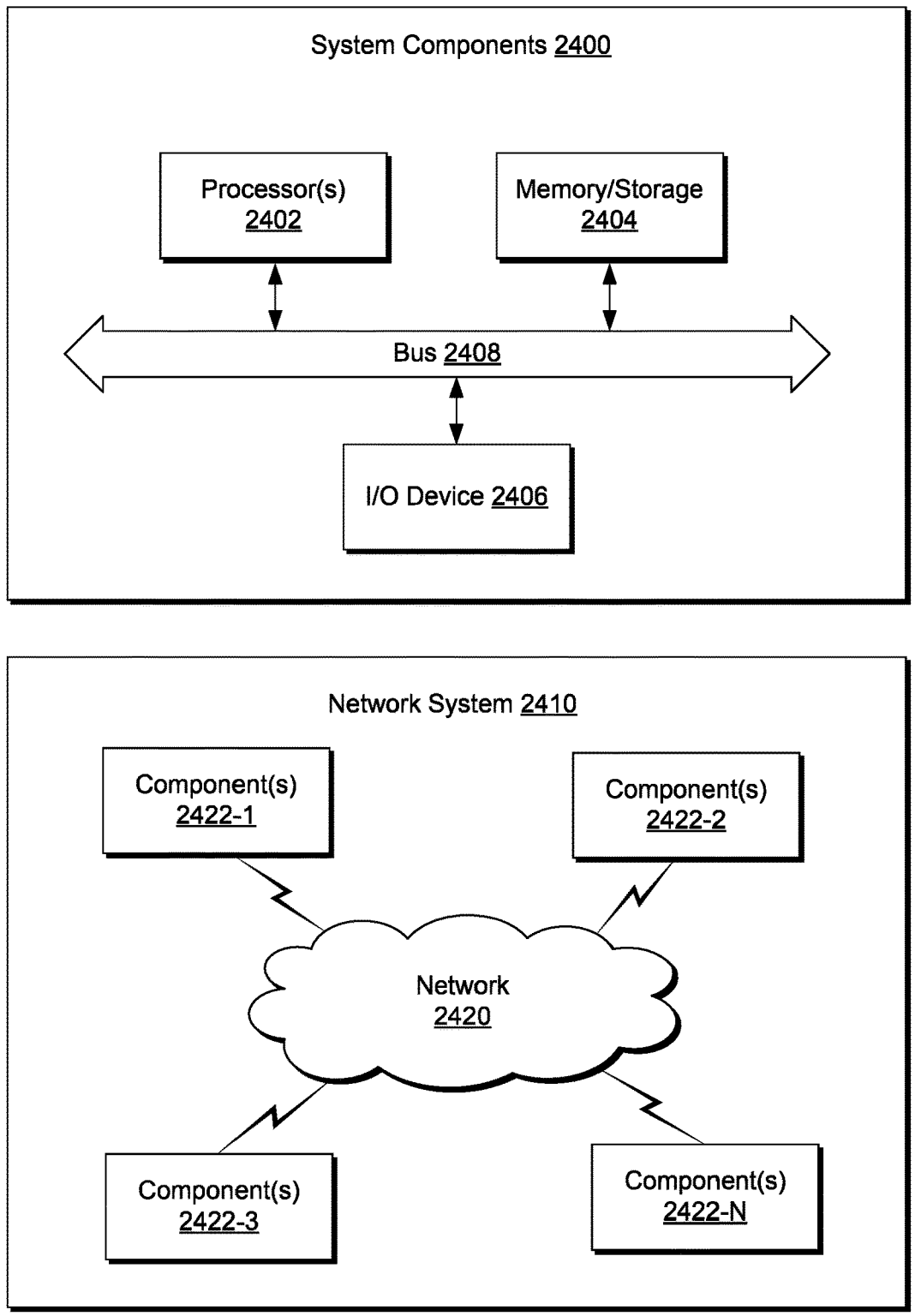
FIG. 24 illustrates example components of a system and a networked system.

FIG. 24 shows components of an example of a computing system 2400 and an example of a networked system 2410. The system 2400 includes one or more processors 2402, memory and/or storage components 2404, one or more input and/or output devices 2406 and a bus 2408. In an example embodiment, instructions may be stored in one or more computer-readable media (e.g., memory/storage components 2404). Such instructions may be read by one or more processors (e.g., the processor(s) 2402) via a communication bus (e.g., the bus 2408), which may be wired or wireless. The one or more processors may execute such instructions to implement (wholly or in part) one or more attributes (e.g., as part of a method). A user may view output from and interact with a process via an I/O device (e.g., the device 2406). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 2410. The network system 2410 includes components 2422-1, 2422-2, 2422-3, . . . 2422-N. For example, the components 2422-1 may include the processor(s) 2402 while the component(s) 2422-3 may include memory accessible by the processor(s) 2402. Further, the component(s) 2422-2 may include an I/O device for display and optionally interaction with a method. A network 2420 may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method comprising:
generating an initial number of simulation models of a subterranean environment, wherein each of the initial number of simulation models comprises a corresponding input set of values for parameters;
generating an additional number of simulation models of the subterranean environment, wherein each of the additional number of simulation models comprises a corresponding additional number of input set of values for the parameters;

performing simulations of physical phenomena using each of the initial number of simulation models and each of the additional number of simulation models, wherein each of the simulations generates a corresponding indexed output set of values for the physical phenomena;

determining a series of indexed metrics using the indexed output sets; and based on the series of indexed metrics, deciding to output the initial number of simulation models and the additional number of simulation models as an ensemble statistically representative of the subterranean environment or to generate one or more additional simulation models, wherein the deciding comprises determining a rate of change in the series of indexed metrics, and if the rate of change is less than a predetermined rate of change value, the deciding outputs the ensemble, or if the rate of change is greater than a predetermined rate of change value, the deciding generates one or more additional simulation models.

2. The method of claim 1, wherein the indexed metrics comprise confidence metrics.

3. The method of claim 1, wherein the indexed metrics represent collective informational value of the initial number of simulation models and the additional number of simulation models.

4. The method of claim 1, wherein the determining the series of indexed metrics comprises training machine learning models using at least a portion of input sets and at least a portion of the output sets to generate trained machine learning models and computing at least a portion of the series of index metrics using predictions generated by the trained machine learning models.

5. The method of claim 4, wherein the series of indexed metrics comprises predictive accuracy metrics of the trained machine learning models.

6. The method of claim 1, wherein the generating the additional number of simulation models comprises sampling an input space for the parameters to generate each of the input sets.

7. The method of claim 6, wherein the sampling comprises stochastic sampling.

8. The method of claim 6, wherein the sampling comprises utilizing an information value function that characterizes informational value of a sampled input set.

9. The method of claim 6, comprising adjusting one or more samples of one of the input sets utilizing an information value function.

10. The method of claim 9, wherein the adjusting comprises identifying a local region of the information value function for adjusting one of the one or more samples.

11. The method of claim 10, comprising performing a search within the local region to generate a search result and adjusting the one of the one or more samples using the search result.

12. The method of claim 1, wherein the generating the additional number of simulation models of the subterranean environment occurs responsive to receipt of data.

13. The method of claim 12, wherein the data comprise field data acquired during a field operation for the subterranean environment.

14. The method of claim 1, comprising, based at least in part on the ensemble, performing one or more operations in the subterranean environment.

15. The method of claim 1, wherein the simulation models comprise reservoir models.

16. A system comprising:
a processor;
memory accessible to the processor;
processor-executable instructions stored in the memory executable to instruct the system to:
generate an initial number of simulation models of a subterranean environment, wherein each of the initial number of simulation models comprises a corresponding input set of values for parameters;
generate an additional number of simulation models of the subterranean environment, wherein each of the additional number of simulation models comprises a corresponding additional number of input set of values for the parameters;
perform simulations of physical phenomena using each of the initial number of simulation models and each of the additional number of simulation models, wherein each of the simulations generates a corresponding indexed output set of values for the physical phenomena;
determine a series of indexed metrics using the indexed output sets; and
based on the series of indexed metrics, decide to output the initial number of simulation models and the additional number of simulation models as an ensemble statistically representative of the subterranean environment or to generate one or more additional simulation models,
wherein the deciding comprises determining a rate of change in the series of indexed metrics, and
if the rate of change is less than a predetermined rate of change value, the deciding outputs the ensemble, or
if the rate of change is greater than a predetermined rate of change value, the deciding generates one or more additional simulation models.

17. One or more non-transitory computer-readable storage media comprising processor-executable instructions to instruct a computing system to:
generate an initial number of simulation models of a subterranean environment, wherein each of the initial number of simulation models comprises a corresponding input set of values for parameters;
generate an additional number of simulation models of the subterranean environment, wherein each of the additional number of simulation models comprises a corresponding additional number of input set of values for the parameters;
perform simulations of physical phenomena using each of the initial number of simulation models and each of the additional number of simulation models, wherein each of the simulations generates a corresponding indexed output set of values for the physical phenomena;
determine a series of indexed metrics using the indexed output sets; and
based on the series of indexed metrics, decide to output the initial number of simulation models and the additional number of simulation models as an ensemble statistically representative of the subterranean environment or to generate one or more additional simulation models, wherein the deciding comprises determining a rate of change in the series of indexed metrics, and
if the rate of change is less than a predetermined rate of change value, the deciding outputs the ensemble, or
if the rate of change is greater than a predetermined rate of change value, the deciding generates one or more additional simulation models.

\* \* \* \* \*